(12) United States Patent
Hasegawa et al.

(10) Patent No.: US 8,916,331 B2
(45) Date of Patent: Dec. 23, 2014

(54) RESIST COMPOSITION AND PATTERNING PROCESS

(75) Inventors: Koji Hasegawa, Joetsu (JP); Takeshi Sasami, Joetsu (JP); Yuji Harada, Joetsu (JP); Taku Morisawa, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 65 days.

(21) Appl. No.: 13/324,123

(22) Filed: Dec. 13, 2011

(65) Prior Publication Data

US 2012/0148945 A1 Jun. 14, 2012

(30) Foreign Application Priority Data

Dec. 14, 2010 (JP) .................................. 2010-277875

(51) Int. Cl.
| | | |
|---|---|---|
| *G03F 7/004* | (2006.01) | |
| *G03F 7/039* | (2006.01) | |
| *G03F 7/20* | (2006.01) | |
| *G03F 7/11* | (2006.01) | |

(52) U.S. Cl.
CPC ............ *G03F 7/0392* (2013.01); *G03F 7/0045* (2013.01); *G03F 7/0046* (2013.01); *G03F 7/0395* (2013.01); *G03F 7/0397* (2013.01); *G03F 7/2041* (2013.01); *G03F 7/11* (2013.01)
USPC ........................................ 430/270.1; 430/325

(58) Field of Classification Search
None
See application file for complete search history.

(56) References Cited

U.S. PATENT DOCUMENTS

| | | | |
|---|---|---|---|
| 6,312,867 B1 | 11/2001 | Kinsho et al. | |
| 7,244,545 B2 | 7/2007 | Takebe et al. | |
| 7,531,287 B2 | 5/2009 | Kanda et al. | |
| 7,537,880 B2 | 5/2009 | Harada et al. | |
| 7,771,914 B2 | 8/2010 | Hatakeyama et al. | |
| 7,968,268 B2 | 6/2011 | Wang | |
| 2004/0005512 A1* | 1/2004 | Mizutani et al. | 430/270.1 |
| 2005/0123863 A1* | 6/2005 | Chang et al. | 430/322 |
| 2007/0122736 A1 | 5/2007 | Hatakeyama et al. | |
| 2007/0178407 A1 | 8/2007 | Hatakeyama et al. | |
| 2007/0179309 A1 | 8/2007 | Hasegawa et al. | |
| 2008/0046464 A1 | 2/2008 | Gustavsson | |
| 2009/0053650 A1 | 2/2009 | Irie | |
| 2009/0197204 A1* | 8/2009 | Shiono et al. | 430/286.1 |
| 2009/0274978 A1 | 11/2009 | Ohashi et al. | |
| 2010/0136482 A1* | 6/2010 | Harada et al. | 430/270.1 |
| 2010/0143830 A1* | 6/2010 | Ohashi et al. | 430/5 |

FOREIGN PATENT DOCUMENTS

| | | |
|---|---|---|
| JP | 9-246173 A | 9/1997 |
| JP | 2000-336121 A | 12/2000 |
| JP | 2006-048029 A | 2/2006 |

(Continued)

OTHER PUBLICATIONS

English Translation of JP2008122932.*

(Continued)

*Primary Examiner* — Cynthia H Kelly
*Assistant Examiner* — Anna Malloy
(74) *Attorney, Agent, or Firm* — Westerman, Hattori, Daniels & Adrian, LLP

(57) ABSTRACT

A polymer having a partial structure —$C(CF_3)_2OH$ in recurring units is used as an additive to formulate a resist composition. A photoresist film formed from the resist composition has sufficient barrier performance against water to prevent any resist components from being leached in water and thus minimize any change of pattern profile.

16 Claims, 1 Drawing Sheet

(56) References Cited

FOREIGN PATENT DOCUMENTS

| | | | |
|---|---|---|---|
| JP | 2006-309245 A | | 11/2006 |
| JP | 2007-140446 A | | 6/2007 |
| JP | 2007-187887 A | | 7/2007 |
| JP | 2008-111103 A | | 5/2008 |
| JP | 2008-122932 A | | 5/2008 |
| JP | 2008122932 A | * | 5/2008 |
| JP | 2009-269953 A | | 11/2009 |
| JP | 2010-218249 A | | 9/2010 |
| WO | 2005/069676 A1 | | 7/2005 |
| WO | 2005/042453 A1 | | 12/2005 |

OTHER PUBLICATIONS

Hirayama, Taku, "Resist and Cover Material Investigation for Immersion Lithography", 2nd Immersion Workshop, Jul. 2003.

Ito, Hiroshi et al., "Aliphatic platforms for the design of 157nm chemically amplified resists", Proc. SPIE, 2002, p. 18-28, vol. 4690.

Lin, BJ, "Semiconductor Foundry, Lithography, and Partners", Proc. SPIE, 2002, p. XXIX-XLII, vol. 4690.

Murase, H et al., "Neuer Begriff und ein Nano-Hybrid System für Hydrophobie", XXIV FATIPEC Congress Book, 1997, pp. B15-B-38, vol. 1B.

Nakano, Katsushi et al., "Defectivity data taken with a full-field immersion exposure tool," 2nd International Symposium on Immersion Lithography, Sep. 2005.

Owa, Soichi et al., "Immersion Lithography; its potential performance and issues", Proc of SPIE, 2003, pp. 724-733, vol. 5040.

Shirota, Naoko et al., "Development of non-topcaot resist polymers for 193-nm immersion lithography", Proc of SPIE, pp. 651905-1-651905-11, vol. 6519.

European Search Report dated Mar. 29, 2012, issued in corresponding application 11193475.8.(8 pages).

* cited by examiner

RESIST COMPOSITION AND PATTERNING PROCESS

CROSS-REFERENCE TO RELATED APPLICATION

This non-provisional application claims priority under 35 U.S.C. §119(a) on Patent Application No. 2010-277875 filed in Japan on Dec. 14, 2010, the entire contents of which are hereby incorporated by reference.

TECHNICAL FIELD

This invention relates to a resist composition for use in a photolithography process for the microfabrication of semiconductor devices, and particularly an immersion photolithography process involving directing ArF excimer laser radiation of wavelength 193 nm toward a resist-coated substrate, with water held between a projection lens and the substrate, and a process for forming a resist pattern.

BACKGROUND ART

In the recent drive for higher integration densities and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF excimer laser (248 nm) enabled mass-scale production of dynamic random access memories (DRAM) with an integration degree of 64 MB (processing feature size ≤0.25 µm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA≥0.9), is considered to comply with 65-nm node devices. For the fabrication of next 45-nm node devices, the $F_2$ laser lithography of 157 nm wavelength became a candidate. However, because of many problems including a cost and a shortage of resist performance, the employment of $F_2$ lithography was postponed. ArF immersion lithography was proposed as a substitute for the $F_2$ lithography (see Proc. SPIE Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. The theoretically possible maximum NA is 1.44. The resolution is improved by an increment of NA. A combination of a lens having NA of at least 1.2 with ultra-high resolution technology suggests a way to the 45-nm node (see Proc. SPIE Vol. 5040, p 724, 2003).

The ArF immersion lithography has a possibility that water-soluble components in the resist film be leached in immersion water during exposure. Specifically an acid generated during exposure and a basic compound previously added to the resist material can be leached in immersion water. As a result, pattern profile changes and pattern collapse can occur. It is also pointed out that if the resist film is less water repellent, water droplets remaining on the resist film after scanning, though in a minute volume, can penetrate into the resist film to generate defects. It was then proposed to provide a protective coating between the resist film and water to prevent resist components from being leached out and water from penetrating into the resist film, the process being referred to as "topcoat process." See 2nd Immersion Workshop: Resist and Cover Material Investigation for Immersion Lithography, 2003.

In the ArF immersion lithography using a topcoat, a protective coating material which is soluble in alkaline developer is advantageous. This eliminates the step of stripping off the protective coating, offering great cost and process merits. Thus, great efforts have been devoted to develop water-insoluble resist protective coating materials, for example, resins having alkali-soluble units such as fluorinated alcohol, carboxyl or sulfo groups. See WO 2005/42453 and WO 2005/69676.

On the other hand, a process for preventing resist components from being leached out and water from penetrating into the resist film without a need for a protective coating material has also been developed, the process being referred to as "topcoatless process". See JP-A 2006-48029, JP-A 2006-309245, and JP-A 2007-187887. In the topcoatless process, an alkali-soluble hydrophobic polymer is added to the resist material as a surfactant, whereupon the hydrophobic compound is segregated at the resist surface during resist film formation. The process is thus expected to achieve equivalent effects to the use of resist protective coating material. Additionally, the process is economically advantageous over the use of a resist protective film because steps of forming and removing the protective film are unnecessary.

In either of the topcoat and topcoatless processes, the ArF immersion lithography requires a scanning speed of about 300 to 700 mm/sec in order to gain higher throughputs. In the event of such high-speed scanning, if the water repellency of the resist or protective film is insufficient, water droplets may be left on the film surface after scanning. Residual droplets may cause defects. To eliminate such defects, it is necessary to improve the water repellency of the relevant coating film and the flow or mobility of water (hereinafter, water slip) on the film. The film material must be designed so as to increase the receding contact angle (see 2nd International Symposium on Immersion Lithography, 12-15 Sep. 2005, Defectivity data taken with a full-field immersion exposure tool, Nakano et al). In connection with such polymer design, it is reported that introduction of fluorine is effective for improving water repellency, and formation of micro-domain structure by a combination of different water repellent groups is effective for improving water slip. See XXIV FATIPEC Congress Book, Vol. B, p 15 (1997).

One exemplary material known to have excellent water slip and water repellency on film surface is a copolymer of α-trifluoromethylacrylate and norbornene derivative (Proc. SPIE Vol. 4690, p 18, 2002). While this polymer was developed as the resin for $F_2$ (157 nm) lithography resist materials, it is characterized by a regular arrangement of molecules of (highly water repellent) α-trifluoromethylacrylate and norbornene derivative in a ratio of 2:1. When a water molecule interacts with methyl and trifluoromethyl groups, there is a tendency that the orientation distance between water and methyl is longer. A resin having a regular arrangement of both substituent groups is improved in water slip because of a longer orientation distance of water. In fact, when this polymer is used as the base polymer in a protective coating for immersion lithography, water slip is drastically improved (see US 20070122736 or JP-A 2007-140446). Another example of the highly water repellent/water slippery material is a fluorinated ring-closing polymerization polymer having hexafluoroalcohol groups on side chains. This polymer is further improved in water slip by protecting hydroxyl groups on side chains with acid labile groups, as reported in Proc. SPIE Vol. 6519, p 651905 (2007).

Although the introduction of fluorine into resins is effective for improving water repellency and water slip, the introduction of extra fluorine can induce new defects known as "blob defects". Blob defects are likely to form during spin drying after development, particularly when the film has a high surface contact angle after development. One approach for suppressing blob defects is by introducing highly hydrophilic substituent groups (e.g., carboxyl or sulfo groups) into a resin to reduce the surface contact angle after development. However, since these groups serve to reduce the water repellency and water slip of the resin, this approach is not applicable to high-speed scanning. There is a desire to have a material which can minimize blob defects while maintaining highly water repellent and water slip properties during immersion lithography.

The highly water repellent/water slippery materials discussed above are expected to be applied not only to the ArF immersion lithography, but also to the resist material for mask blanks. Resist materials for mask blanks are subject to long-term exposure in vacuum. It is pointed out that sensitivity variations or profile changes can occur as an amine component in the resist material is adsorbed to the resist film surface during the long-term exposure. It was then proposed to add a compound having surface active effect to modify the surface of a resist film for preventing adsorption of amine to the resist film.

CITATION LIST

Patent Document 1: WO 2005/42453
Patent Document 2: WO 2005/69676
Patent Document 3: JP-A 2006-048029
Patent Document 4: JP-A 2006-309245
Patent Document 5: JP-A 2007-187887
Patent Document 6: US 20070122736 (JP-A 2007-140446)
Non-Patent Document 1: Proc. SPIE Vol. 4690, xxix (2002)
Non-Patent Document 2: Proc. SPIE Vol. 5040, p 724 (2003)
Non-Patent Document 3: 2nd Immersion Workshop: Resist and Cover Material Investigation for Immersion Lithography (2003)
Non-Patent Document 4: 2nd International Symposium on Immersion Lithography, 12-15 Sep. 2005, Defectivity data taken with a full-field immersion exposure tool, Nakano et al.
Non-Patent Document 5: XXIV FATIPEC Congress Book, Vol. B, p 15 (1997)
Non-Patent Document 6: Proc. SPIE Vol. 4690, p 18 (2002)
Non-Patent Document 7: Proc. SPIE Vol. 6519, p 651905 (2007)

SUMMARY OF INVENTION

An object of the invention is to provide a resist composition, especially chemically amplified positive resist composition comprising an additive polymer, which composition exhibits water repellency, water slip and minimal development defects, and a pattern forming process using the composition. The additive polymer used herein is highly transparent to radiation with wavelength of up to 200 nm. Various properties of the polymer including water repellency, water slip, fat solubility, acid lability, and hydrolysis may be adjusted by a choice of polymer structure. The polymer can be prepared from reactants which are readily available and easy to handle.

The inventors have found that when a polymer having a fluorinated alcohol of specific structure, specifically a partial structure $-C(CF_3)_2OH$ in recurring units is used as an additive to formulate a resist composition, the resist composition forms a resist film which has sufficient water repellency and water slip to withstand high-speed scanning without a need for a resist protective film.

Accordingly, the present invention provides a resist composition and a pattern forming process, as defined below.

In a one aspect, the invention provides a resist composition comprising (A) a polymer comprising recurring units of the following general formula (1a), (B) a polymer having a lactone ring-derived structure, hydroxyl-containing structure and/or maleic anhydride-derived structure and adapted to become soluble in an alkaline developer under the action of an acid as a base resin, (C) a compound capable of generating an acid upon exposure to high-energy radiation, and (D) an organic solvent.

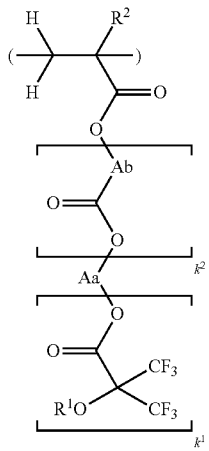

(1a)

Herein $R^1$ is hydrogen or a straight, branched or cyclic $C_1$-$C_{20}$ monovalent hydrocarbon group in which a constituent moiety $-CH_2-$ may be replaced by $-O-$ or $-C(=O)-$, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1+1$, Ab is a straight, branched or cyclic $C_1$-$C_6$ divalent hydrocarbon group, $k^1$ is an integer of 1 to 3, and $k^2$ is 0 or 1.

In a preferred embodiment, the additive polymer (A) comprises recurring units of formula (1a) and recurring units of one or more type selected from the general formulae (2a) to (2j).

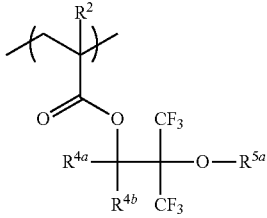

(2a)

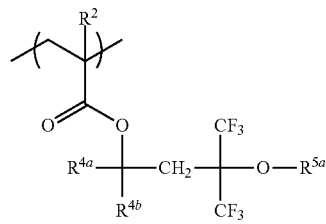

(2b)

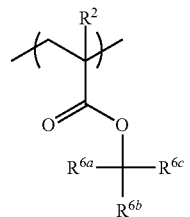
(2c)

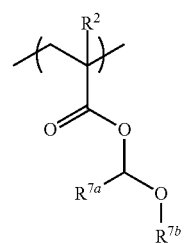
(2d)

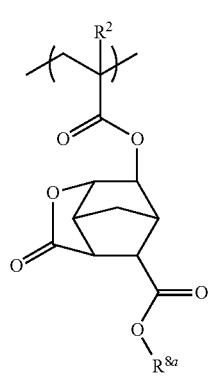
(2e)

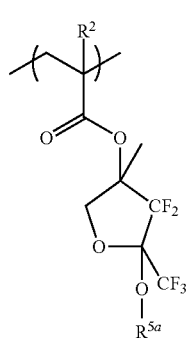
(2f)

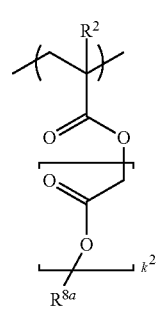
(2g)

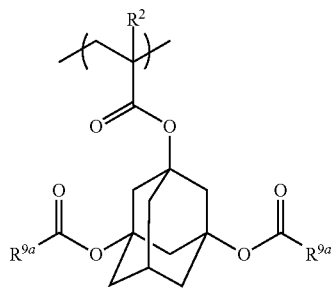
(2h)

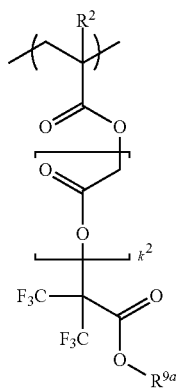
(2i)

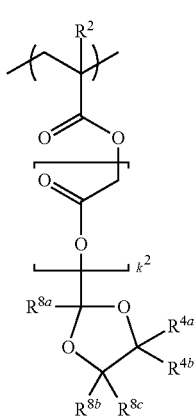
(2j)

Herein $R^2$ is as defined above, $R^{4a}$ and $R^{4b}$ are each independently hydrogen or a straight, branched or cyclic monovalent hydrocarbon group, or $R^{4a}$ and $R^{4b}$ may bond together to form a non-aromatic ring of 3 to 8 carbon atoms with the carbon atom to which they are attached, $R^{5a}$ is hydrogen, a straight, branched or cyclic $C_1$-$C_{15}$ monovalent hydrocarbon or fluorinated hydrocarbon group, or an acid labile group, in the case of hydrocarbon group, a constituent moiety —$CH_2$— may be replaced by —O— or —C(=O)—, $R^{6a}$, $R^{6b}$ and $R^{6c}$ are each independently hydrogen, or a straight, branched or cyclic $C_1$-$C_{15}$ monovalent hydrocarbon group, $R^{6a}$ and $R^{6b}$, $R^{6a}$ and $R^{6c}$, or $R^{6b}$ and $R^{6c}$ may bond together to form a non-aromatic ring of 3 to 8 carbon atoms with the carbon atom to which they are attached, $R^{7a}$ is hydrogen, or a straight, branched or cyclic $C_1$-$C_{15}$ monovalent hydrocarbon group, $R^{7b}$ is a straight, branched or cyclic $C_1$-$C_{15}$ monovalent hydrocarbon group, $R^{7a}$ and $R^{7b}$ may bond together to form a non-aromatic ring of 3 to 8 carbon atoms with the carbon atom to which they are attached, $R^{8a}$, $R^{8b}$ and $R^{8c}$ are each independently a straight, branched or cyclic $C_1$-$C_{15}$ monovalent fluorinated hydrocarbon group, $R^{9a}$ is a straight, branched or cyclic $C_1$-$C_{15}$ monovalent hydrocarbon or fluorinated hydrocarbon group, and $k^2$ is 0 or 1.

In a preferred embodiment, the base polymer (B) is selected from the group consisting of (meth)acrylate polymers, (α-trifluoromethyl)acrylate-maleic anhydride copolymers, cycloolefin-maleic anhydride copolymers, polynorbornene, polymers resulting from ring-opening metathesis polymerization of cycloolefins, hydrogenated polymers resulting from ring-opening metathesis polymerization of cycloolefins, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

The base polymer (B) may comprise recurring units of at least one type selected from the general formulae (2A) to (2D):

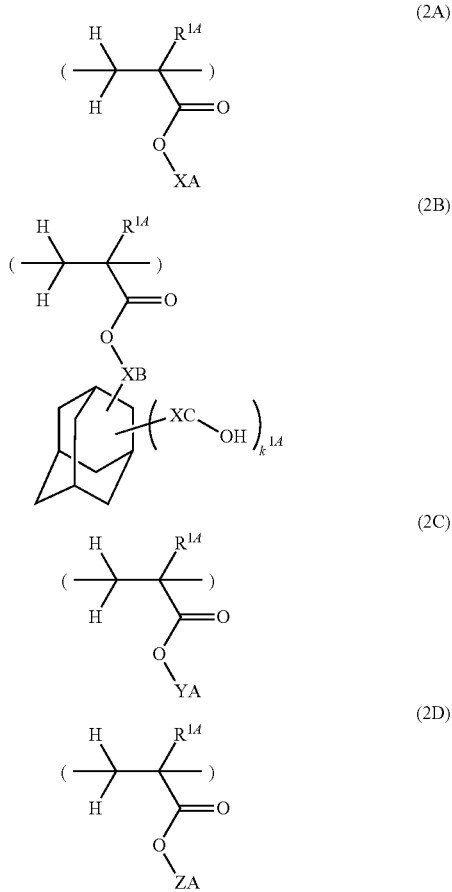

wherein $R^{1A}$ is hydrogen, fluorine, methyl or trifluoromethyl, XA is an acid labile group, XB and XC are each independently a single bond or a straight or branched $C_1$-$C_4$ divalent hydrocarbon group, YA is a substituent group having a lactone structure, ZA is hydrogen, a $C_1$-$C_{15}$ fluoroalkyl group or $C_1$-$C_{15}$ fluoroalcohol-containing substituent group, and $k^{1A}$ is an integer of 1 to 3.

In a preferred embodiment, the polymer (A) comprising recurring units of formula (1a) is added in an amount of 0.1 to 50 parts by weight per 100 parts by weight of the polymer (B).

The resist composition may further comprise (E) a basic compound and/or (F) a dissolution regulator.

In another aspect, the invention provides:

a pattern forming process comprising the steps of (1) applying the resist composition defined above onto a substrate, (2) heat treating and exposing the resulting resist film to high-energy radiation through a photomask, and (3) developing with a developer;

a pattern forming process comprising the steps of (1) applying the resist composition defined above onto a substrate, (2) heat treating and exposing the resulting resist film to high-energy radiation from a projection lens through a photomask while holding a liquid between the substrate and the projection lens, and (3) developing with a developer; or a pattern forming process comprising the steps of (1) applying the resist composition defined above onto a substrate to form a resist film, (2) forming a protective coating onto the resist film, (3) heat treating and exposing the resist film to high-energy radiation from a projection lens through a photomask while holding a liquid between the substrate and the projection lens, and (4) developing with a developer.

Typically, the liquid is water. The preferred high-energy radiation has a wavelength in the range of 180 to 250 nm.

In a further aspect, the invention provides a pattern forming process comprising the steps of (1) applying the resist composition defined above onto a mask blank, (2) heat treating and exposing the resulting resist film in vacuum to electron beam, and (3) developing with a developer.

Advantageous Effects of Invention

A photoresist film formed from the resist composition of the invention has sufficient barrier performance against water to prevent any resist components from being leached in water and thus minimize any change of pattern profile due to leach-out. Absent a need for a protective film which is commonly formed in the immersion lithography to prevent leach-out, the invention saves the cost for protective film formation.

The photoresist film has a high receding contact angle with water, allows few water droplets to be left on the photoresist film surface after scanning in the immersion lithography process, and thus minimizes a pattern formation failure caused by residual droplets on the film surface. The use of the resist composition according to the invention reduces the cost of the immersion lithography process and enables formation of a fine size pattern with few defects at a high accuracy.

DESCRIPTION OF EMBODIMENTS

Figure 1:
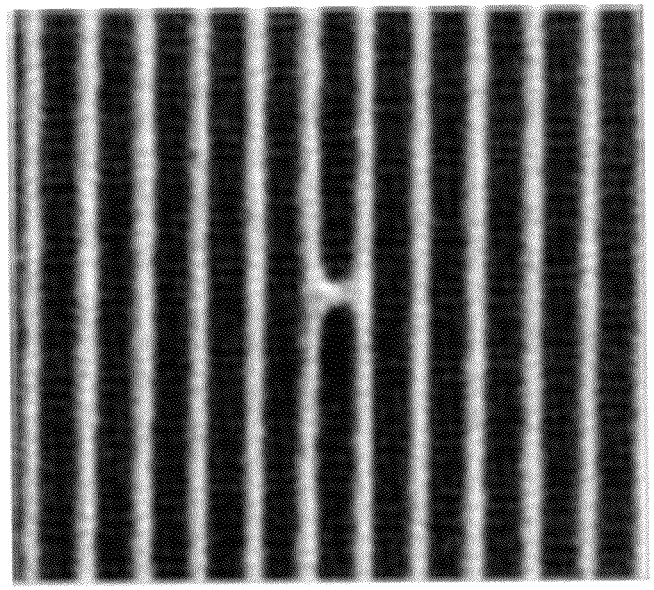
FIG. 1 is a SEM image showing a bridge defect on a resist pattern.

The singular forms "a", "an" and "the" include plural referents unless the context clearly dictates otherwise. The notation (Cn-Cm) means a group containing from n to m carbon atoms per group. The abbreviation PAG stands for photoacid generator, PEB for post-exposure bake, EB for electron beam, EUV for extreme ultraviolet. The abbreviation "phr" is parts by weight per 100 parts by weight of the base resin.

While a certain compound is herein represented by a chemical formula, many compounds have a chemical structure for which there can exist enantiomers or diastereomers. Each chemical formula collectively represents all such stereoisomers, unless otherwise stated. Such stereoisomers may be used alone or in admixture.

Additive Polymer

The polymer used as an additive in the resist composition of the invention is characterized by comprising recurring units having the general formula (1a). For convenience of description, the polymer comprising recurring units of formula (1a) is referred to as "polymer P1," hereinafter.

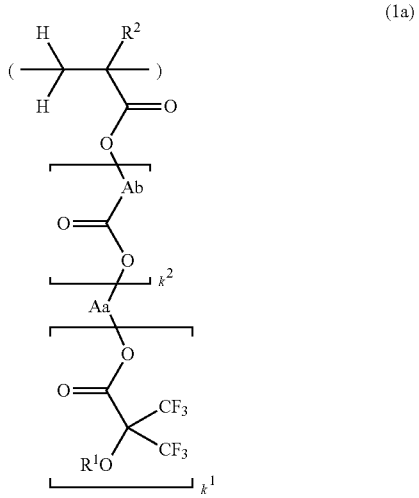
(1a)

Herein $R^1$ is hydrogen or a straight, branched or cyclic $C_1$-$C_{20}$ monovalent hydrocarbon group in which a constituent moiety —$CH_1$— may be replaced by —O— or —C(=O)—, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1$+1, Ab is a straight, branched or cyclic $C_1$-$C_{20}$ divalent hydrocarbon group, $k^1$ is an integer of 1 to 3, and $k^2$ is 0 or 1.

Polymer P1 is characterized in that the recurring units of formula (1a) each contain a plurality of fluorine atoms. Once polymer P1 is added to a resist composition, polymer P1 itself functions as a surfactant to provide a distribution at the time when a resist film is formed, that polymer P1 is segregated at the resist film surface.

In general, fluorinated polymers exert excellent functions of water repellency and water slip. When polymer P1 is used as a resist additive, it is possible to form a resist film having a surface exerting excellent water repellency and water slip at the same time as its formation. An effect equivalent to the use of resist protective coating material is expectable. This approach is also advantageous in cost because it eliminates the steps of forming and removing a resist protective coating.

In formula (1a), the monovalent hydrocarbon groups represented by $R^1$ include groups for protecting an alcoholic hydroxyl group, specifically groups having the general formula (R1-1) and (R1-2), tertiary alkyl groups of 4 to 15 carbon atoms, trialkylsilyl groups in which each alkyl moiety has 1 to 5 carbon atoms, oxoalkyl groups of 4 to 15 carbon atoms, and acyl groups of 1 to 10 carbon atoms.

(R1-1)

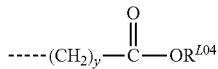
(R1-2)

Herein and throughout the specification, the broken line designates a valence bond. $R^{L01}$ and $R^{L02}$ each independently hydrogen or a straight, branched or cyclic alkyl group of 1 to 18 carbon atoms, preferably 1 to 10 carbon atoms. Examples include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Examples of the substituted alkyl groups are as shown below.

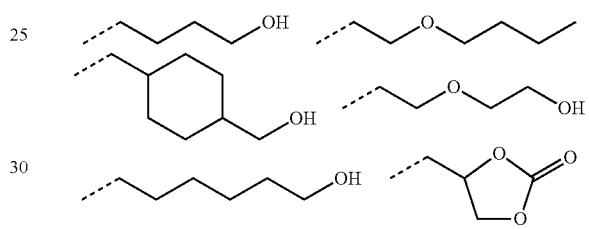

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (R1-2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (R1-1). The subscript y is an integer of 0 to 6.

Suitable groups of $R^1$ and $R^{L04}$ are illustrated below. Exemplary tertiary alkyl groups include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Examples of the acyl group include formyl, acetyl, ethylcarbonyl, pivaloyl, methoxycarbonyl, ethoxycarbonyl, tert-butoxycarbonyl, trifluoroacetyl, and trichloroacetyl.

Of the protective groups of formula (R1-1), the straight or branched groups are exemplified by the following.

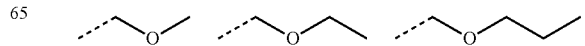

-continued

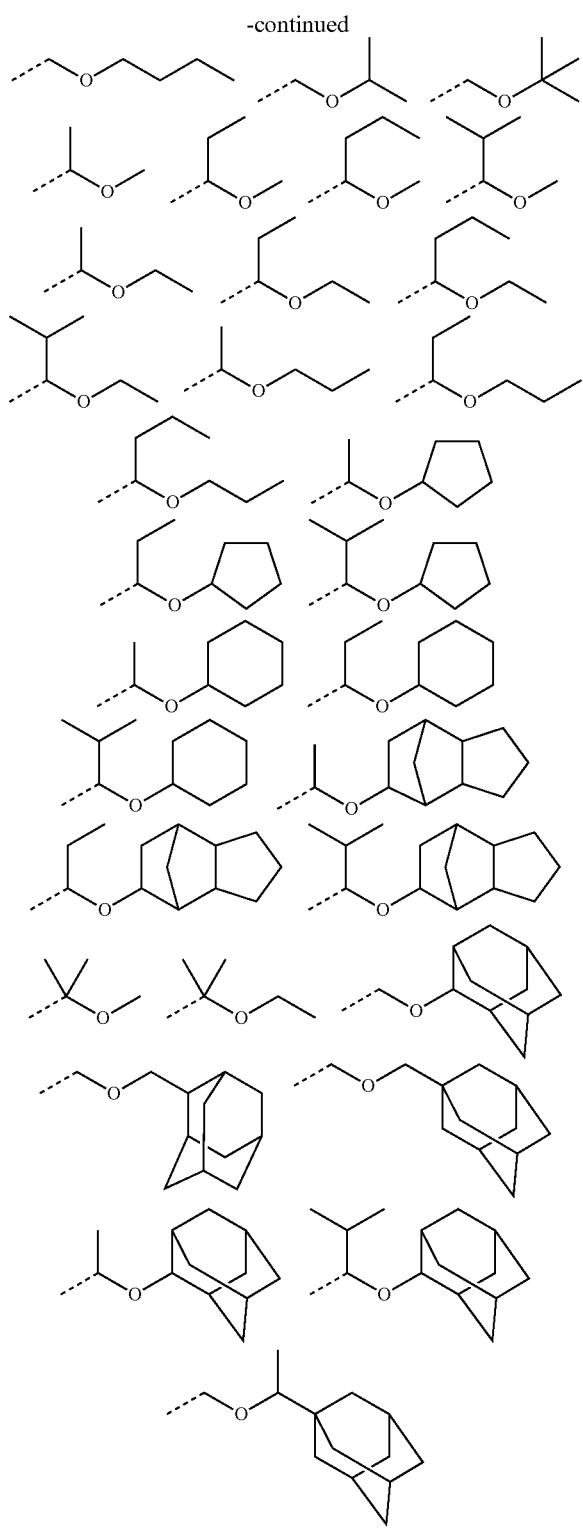

Of the protective groups of formula (R1-1), the cyclic ones are, for example, tetrahydrofuran-2-yl, 2-methyltetrahydrofuran-2-yl, tetrahydropyran-2-yl, and 2-methyltetrahydropyran-2-yl.

Examples of the protective groups of formula (R1-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylm- ethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Referring back to formula (1a), Aa is a straight, branched or cyclic $C_1$-$C_{20}$ hydrocarbon or fluorinated hydrocarbon group having a valence of $k^1+1$. Examples of the $C_1$-$C_{20}$ hydrocarbon group are shown below.

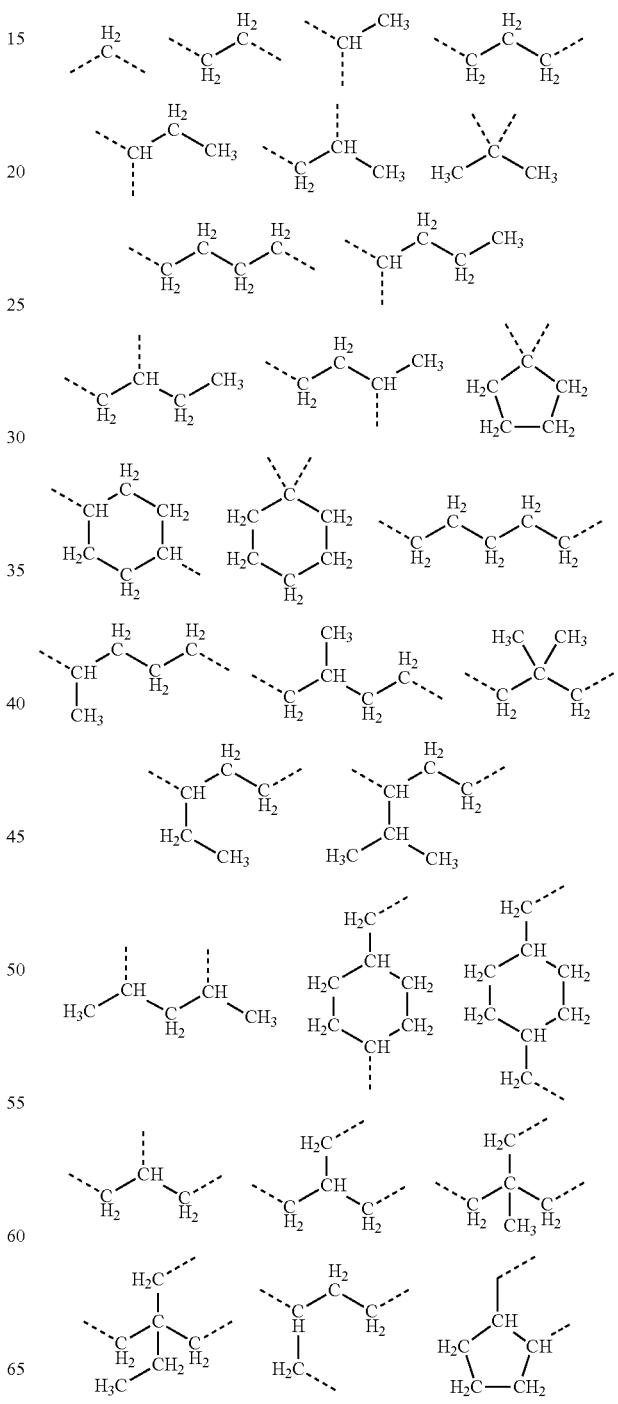

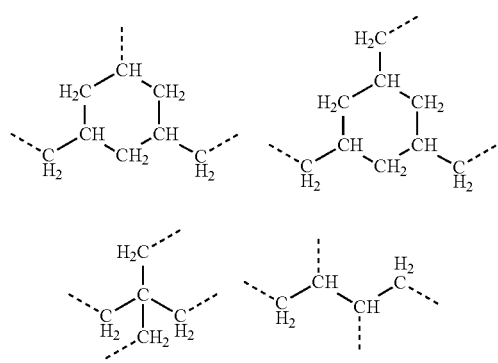

Examples of the $C_1$-$C_{20}$ fluorinated hydrocarbon group include fluorinated forms of the foregoing in which some or all hydrogen atoms are replaced by fluorine atoms.

Ab is a straight, branched or cyclic $C_1$-$C_6$ divalent hydrocarbon group, examples of which are shown below.

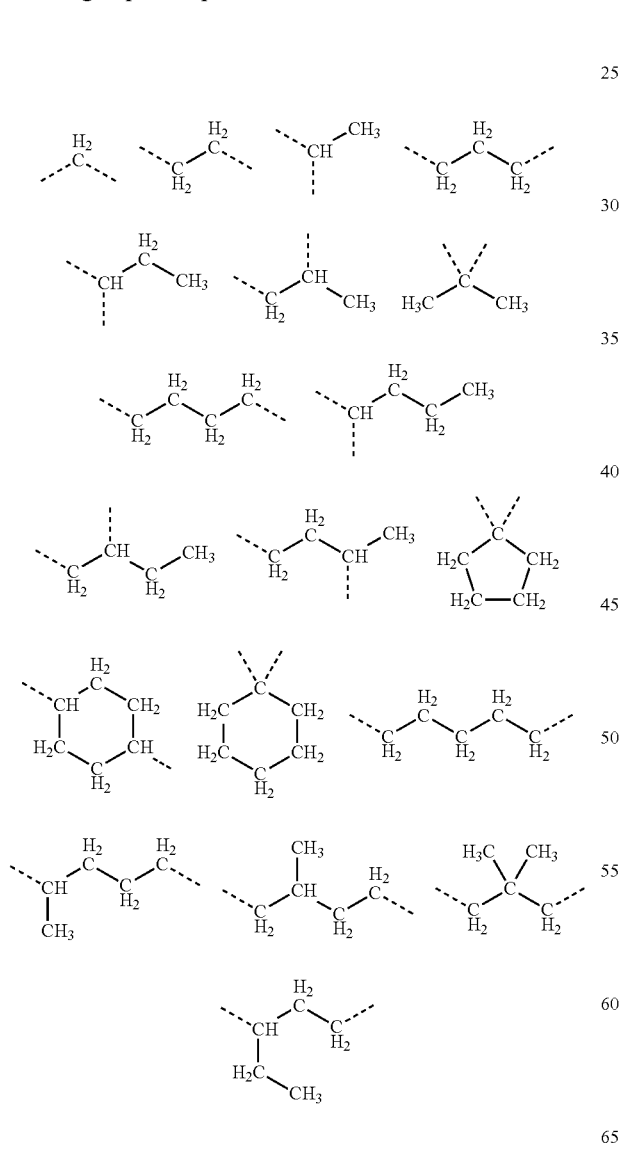

Illustrative, non-limiting examples of the recurring units having formula (1a) are shown below.

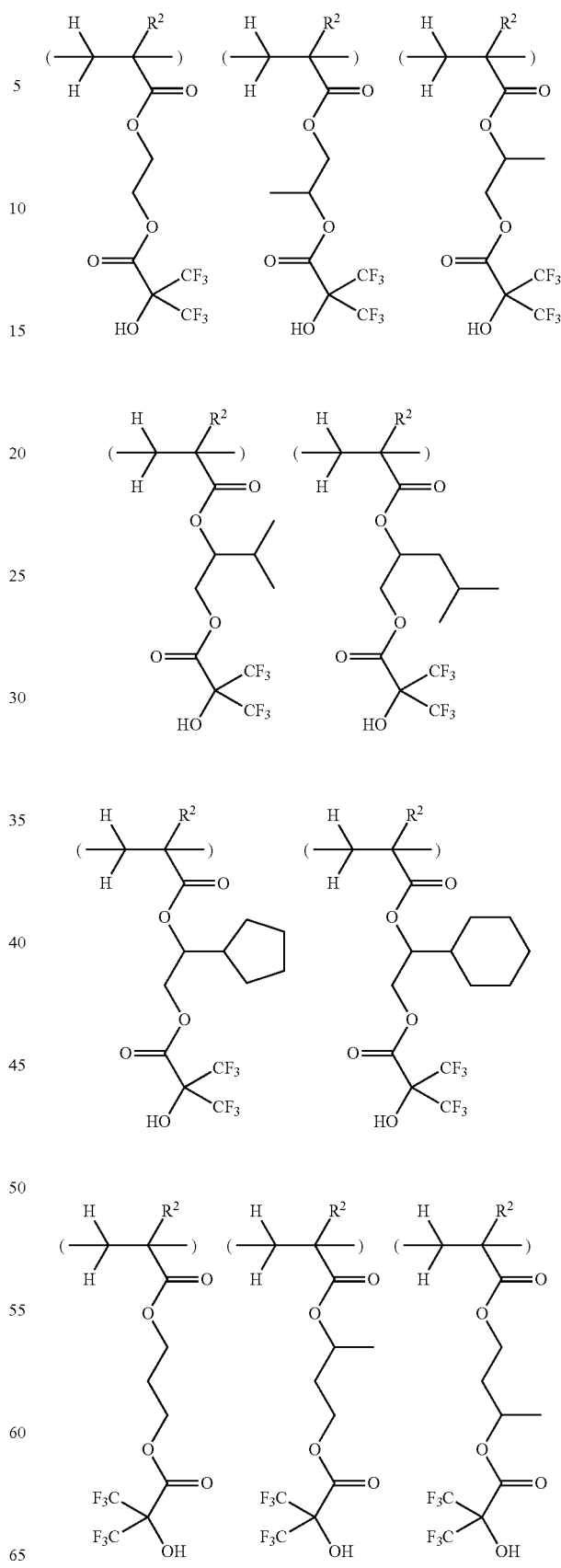

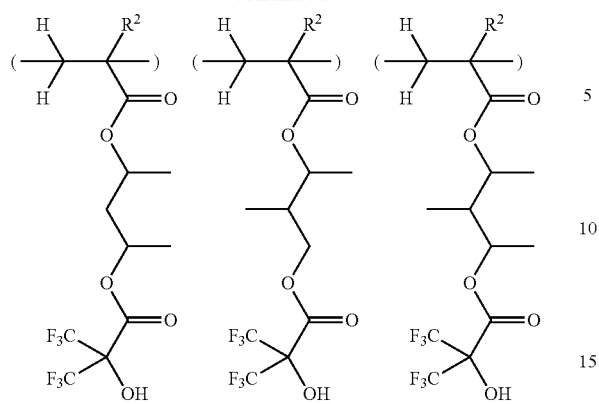
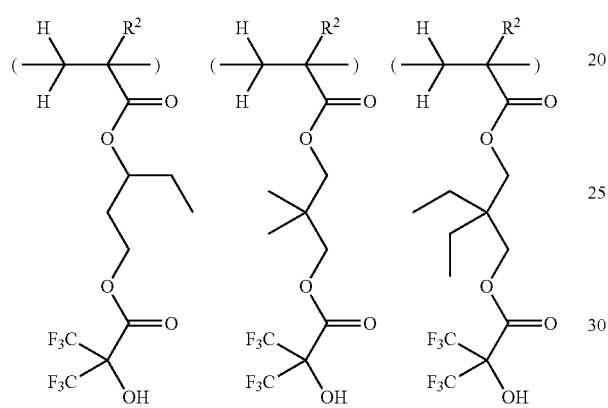
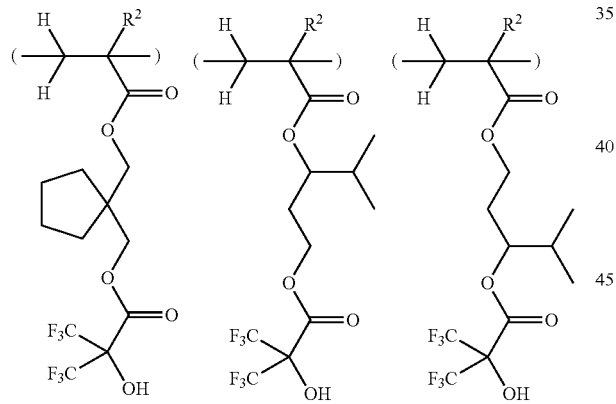
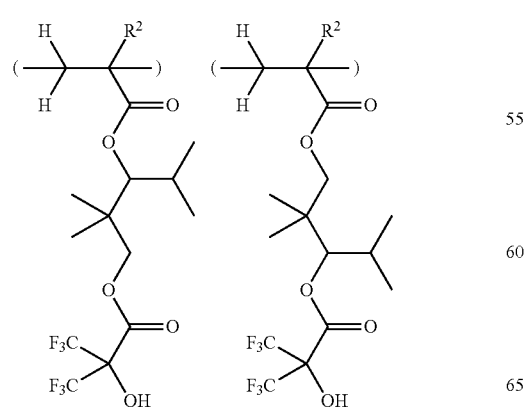
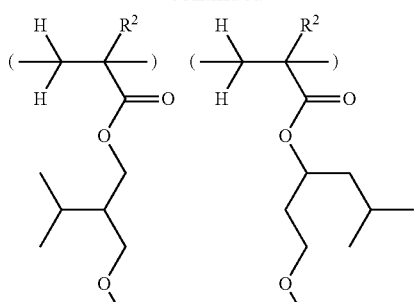
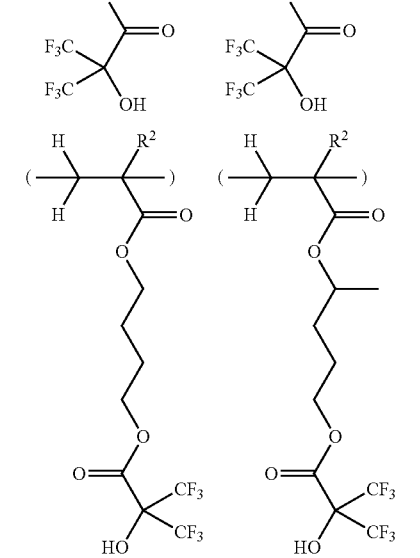
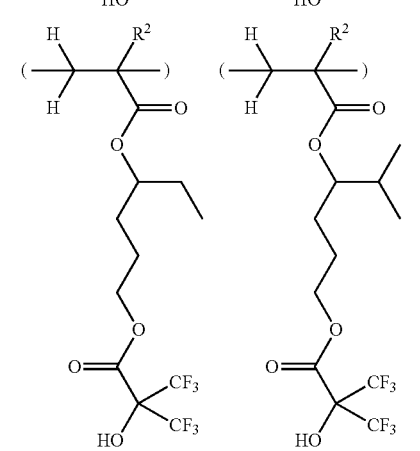
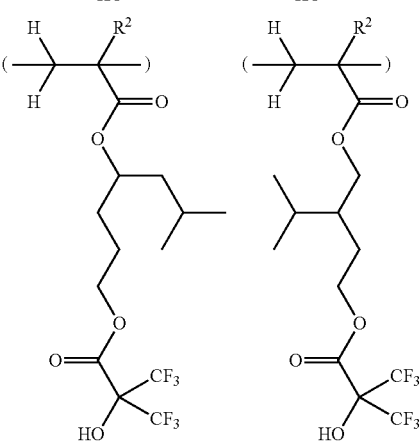

-continued
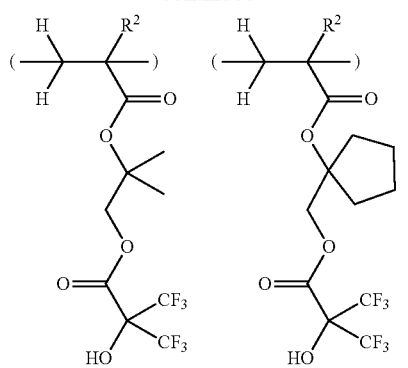
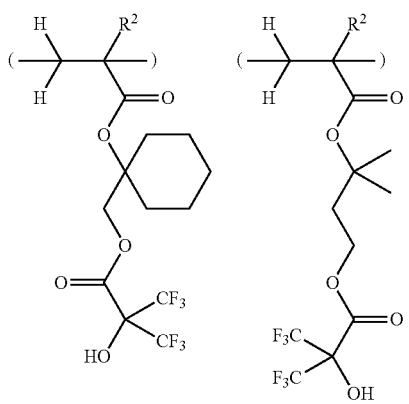
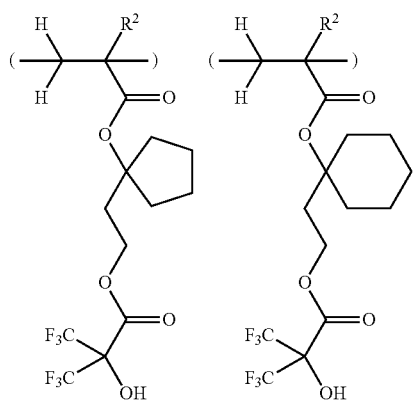
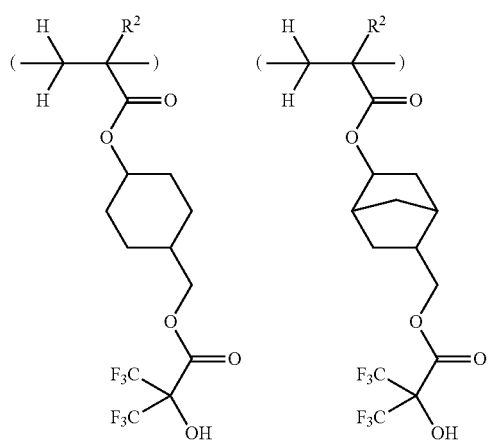
-continued
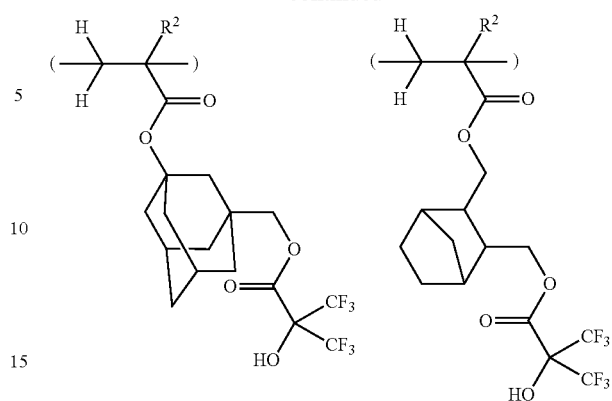
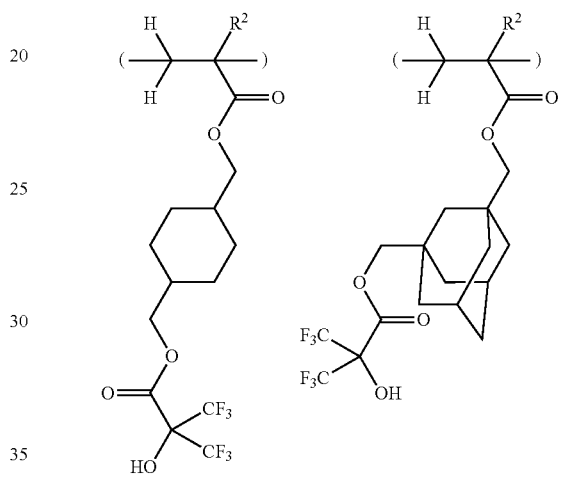
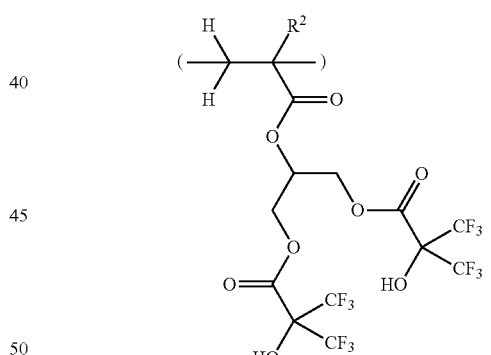
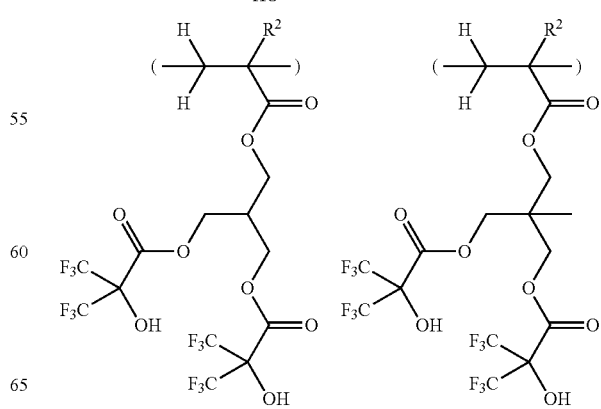

-continued
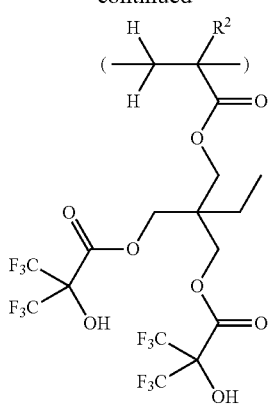
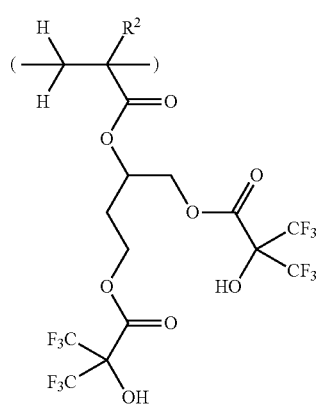
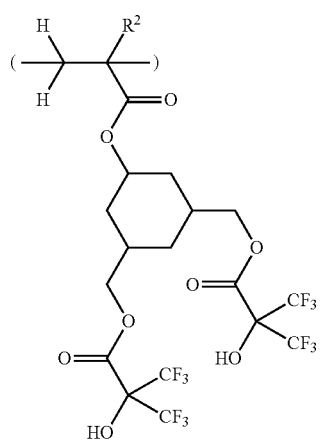
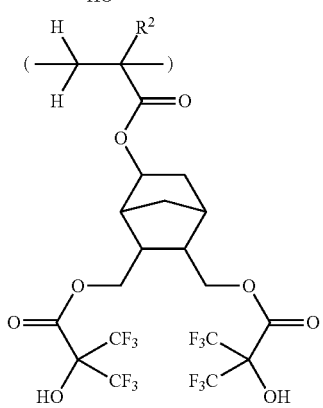
-continued
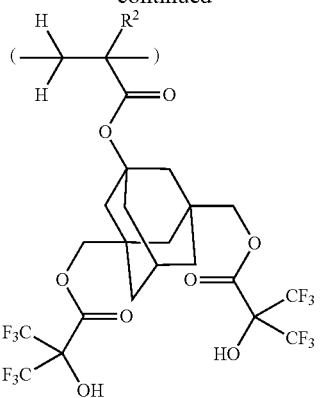
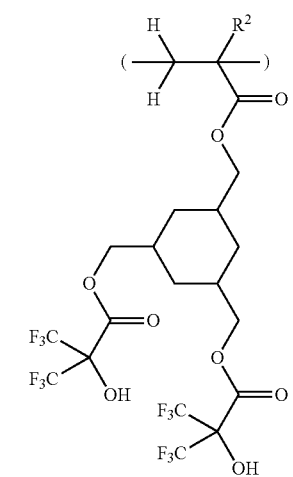
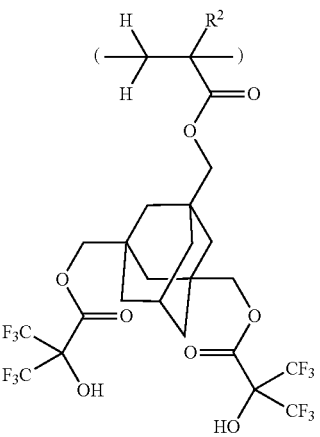
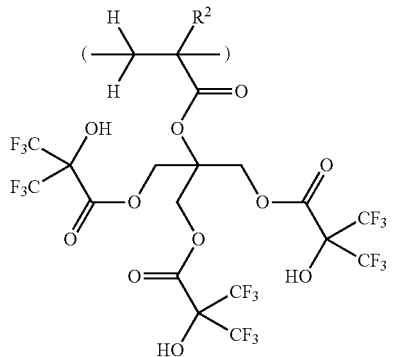

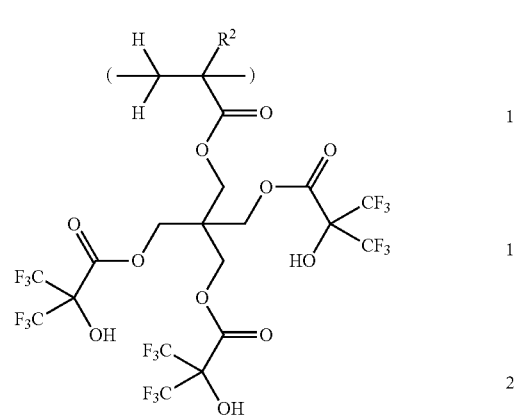
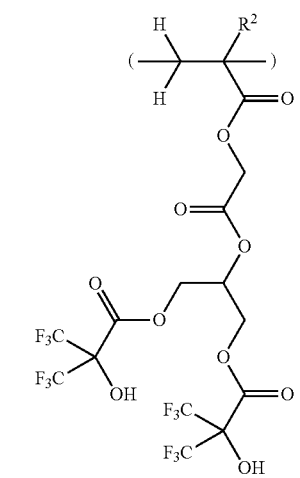
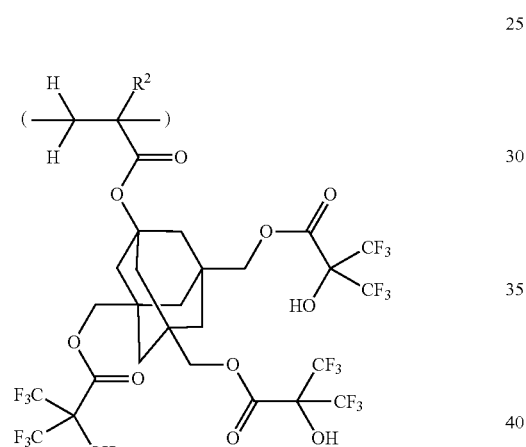
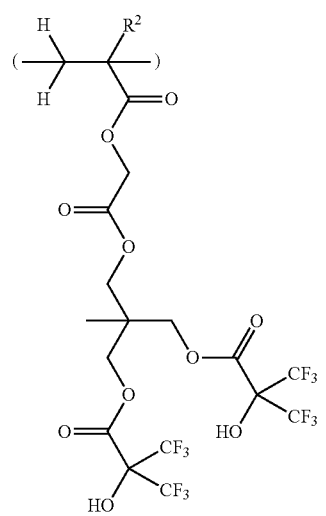
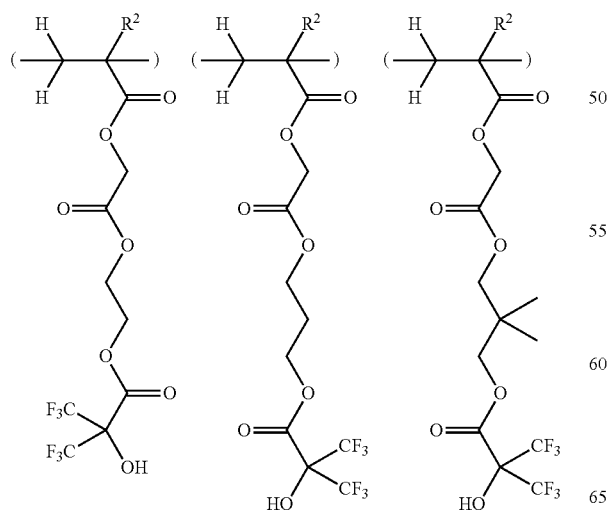
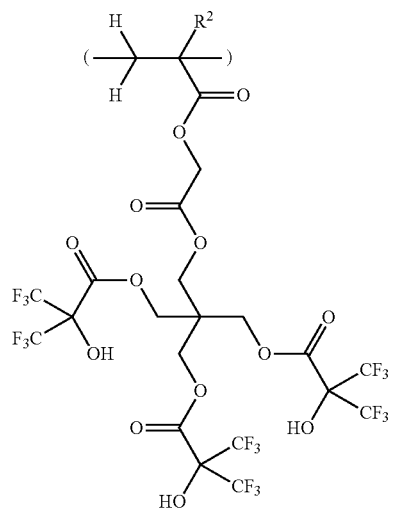

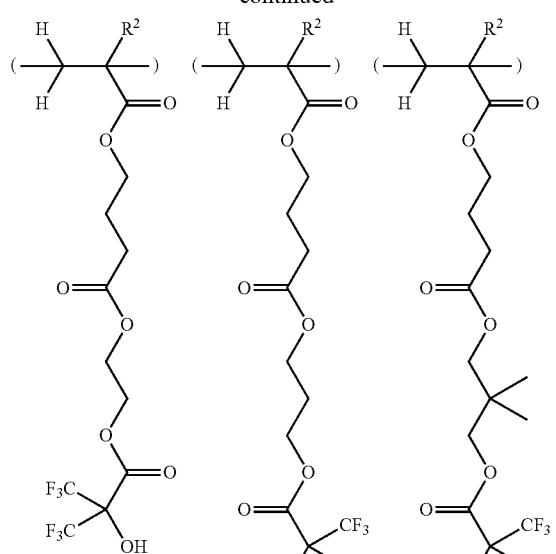
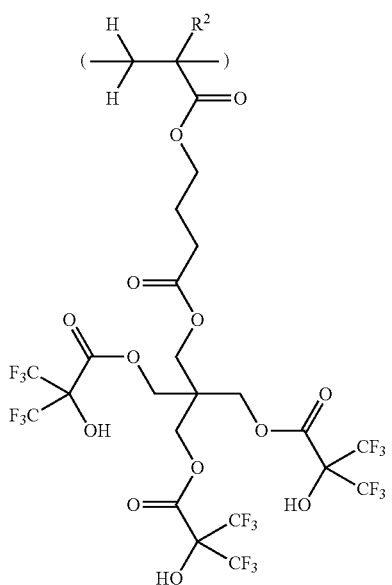
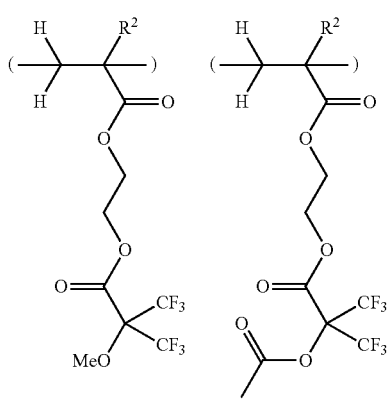
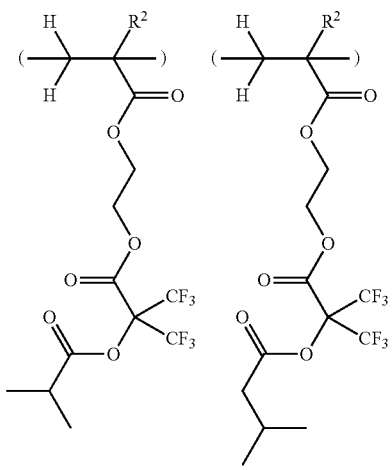

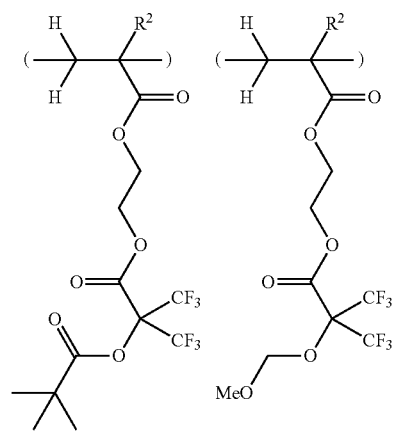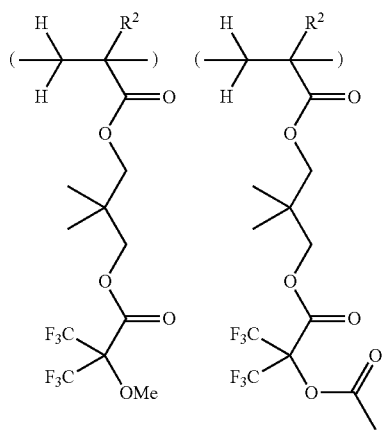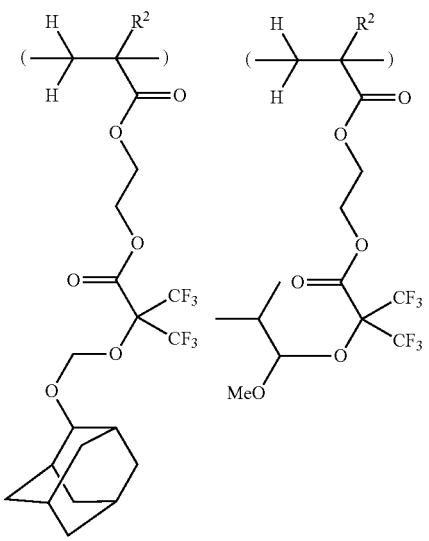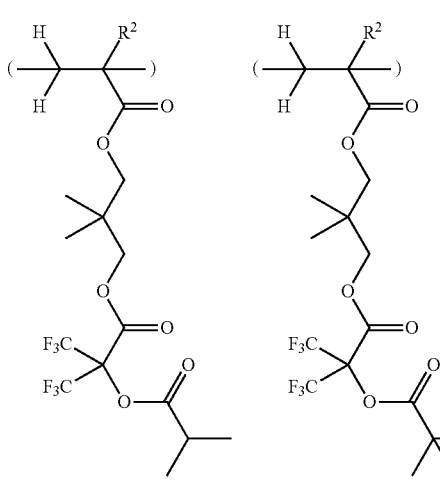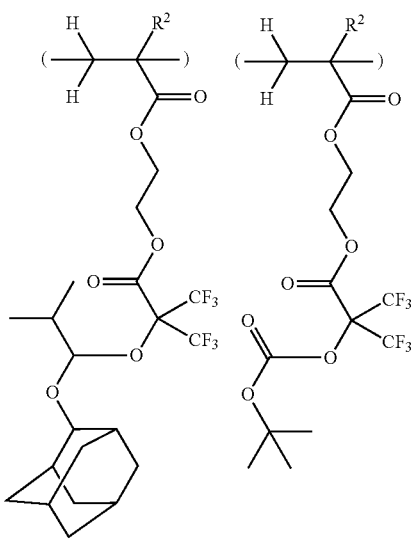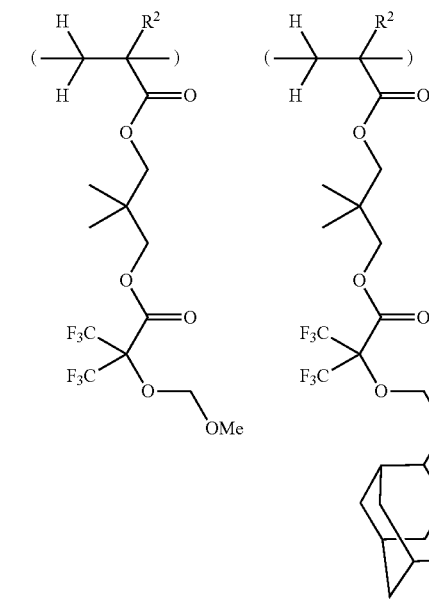

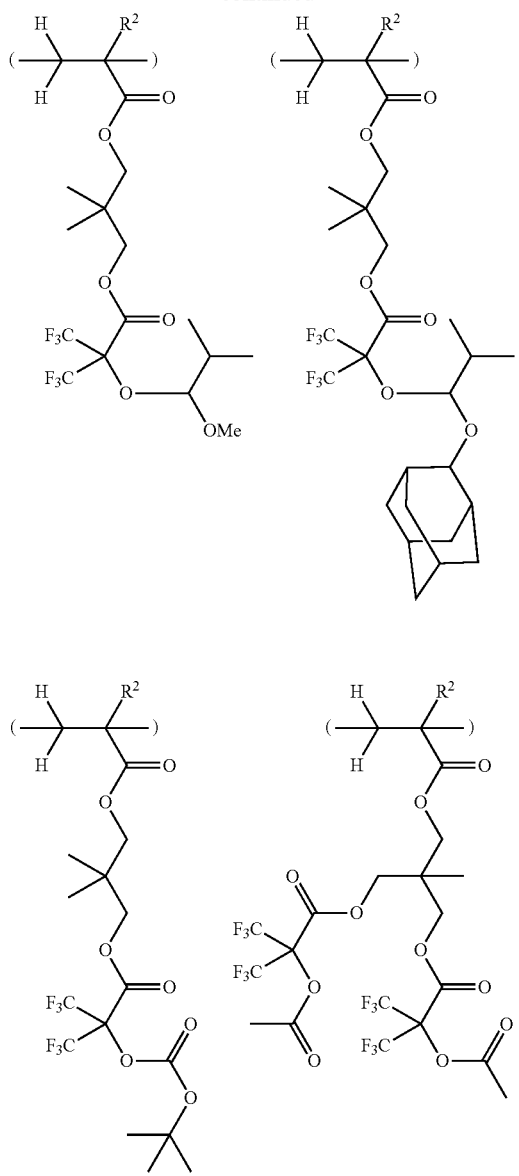
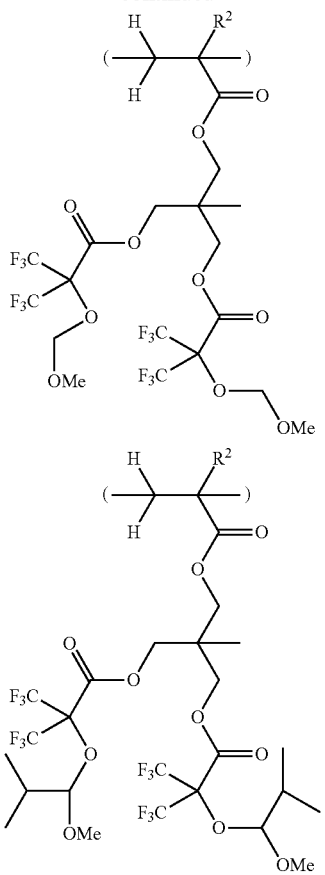

Herein R² is as defined above, and Me is methyl.

In addition to the recurring units of formula (1a), the additive polymer P1 may further comprise recurring units of one or multiple types selected from the general formulae (2a) to (2j). The polymer having additional recurring units incorporated herein is more improved in water repellency, water slip, alkaline dissolution, and contact angle after development.

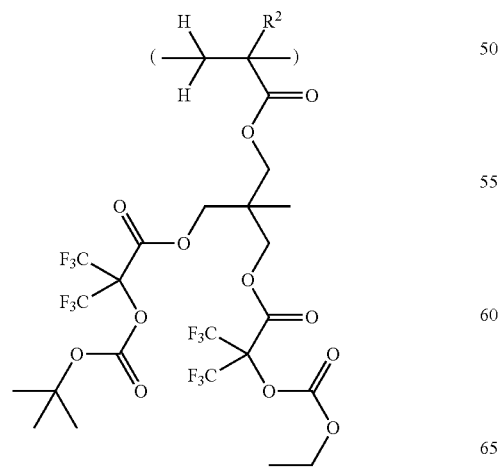

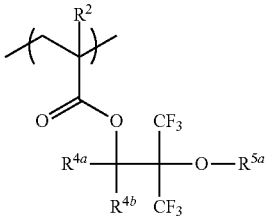

(2a)

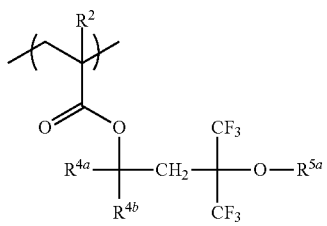

(2b)

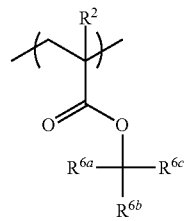
(2c)

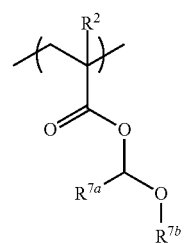
(2d)

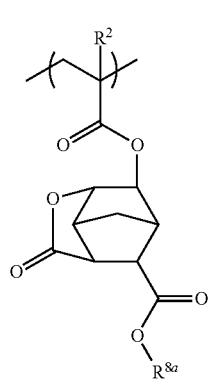
(2e)

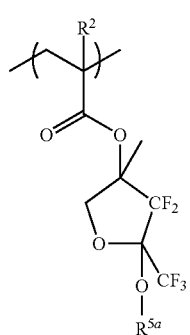
(2f)

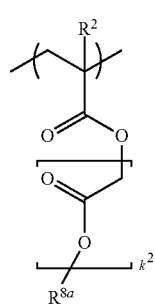
(2g)

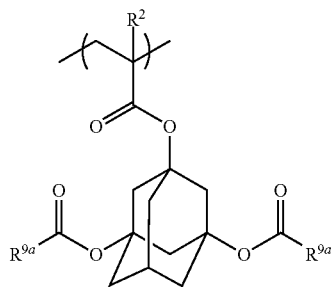
(2h)

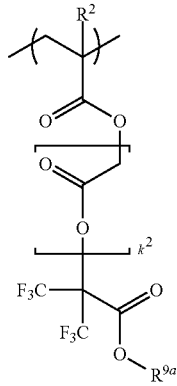
(2i)

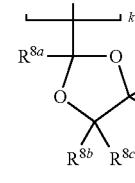
(2j)

Herein $R^2$ is as defined above. $R^{4a}$ and $R^{4b}$ are each independently hydrogen or a straight, branched or cyclic $C_1$-$C_{15}$ monovalent hydrocarbon group, or $R^{4a}$ and $R^{4b}$ may bond together to form a $C_3$-$C_8$ non-aromatic ring with the carbon atom to which they are attached. $R^{5a}$ is hydrogen, a straight, branched or cyclic $C_1$-$C_{15}$ monovalent hydrocarbon or fluorinated hydrocarbon group, or an acid labile group. In the case of monovalent hydrocarbon group, a constituent moiety —$CH_2$— may be replaced by —O— or —C(=O)—. $R^{6a}$, $R^{6b}$ and $R^{6c}$ are each independently hydrogen or a straight, branched or cyclic $C_1$-$C_{15}$ monovalent hydrocarbon group, or $R^{6a}$ and $R^{6b}$, $R^{6a}$ and $R^{6c}$, or $R^{6b}$ and $R^{6c}$ may bond together to form a $C_3$-$C_8$ non-aromatic ring with the carbon atom to which they are attached. $R^{7a}$ is hydrogen or a straight, branched or cyclic $C_1$-$C_{15}$ monovalent hydrocarbon group, $R^{7b}$ is a straight, branched or cyclic $C_1$-$C_{15}$ monovalent hydrocarbon group, or $R^{7a}$ and $R^{7b}$ may bond together to form a $C_3$-$C_8$ non-aromatic ring with the carbon atom to which they are attached. $R^{8a}$, $R^{8b}$, and $R^{8c}$ are each independently a straight, branched or cyclic $C_1$-$C_{15}$ monovalent fluorinated hydrocarbon group. $R^{9a}$ is a straight, branched or cyclic $C_1$-$C_{15}$ monovalent hydrocarbon or fluorinated hydrocarbon group. The subscript $k^2$ is 0 or 1.

With respect to $R^{4a}$, $R^{4b}$, $R^{5a}$, $R^{6a}$, $R^{6b}$, $R^{6c}$, $R^{7a}$, $R^{7b}$, and $R^{9a}$, suitable straight, branched or cyclic alkyl groups include methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. A pair of $R^{4a}$ and $R^{4b}$, $R^{6a}$ and $R^{6b}$, $R^{6a}$ and $R^{6c}$, $R^{6b}$ and $R^{6c}$, or $R^{7a}$ and $R^{7b}$ may bond together to form a $C_3$-$C_8$ non-aromatic ring with the carbon atom to which they are attached. In the event of cyclization, each R is an alkylene group corresponding to the foregoing alkyl groups with one hydrogen atom eliminated therefrom, and exemplary rings are cyclopentyl and cyclohexyl.

$R^{5a}$, $R^{8a}$, $R^{8b}$, $R^{8c}$, and $R^{9a}$ stand for straight, branched or cyclic $C_1$-$C_{15}$ monovalent fluorinated hydrocarbon groups, specifically fluoroalkyl groups which are typically substituted forms of the foregoing alkyl groups in which some or all hydrogen atoms are substituted by fluorine atoms. Examples include, but are not limited to, trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, 2-(perfluorodecyl)ethyl, and 3,3,4,4,5,5,6,6,6-nonafluorohexyl. Examples of the straight, branched or cyclic fluoroalkyl group represented by $R^{8a}$ include trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, and 3,3,4,4,5,5,6,6,6-nonafluorohexyl.

The acid labile group represented by $R^{5a}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

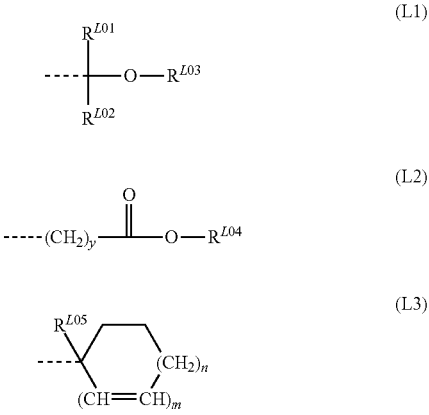

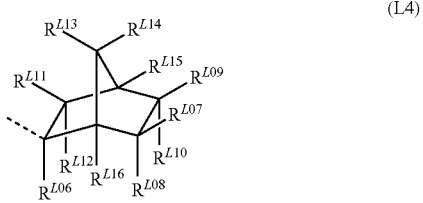

Herein $R^{L01}$ and $R^{L02}$ are each independently hydrogen or a straight, branched or cyclic alkyl group of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or optionally substituted monovalent hydrocarbon groups of 1 to 15 carbon atoms. Letter y is an integer of 0 to 6, m is equal to 0 or 1, n is equal to 0, 1, 2 or 3, and 2 m+n is equal to 2 or 3. The broken line denotes a valence bond.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

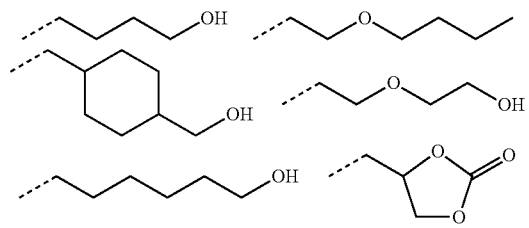

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the optionally substituted $C_1$-$C_{10}$ alkyl groups of $R^{L05}$ include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxyl, alkoxycarbonyl, oxo, amino, alkylamino, cyano, mercapto, alkylthio, sulfo or other groups or in which a methylene moiety is replaced by an oxygen or sulfur atom. Examples of optionally substituted $C_6$-$C_{20}$ groups include phenyl, methylphenyl, naphthyl, anthryl, phenanthryl, and pyrenyl.

In formula (L4), examples of optionally substituted, straight, branched or cyclic $C_1$-$C_{10}$ alkyl groups and optionally substituted $C_6$-$C_{20}$ aryl groups of $R^{L06}$ are the same as exemplified for $R^{L05}$. Exemplary $C_1$-$C_{15}$ monovalent hydrocarbon groups of $R^{L07}$ to $R^{L16}$ include straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$ may bond together to form a non-aromatic ring with the carbon atom(s) to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a $C_1$-$C_{15}$ divalent hydrocarbon group, typically alkylene, when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$).

Of the acid labile groups of formula (L1), the straight and branched ones are exemplified by the following groups.

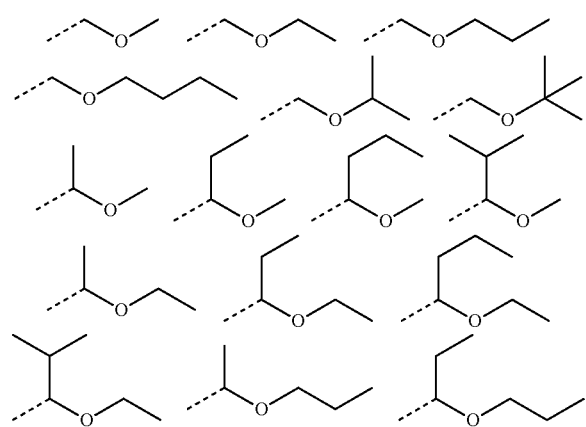

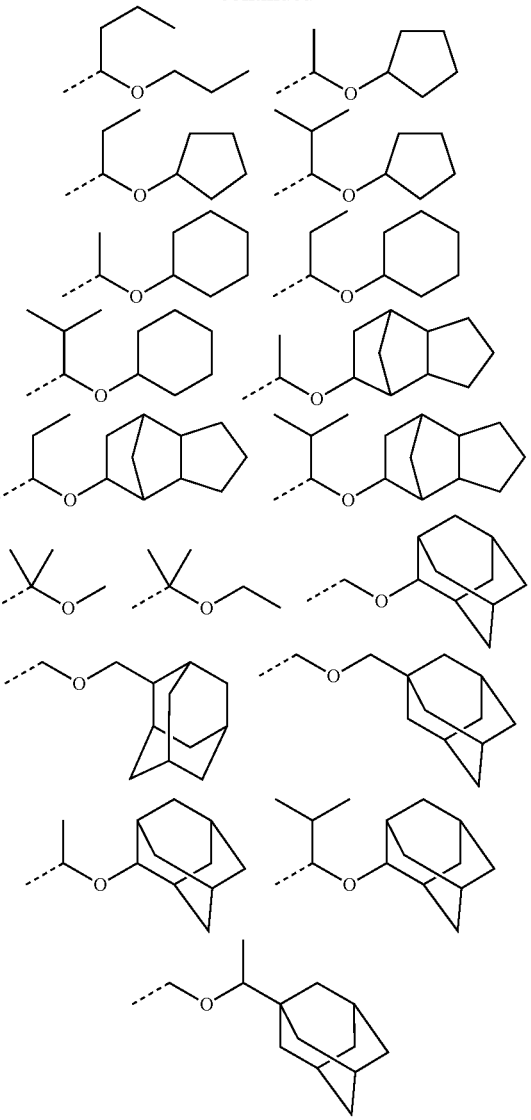

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

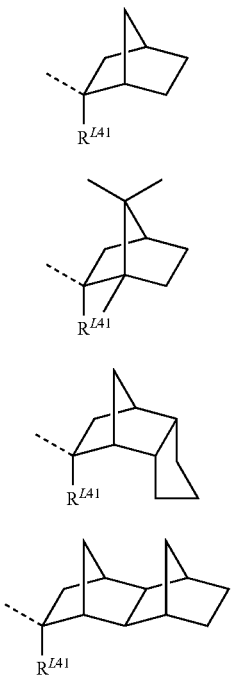

(L4-1)

(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

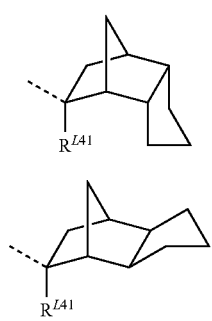

(L4-3-1)

(L4-3-2)

Note that $R^{L41}$ is as defined above.

Similarly, the general formula (L4-4) represents one or a mixture of two or more selected from groups having the following general formulas (L4-4-1) to (L4-4-4).

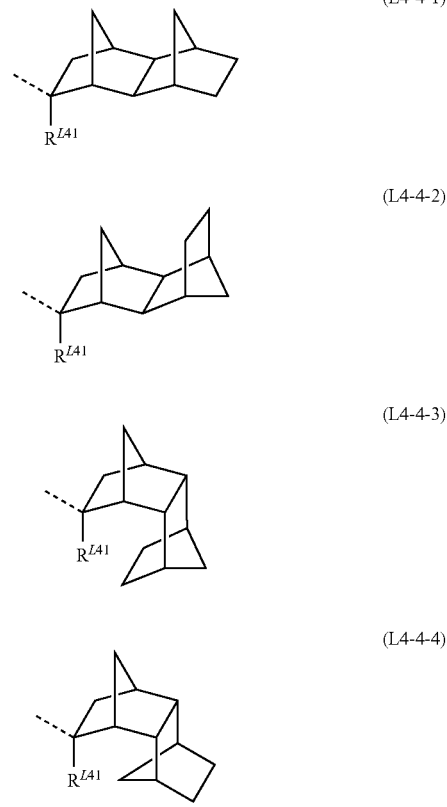

(L4-4-1)

(L4-4-2)

(L4-4-3)

(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

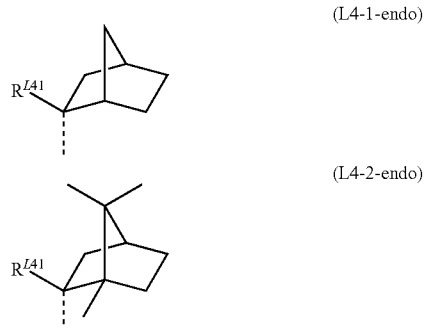

(L4-1-endo)

(L4-2-endo)

-continued

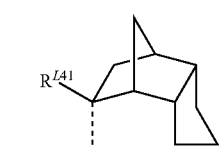 (L4-3-endo)

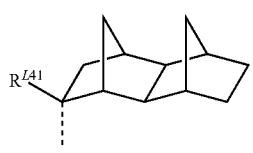 (L4-4-endo)

Note that $R^{L41}$ is as defined above.

Illustrative examples of the acid labile group of formula (L4) are given below.

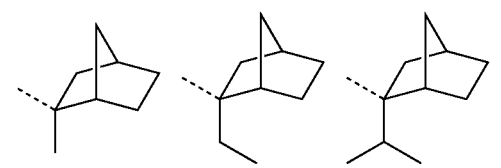

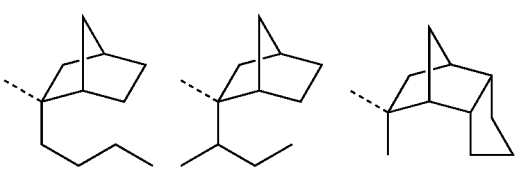

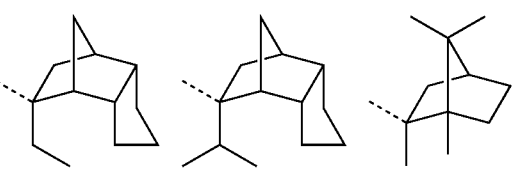

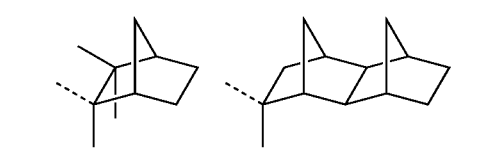

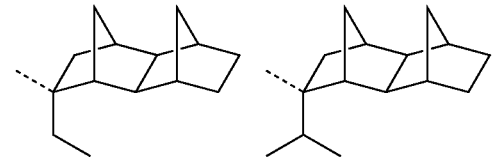

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^{5a}$, are as exemplified for $R^{L04}$ and the like.

Illustrative examples of the recurring units having formulae (2a) to (2j) are given below, but not limited thereto.

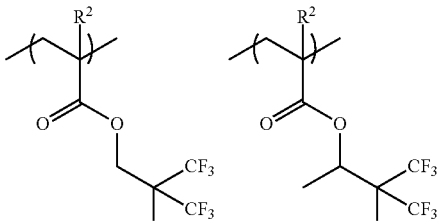

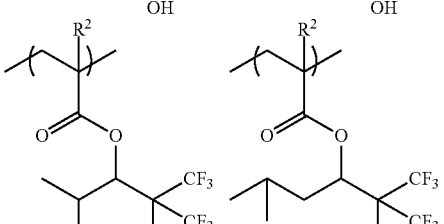

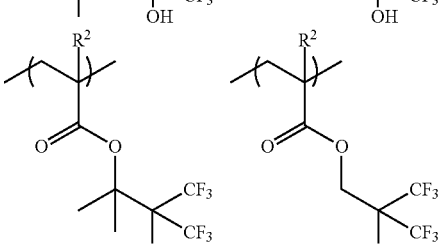

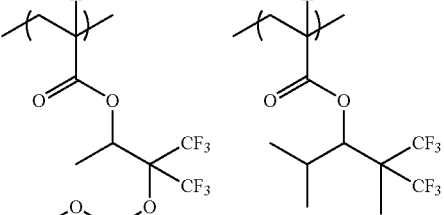

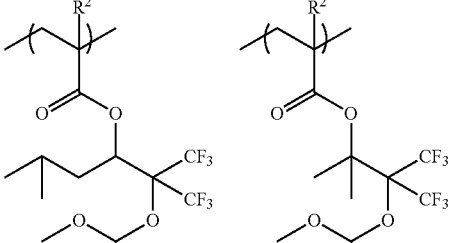

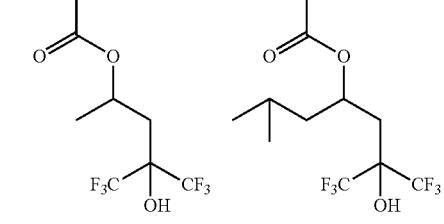

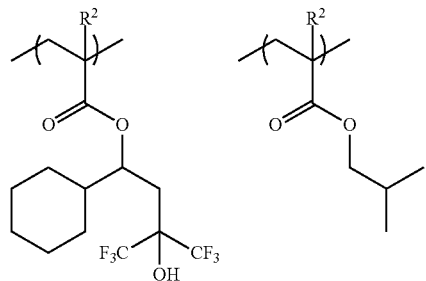
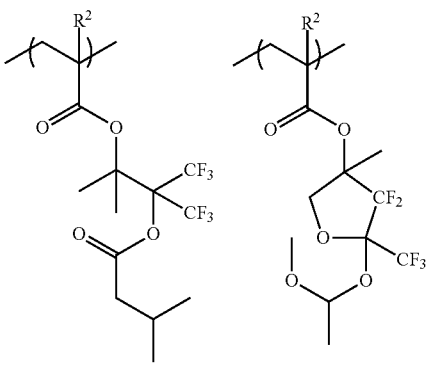
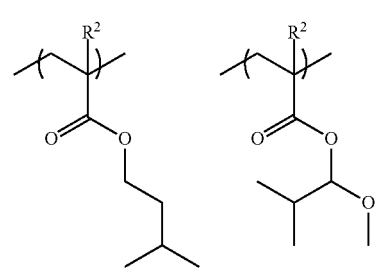
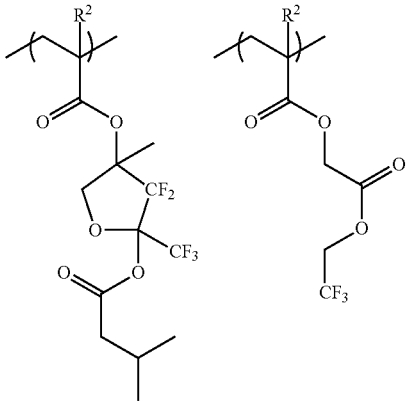
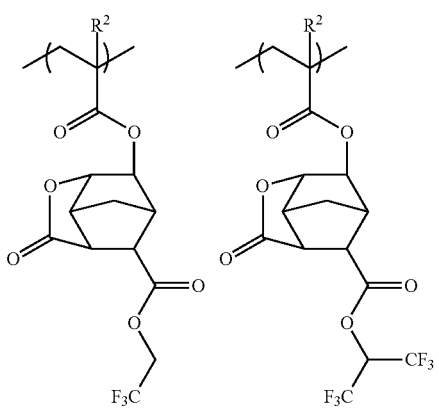
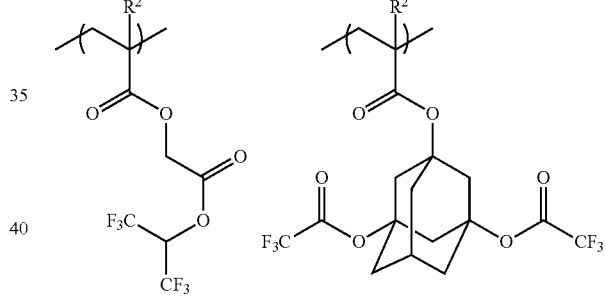
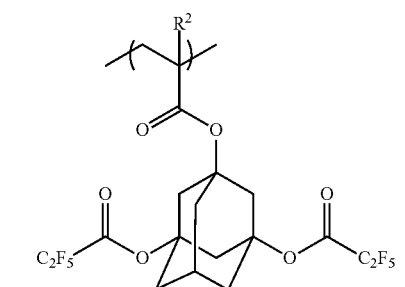
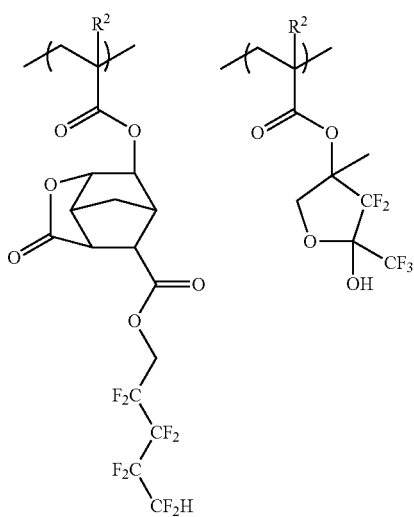
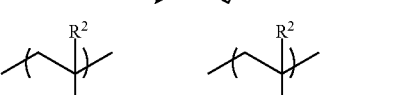
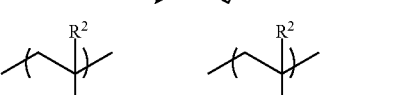
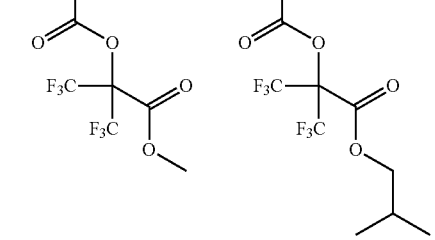

-continued

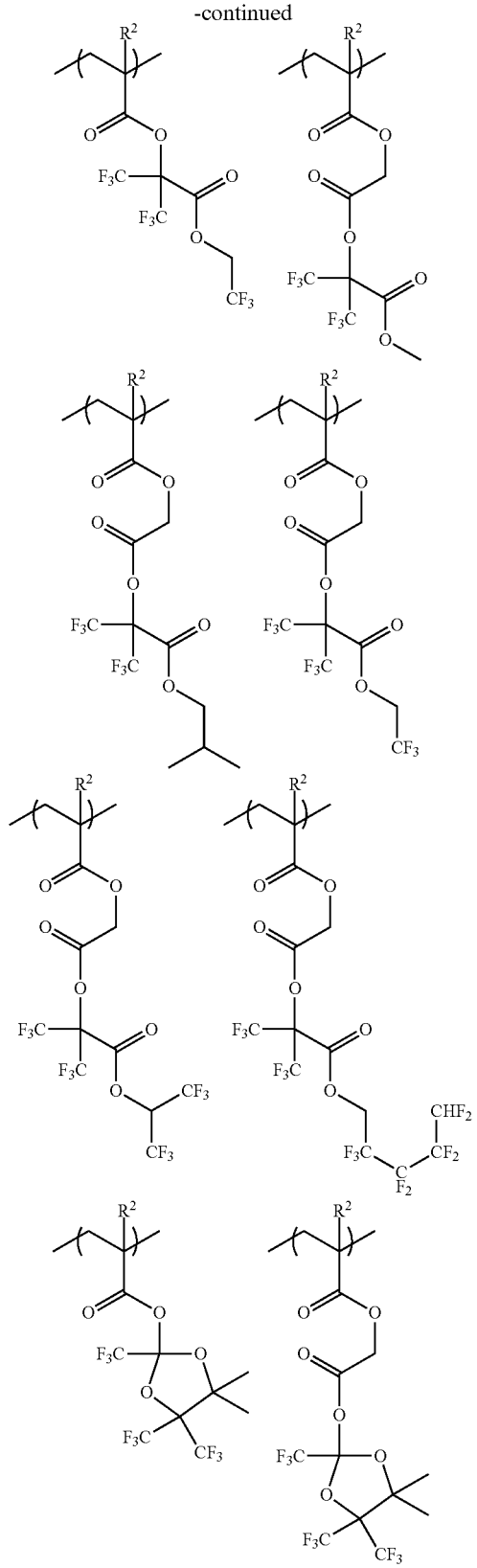

Note that R² is as defined above.

Although the polymer P1 comprising recurring units of formula (1a) in combination with recurring units of formulae (2a) to (2j) exerts satisfactory performance as the resist additive, recurring units of one or multiple types selected from formulae (3a) to (3e), (4a) to (4e), (5a) to (5c), and (6a) to (6c) may be further incorporated therein for the purposes of imparting further water repellency and water slip, and controlling alkaline solubility and developer affinity.

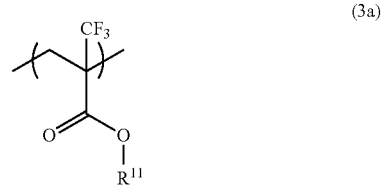
(3a)

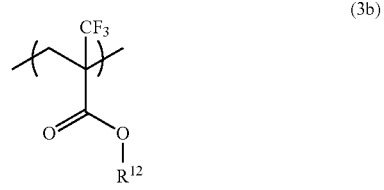
(3b)

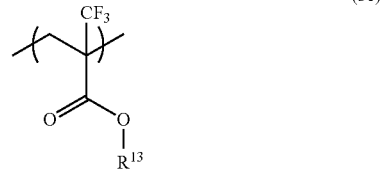
(3c)

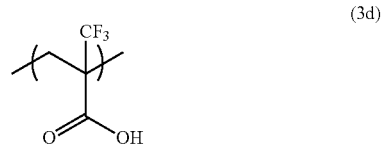
(3d)

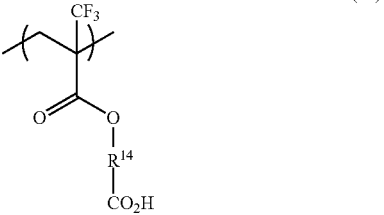
(3e)

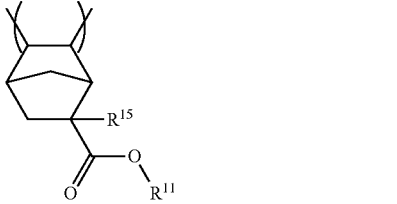
(4a)

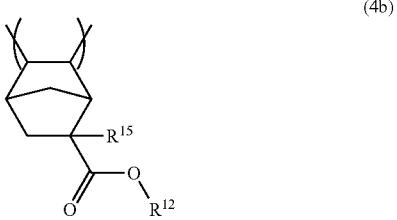
(4b)

(4c) 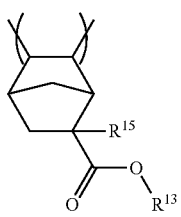

(4d) 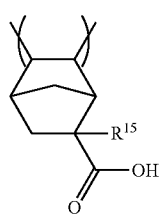

(4e) 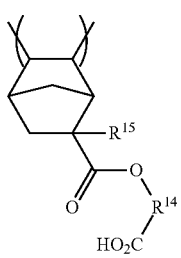

(5a) 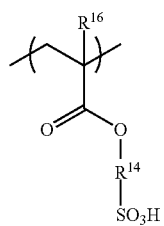

(5b) 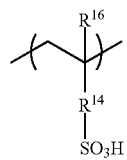

(5c) 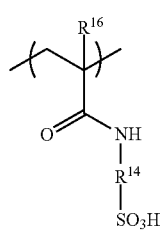

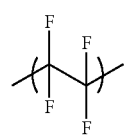

(6b) 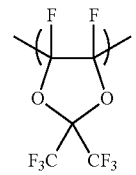

(6c) 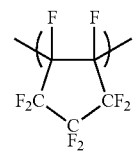

Herein $R^{11}$ is a $C_1$-$C_{15}$ monovalent hydrocarbon or fluorinated hydrocarbon group, $R^{12}$ is an adhesive group, $R^{13}$ is an acid labile group, $R^{14}$ is a single bond or divalent $C_1$-$C_{15}$ organic group, and $R^{15}$ and $R^{16}$ each are hydrogen, methyl or trifluoromethyl.

Examples of the $C_1$-$C_{15}$ monovalent hydrocarbon and fluorinated hydrocarbon groups represented by $R^{11}$ are the same as $R^{5a}$ and $R^{8a}$.

The adhesive group represented by $R^{12}$ may be selected from a variety of such groups, typically those groups shown below.

(5a) 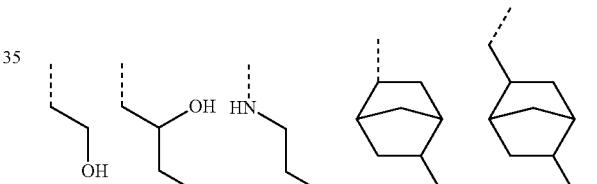

(5b) 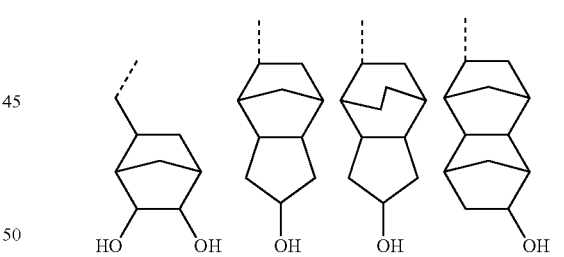

(5c) 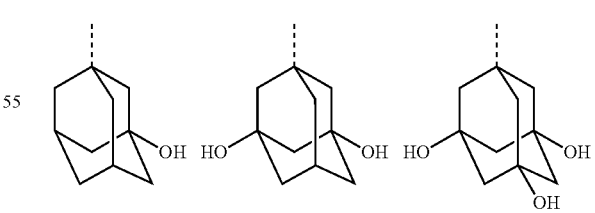

(6a) 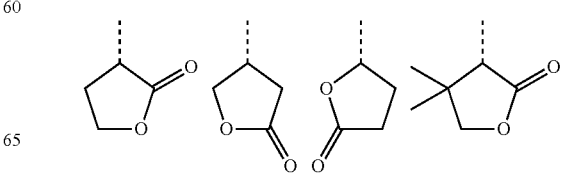

-continued

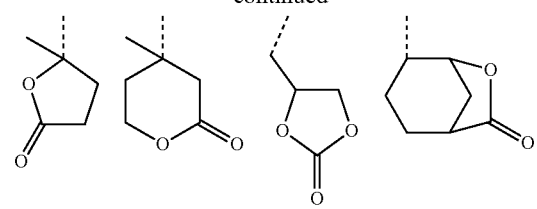
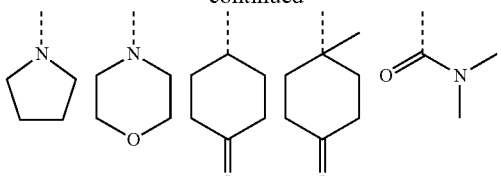

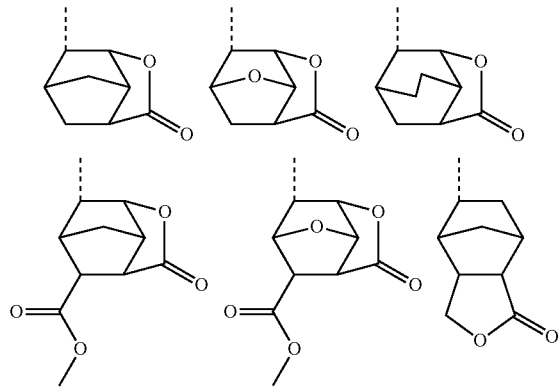
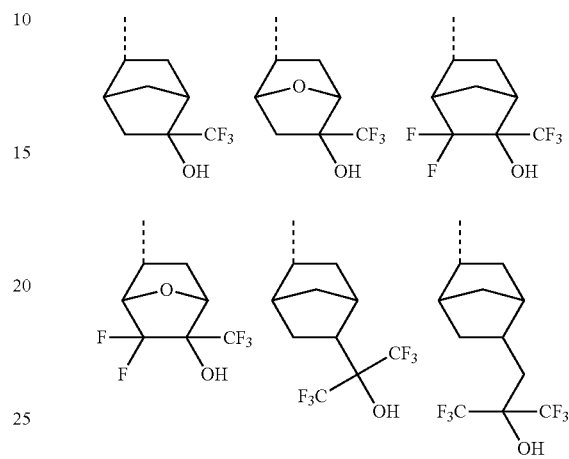

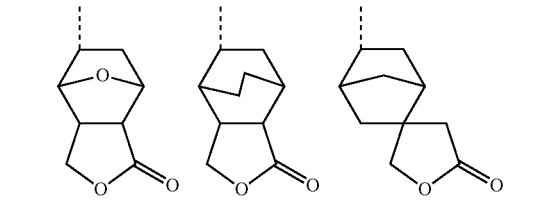

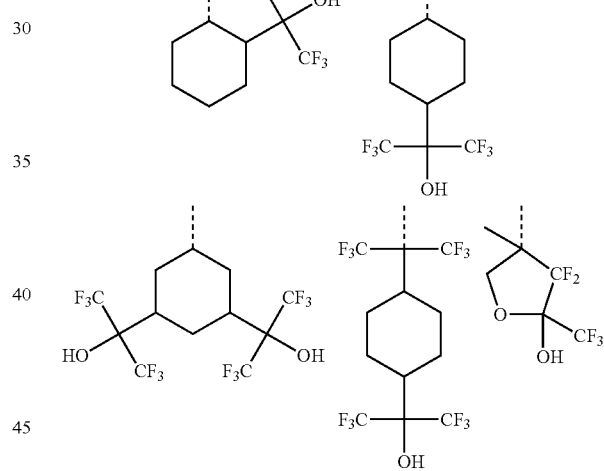

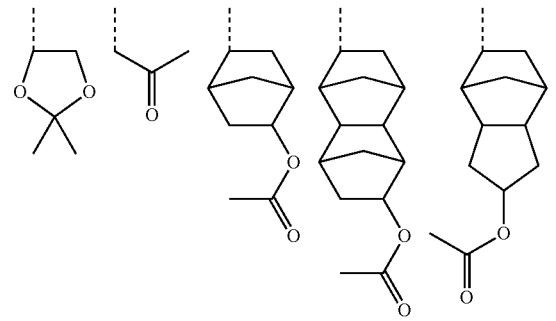

Herein, the broken line designates a valence bond.

The acid labile group represented by $R^{13}$ may be selected from those groups illustrated for R.

Suitable divalent $C_1$-$C_{15}$ organic groups represented by $R^{14}$ include the above-exemplified monovalent hydrocarbon groups, with one hydrogen atom eliminated (e.g., methylene and ethylene). Also useful are groups of the following formulae.

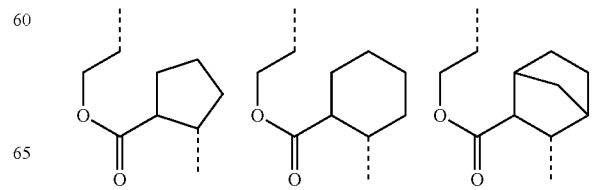

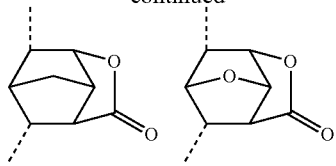

Herein, the broken line designates a valence bond.

Monomer Synthesis

The polymer P1 used as the additive in the resist composition is characterized by comprising essentially recurring units having formula (1a). Monomers from which these recurring units are derived may be synthesized by any well-known methods, for example, the method of JP Appln. 2010-218249.

Polymer Synthesis

The polymer P1 may be synthesized by general polymerization processes including radical polymerization using initiators such as 2,2'-azobisisobutyronitrile (AIBN), and ionic (or anionic) polymerization using alkyl lithium or the like. The polymerization may be carried out by its standard technique. Preferably the polymer P1 is synthesized by radical polymerization while the polymerization conditions may be determined in accordance with the type and amount of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis (isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 6 mol % based on the total moles of monomers to be polymerized.

During the synthesis of polymer P1, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

Polymer P1 may be synthesized by combining suitable monomers selected from polymerizable monomers corresponding to recurring units of formulae (1a), (2a) to (2j), (3a) to (3e), (4a) to (4e), (5a) to (5c), and (6a) to (6c), adding an initiator and chain transfer agent to the monomer mixture, and effecting polymerization.

In polymer P1 wherein U1 stands for a total molar number of a monomer corresponding to units of formula (1a), U2 stands for a total molar number of monomers corresponding to units of formulae (2a) to (2j), and U3 stands for a total molar number of monomers corresponding to units of formulae (3a) to (3e), (4a) to (4e), (5a) to (5c), and (6a) to (6c), with the proviso that U1+U2+U3=U (=100 mol %), values of U1, U2, and U3 are preferably determined so as to meet:

$0 \leq U1/U < 1$, more preferably $0.1 \leq U1/U \leq 0.8$, even more preferably $0.1 \leq U1/U \leq 0.7$, $0 \leq U2/U < 1$, more preferably $0.2 \leq U2/U \leq 0.9$, even more preferably $0.3 \leq U2/U \leq 0.9$, and $0 \leq U3/U < 1$, more preferably $0 \leq U3/U \leq 0.4$, even more preferably $0 \leq U3/U \leq 0.2$.

For polymerization, a solvent may be used if desired. Preferred is the solvent which does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Desirably polymer P1 has a weight average molecular weight (Mw) of 1,000 to 500,000, and especially 2,000 to 30,000, as determined versus polystyrene standards by gel permeation chromatography (GPC) using tetrahydrofuran as solvent. This is because a polymer with too low a Mw may readily dissolve in water whereas too high a Mw may lead to a decline of alkali solubility and cause defect formation during spin coating.

In polymer P1, $R^1$ in formula (1a), $R^{5a}$ in formulae (2a), (2b) and (2f), and $R^{13}$ in formulae (3c) and (4c) may be introduced by post-protection reaction. Specifically, a monomer wherein $R^1$, $R^{5a}$ or $R^{13}$ is hydrogen is previously polymerized to synthesize a precursor polymer. Post-protection reaction is effected on the precursor polymer for substituting groups $R^1$, $R^{5a}$ or $R^{13}$ for some or all hydroxyl groups on the precursor polymer as shown below.

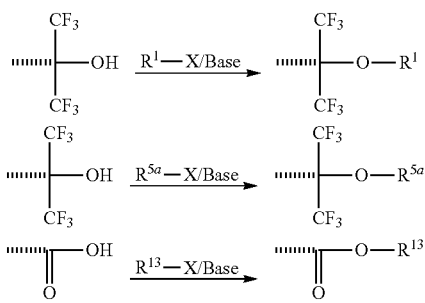

Herein $R^1$, $R^{5a}$, and $R^{13}$ are as defined above, and X is chlorine, bromine or iodine.

The desired polymer is obtainable via post-protection reaction by reacting the precursor polymer with a base in an amount of 1 to 2 equivalents relative to the desired degree of substitution of hydroxyl groups, and then with R¹—X, R⁵ᵃ—X or R¹³—X in an amount of 1 to 2 equivalents relative to the base.

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyl lithium, lithium diisopropylamide, triethylamine, and pyridine.

Resist Composition

Briefly stated, the resist composition is defined as comprising (A) polymer P1, in combination with (B) a base resin, i.e., polymer which becomes soluble in an alkaline developer under the action of an acid as a base resin. Since polymer P1 contains a plurality of fluorine atoms, the overall polymer functions as a surfactant. When a resist film is formed by spin coating the composition, polymer P1 segregates in a sub-surface layer of the resist film. The sub-surface layer improves the water repellency and water slip on the resist surface, and prevents any water-soluble components in the resist composition from being leached out.

Polymer P1 is added as an additive to the resist composition preferably in an amount (total amount if plural polymers P1 are used) of 0.1 to 50 parts, more preferably 0.5 to 10 parts by weight per 100 parts by weight of the base resin (B). At least 0.1 phr of polymer P1 is effective in improving the receding contact angle with water of photoresist film surface, whereas up to 50 phr of polymer P1 forms a photoresist film having a low dissolution rate in alkaline developer and capable of maintaining the height of a fine pattern formed therein.

Base Resin

The resist composition contains (B) a polymer having a lactone ring-derived structure, hydroxyl-containing structure and/or maleic anhydride-derived structure and adapted to become soluble in an alkaline developer under the action of an acid as a base resin. Examples of the base polymer (B) include, but are not limited to, (meth)acrylate polymers, (α-trifluoromethyl)acrylate-maleic anhydride copolymers, cycloolefin-maleic anhydride copolymers, polynorbornene, polymers resulting from ring-opening metathesis polymerization (ROMP) of cycloolefins, hydrogenated cycloolefin ROMP polymers, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins. Examples of these polymers are described in U.S. Pat. No. 7,537,880 (JP-A 2008-111103, paragraph [0072] to [0120]). The polymer serving as base resin (B) is not limited to one type and a mixture of two or more polymers may be added. The use of plural polymers allows for easy adjustment of resist properties.

The base polymer (B) may further comprise recurring units of at least one type selected from the general formulae (2A) to (2D).

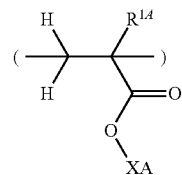

(2A)

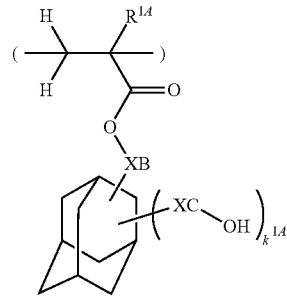

(2B)

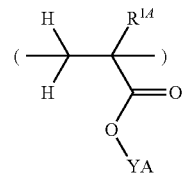

(2C)

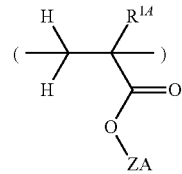

(2D)

Herein $R^{14}$ is hydrogen, fluorine, methyl or trifluoromethyl, XA is an acid labile group, XB and XC are each independently a single bond or a straight or branched $C_1$-$C_4$ divalent hydrocarbon group (typically alkylene), YA is a substituent group having a lactone structure, ZA is hydrogen, or a $C_1$-$C_{15}$ fluoroalkyl group or $C_1$-$C_{15}$ fluoroalcohol-containing substituent group, and $k^{14}$ is an integer of 1 to 3.

A polymer comprising recurring units of formula (2A) is decomposed under the action of an acid to generate carboxylic acid so that the polymer may become alkali soluble. While the acid labile group XA may be selected from a variety of such groups, it may be as exemplified above for $R^{5a}$ in formulae (2a) to (2j).

Examples of recurring units of formula (2A) are given below, but not limited thereto.

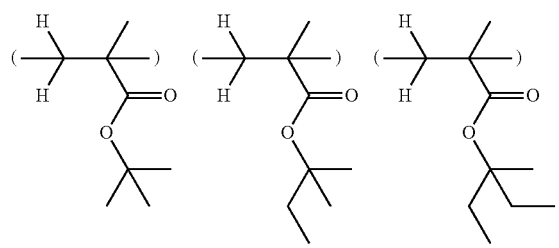

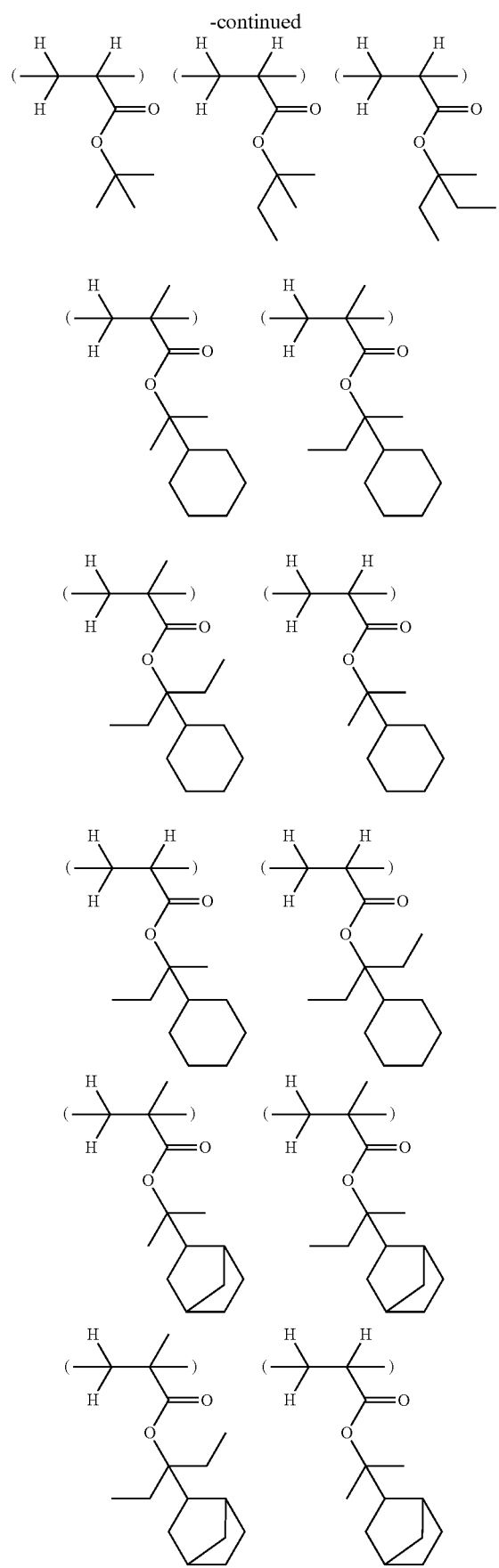
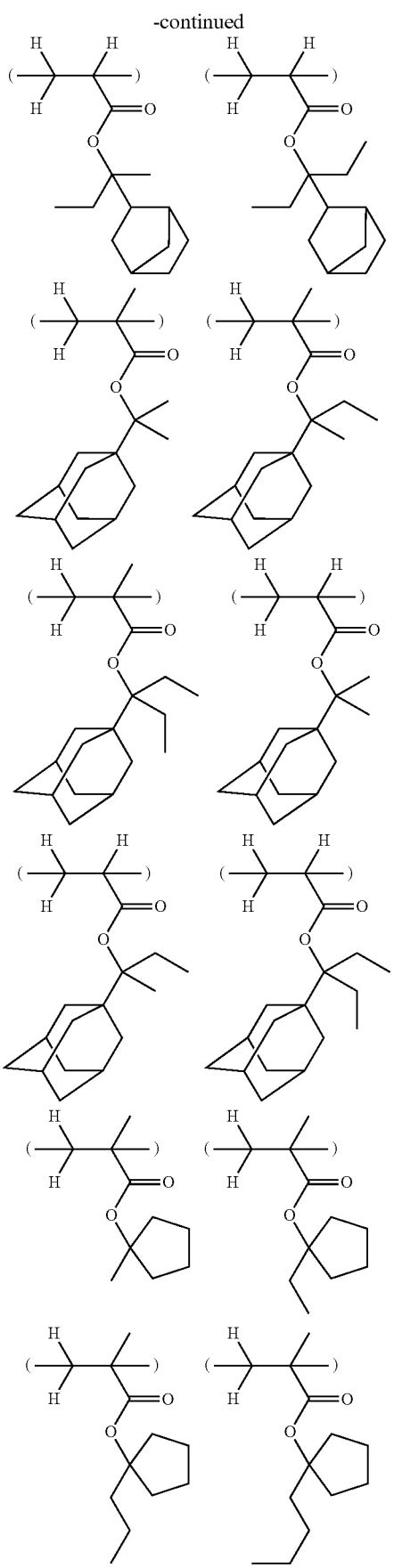

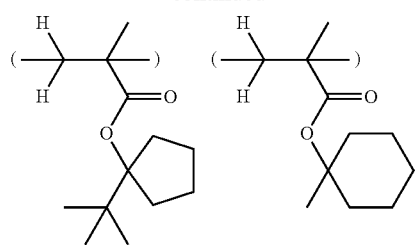
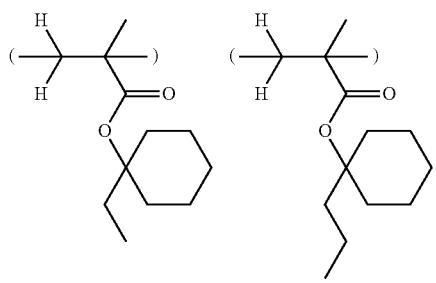
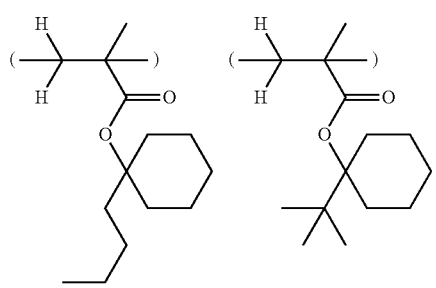
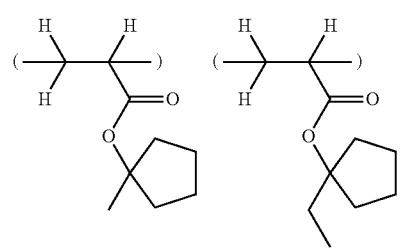
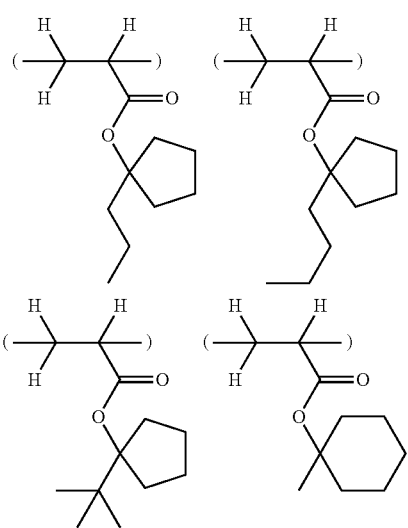
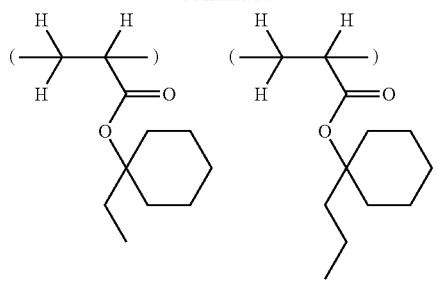
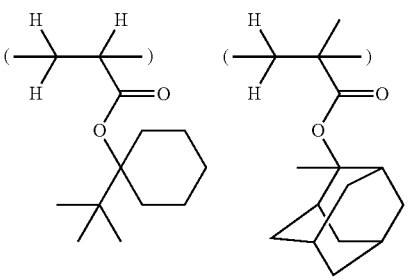
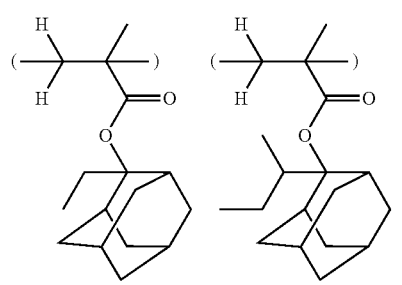
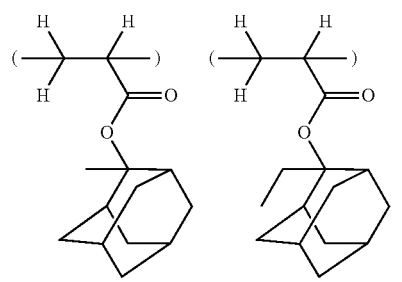
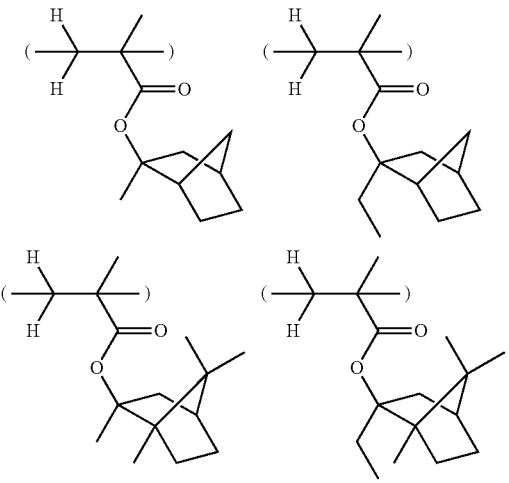

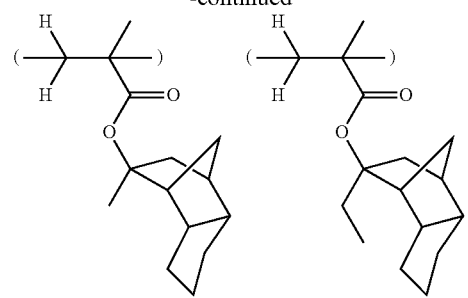
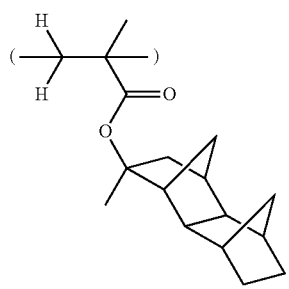
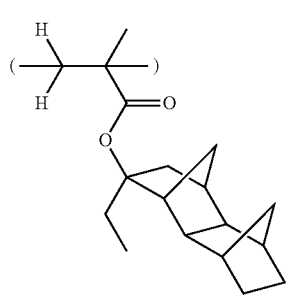
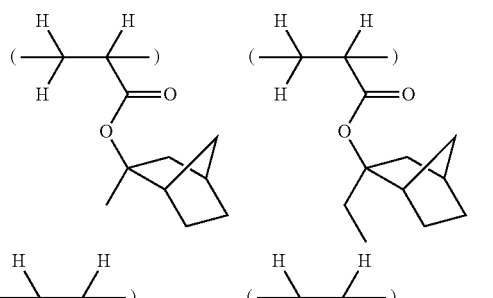
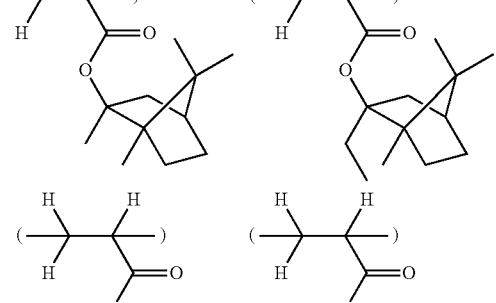
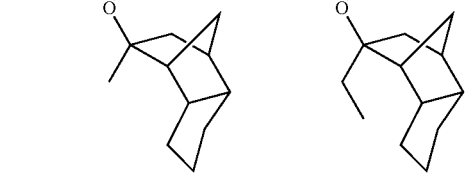
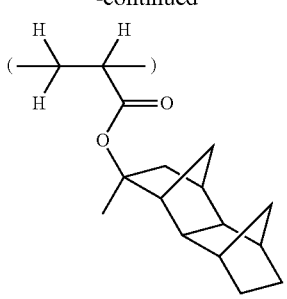
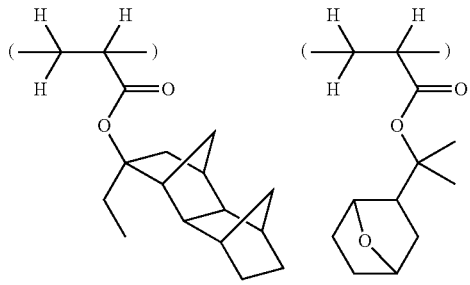
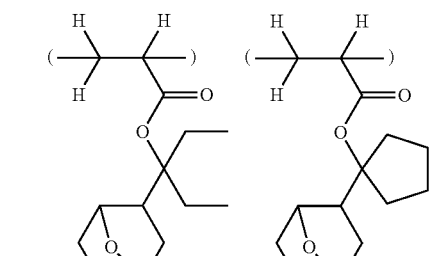
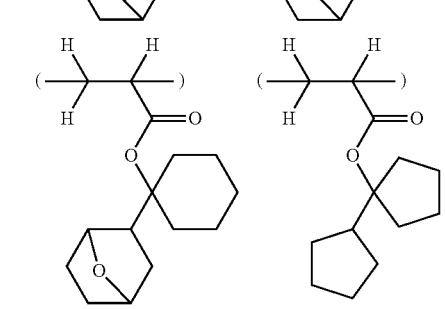
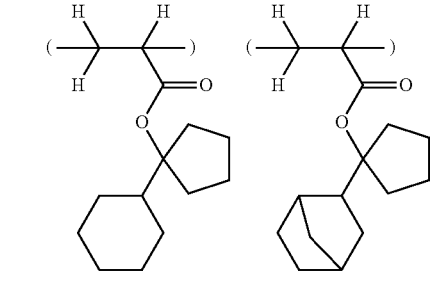
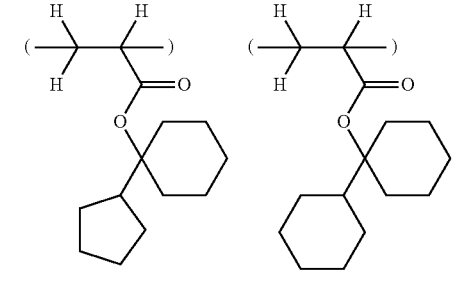

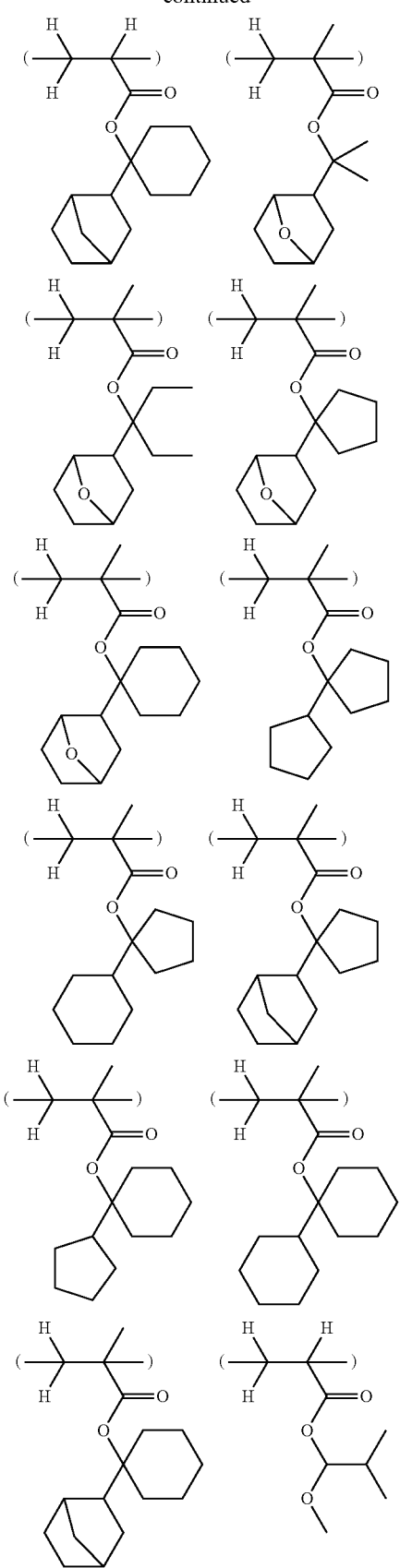
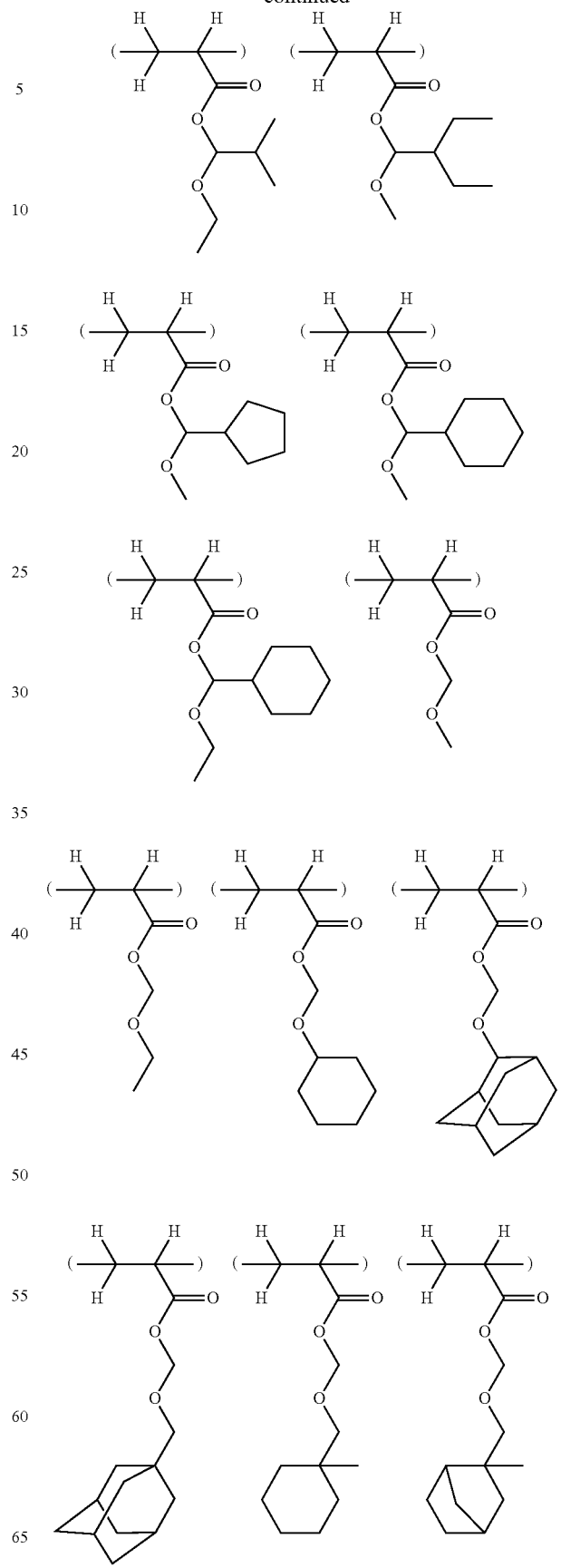

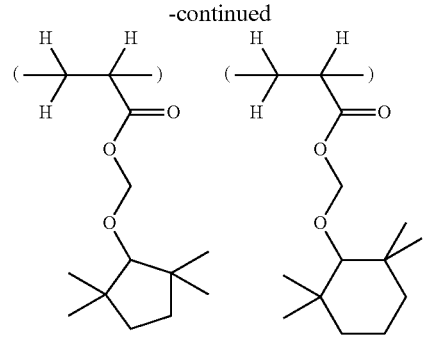
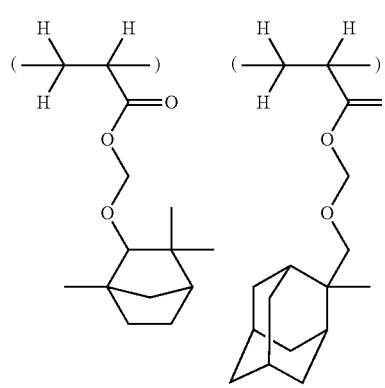
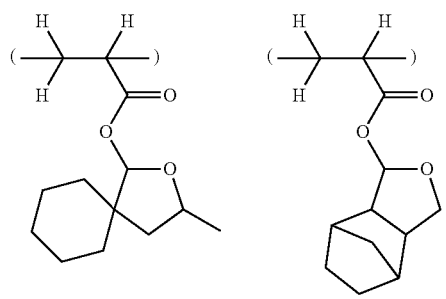
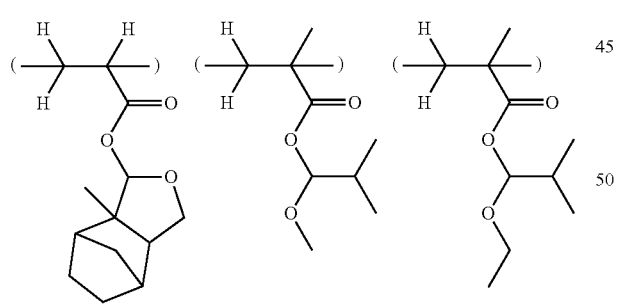
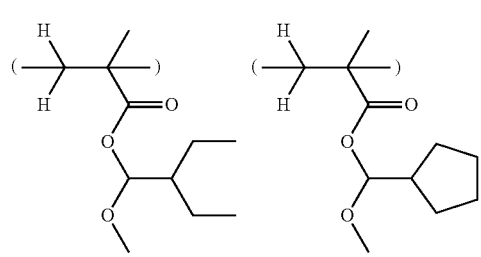
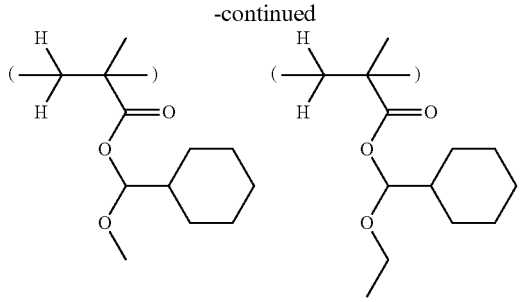
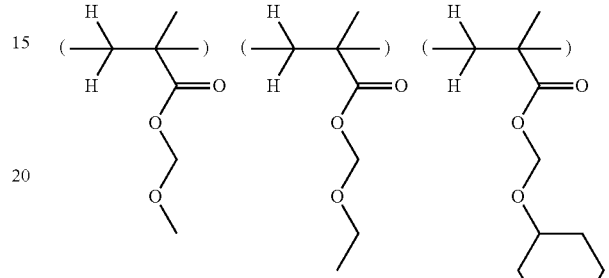
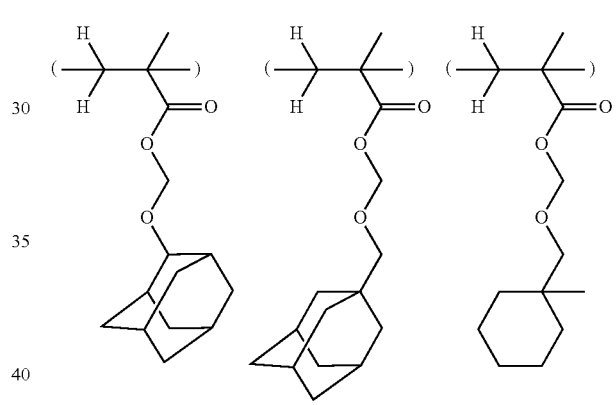
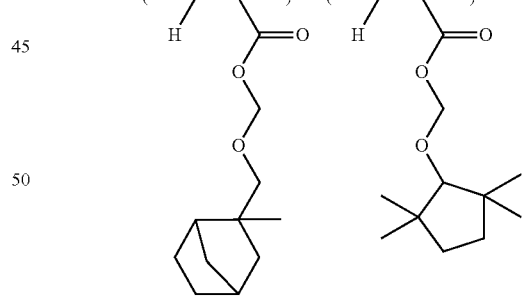
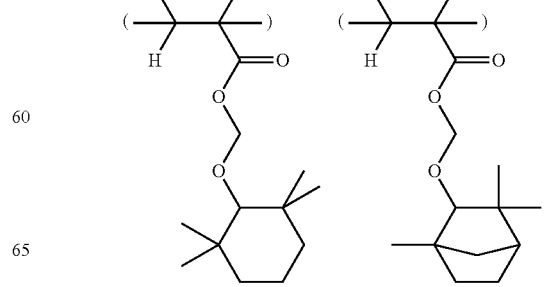

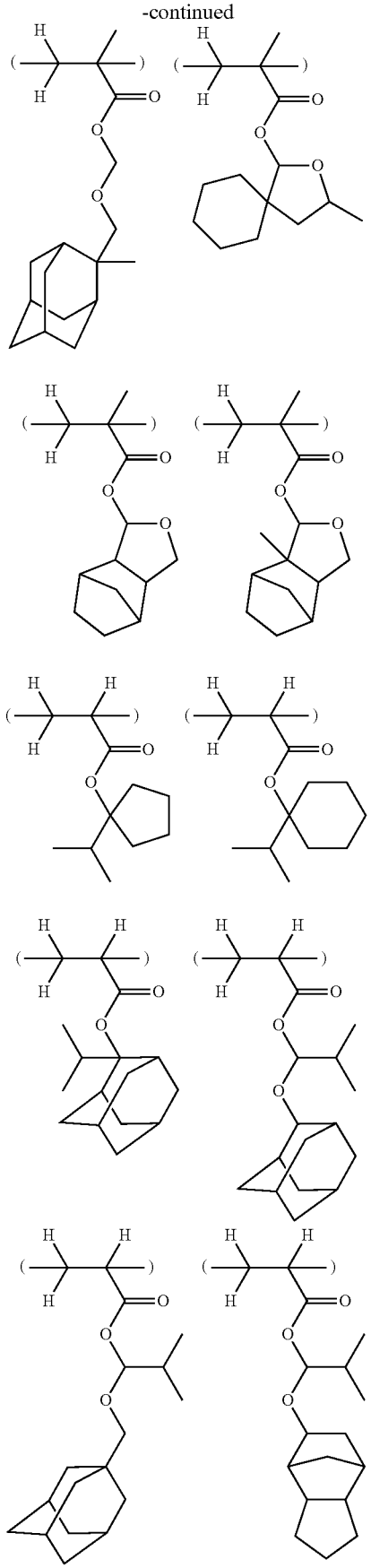
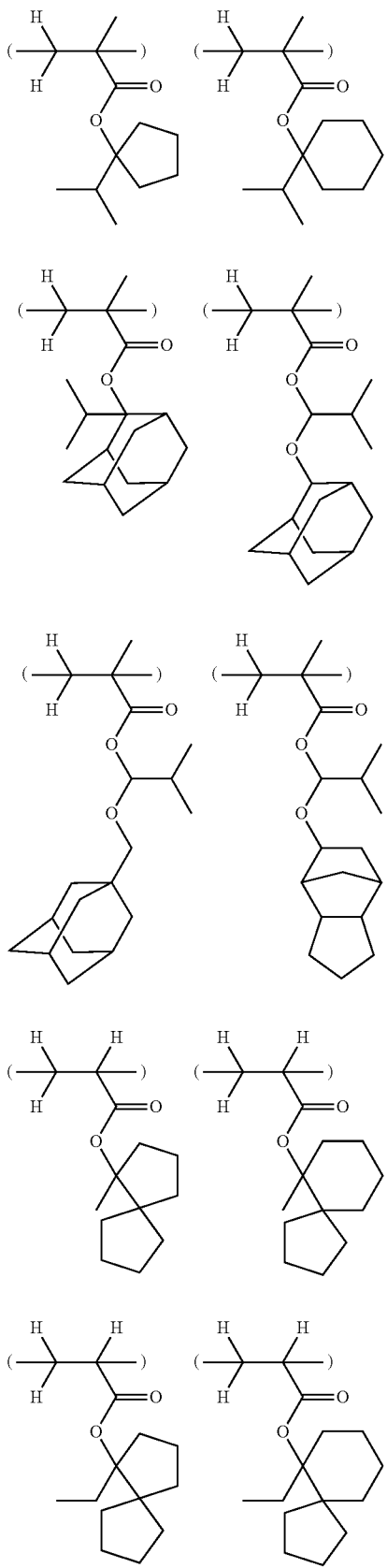

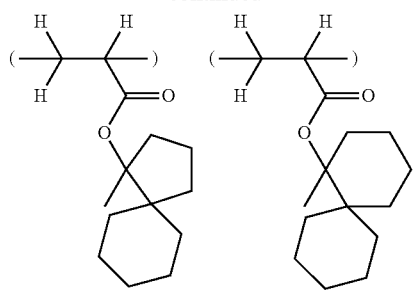
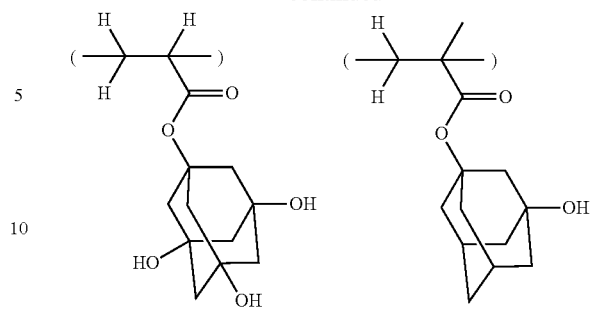
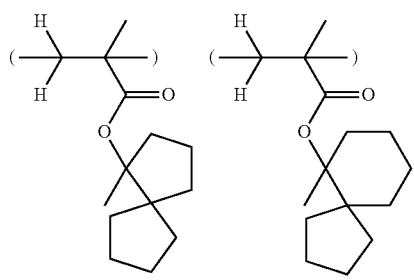
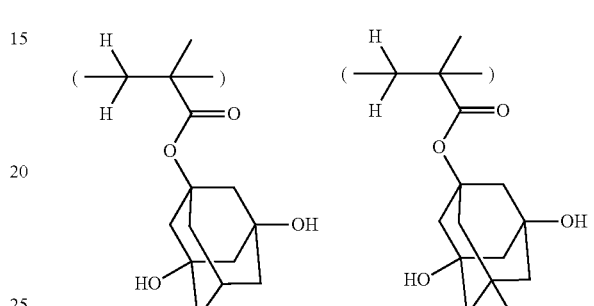
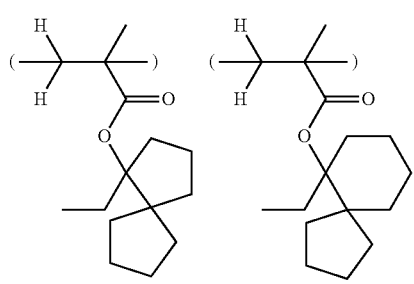
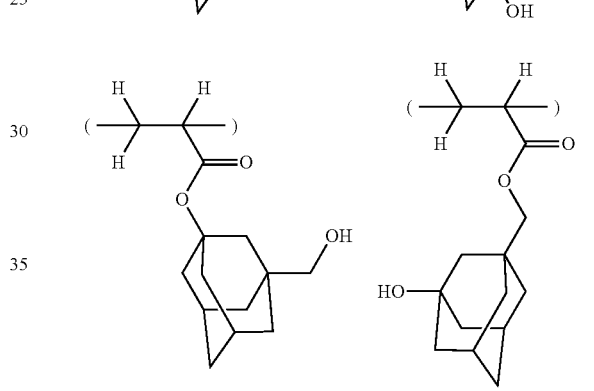
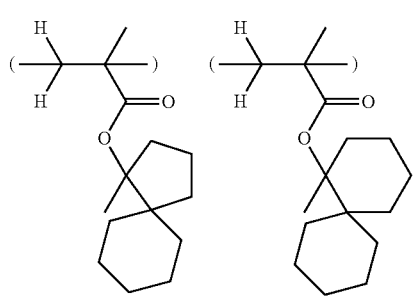
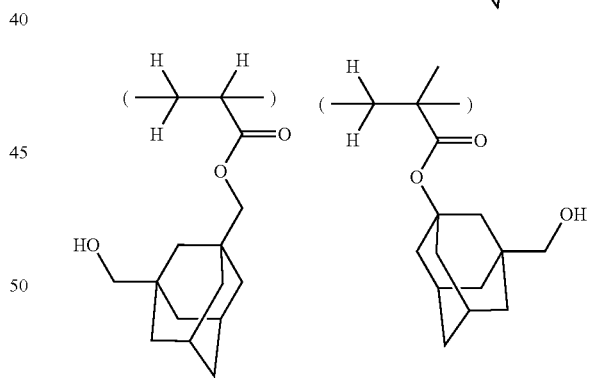
Examples of recurring units of formula (2B) are given below, but not limited thereto.
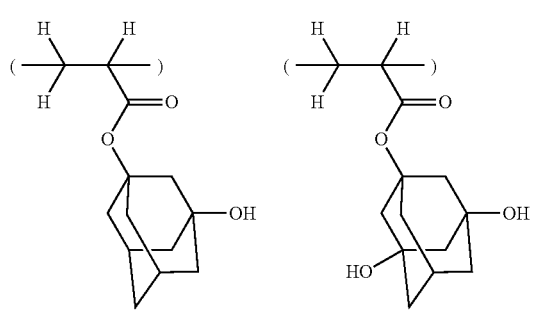
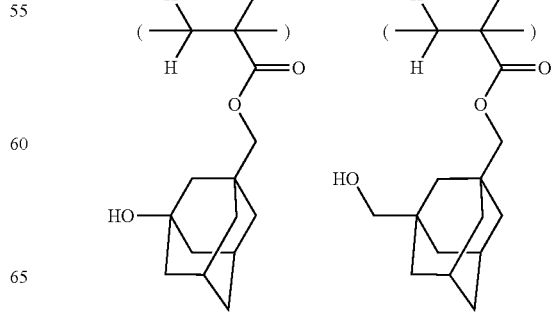

65
-continued
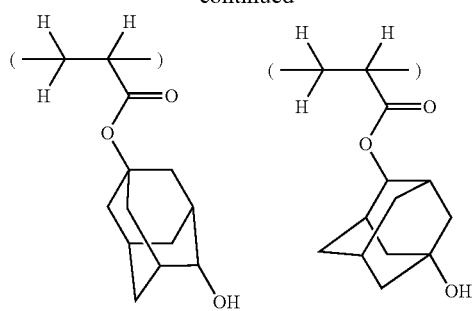
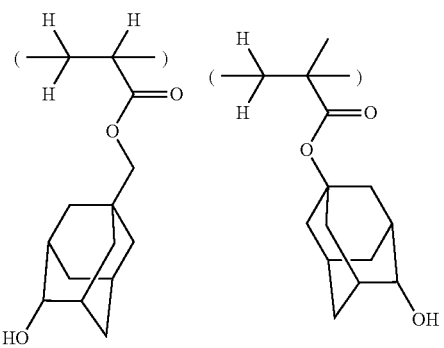
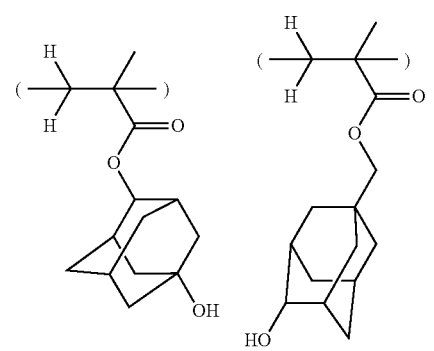
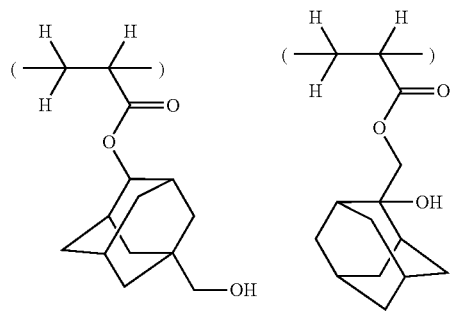
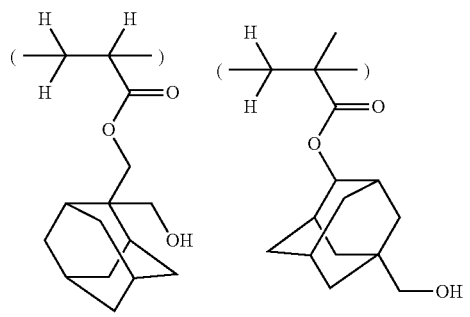
66
-continued
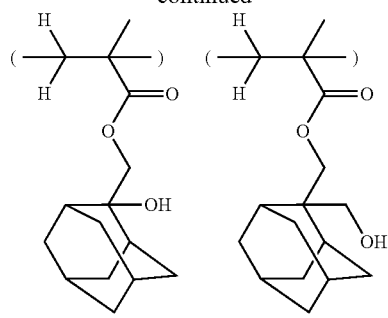
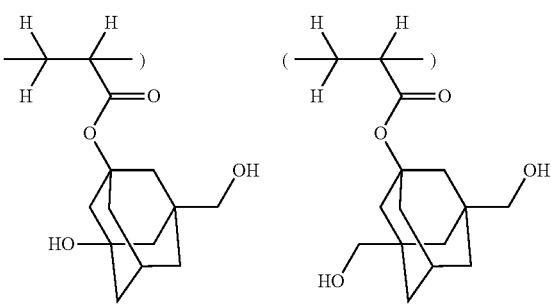
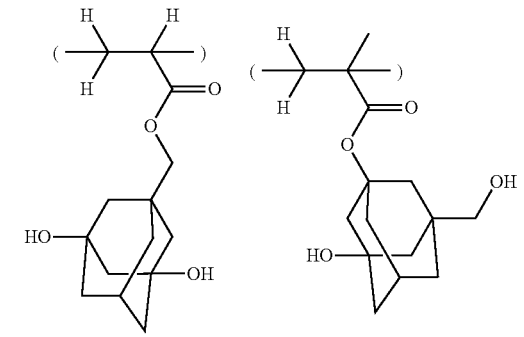
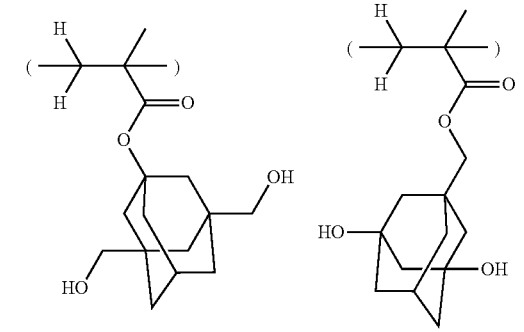
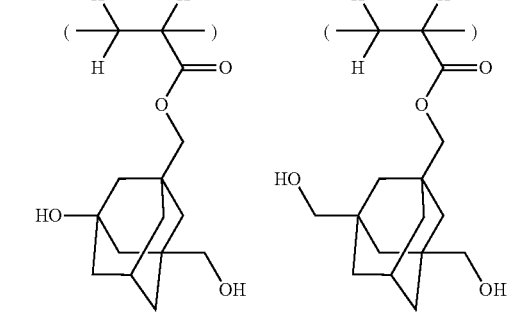

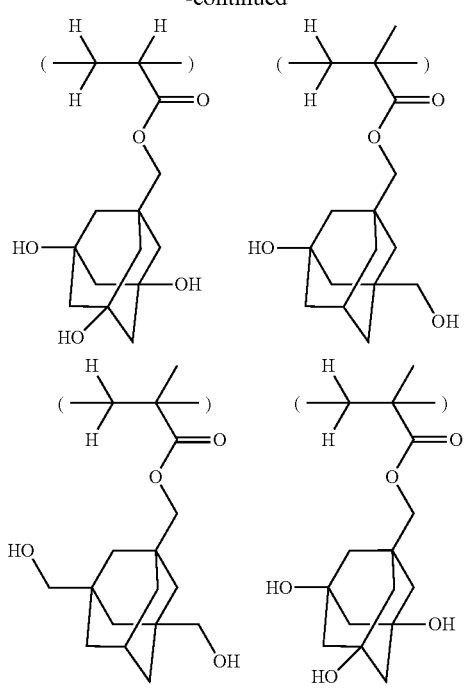
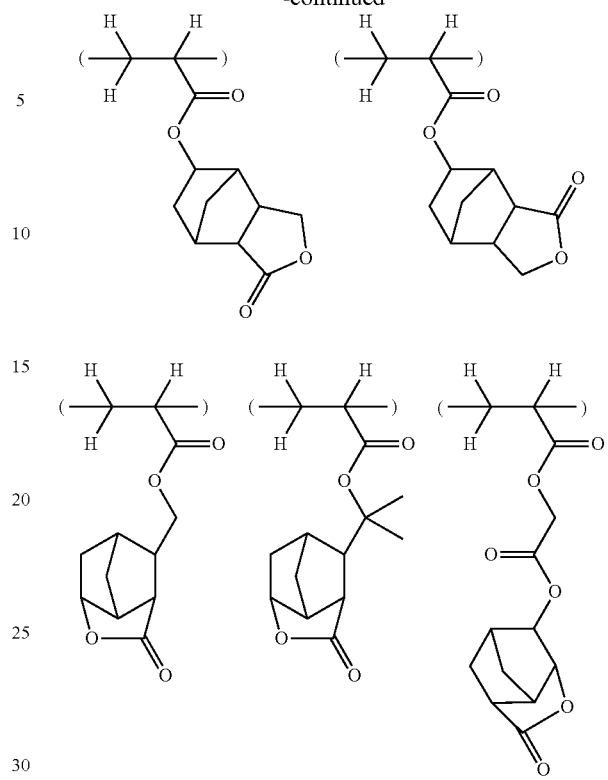
Examples of recurring units of formula (2C) are given below, but not limited thereto.
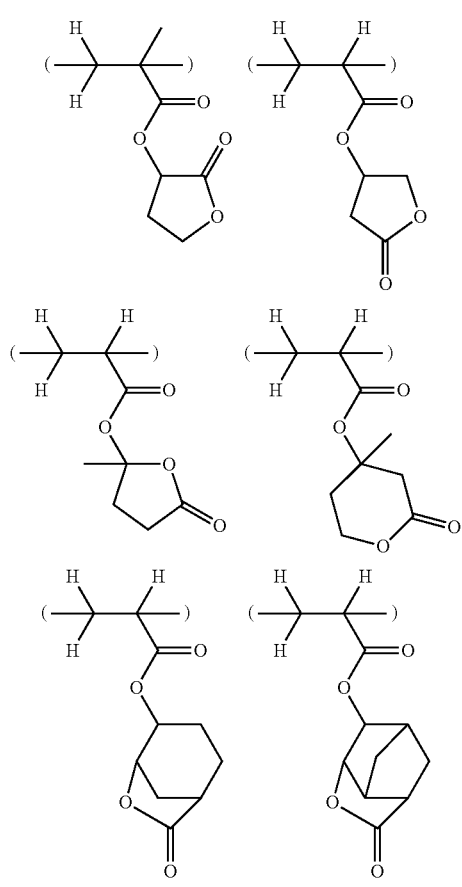
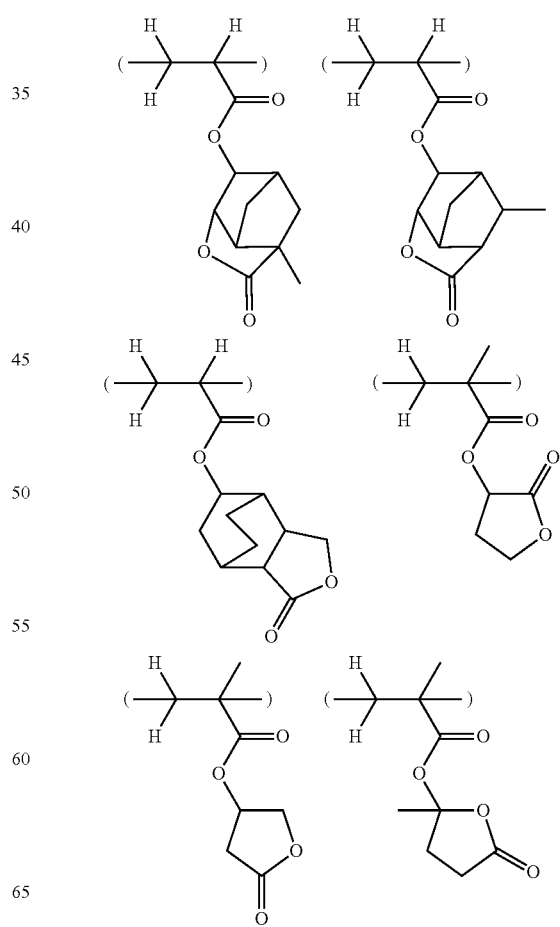

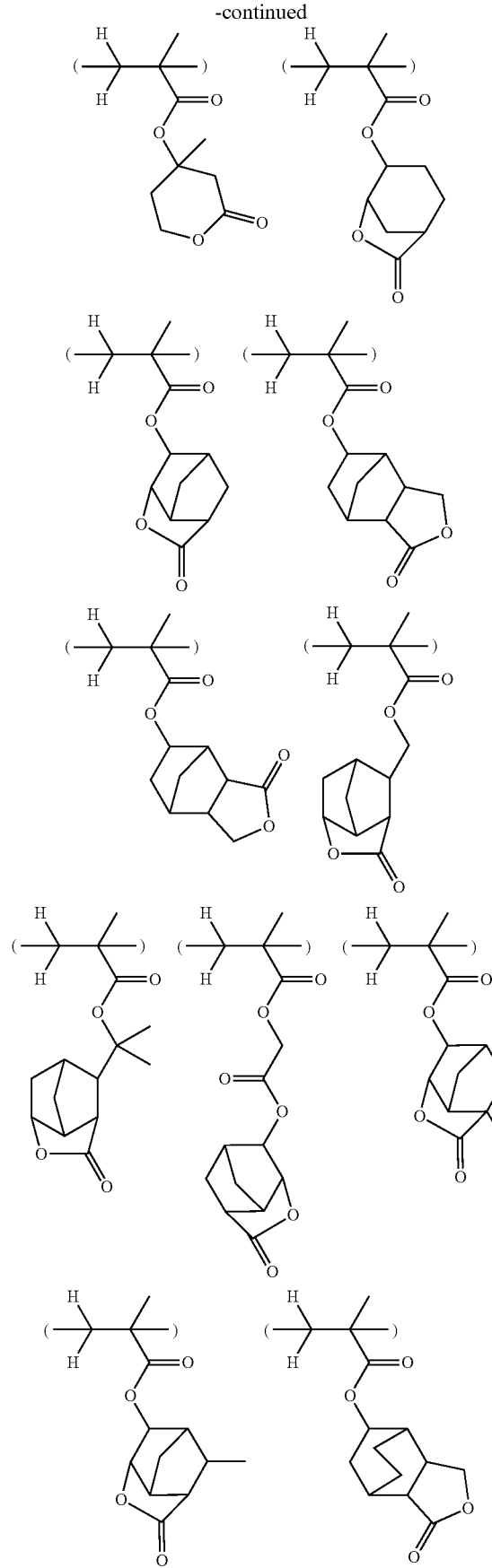
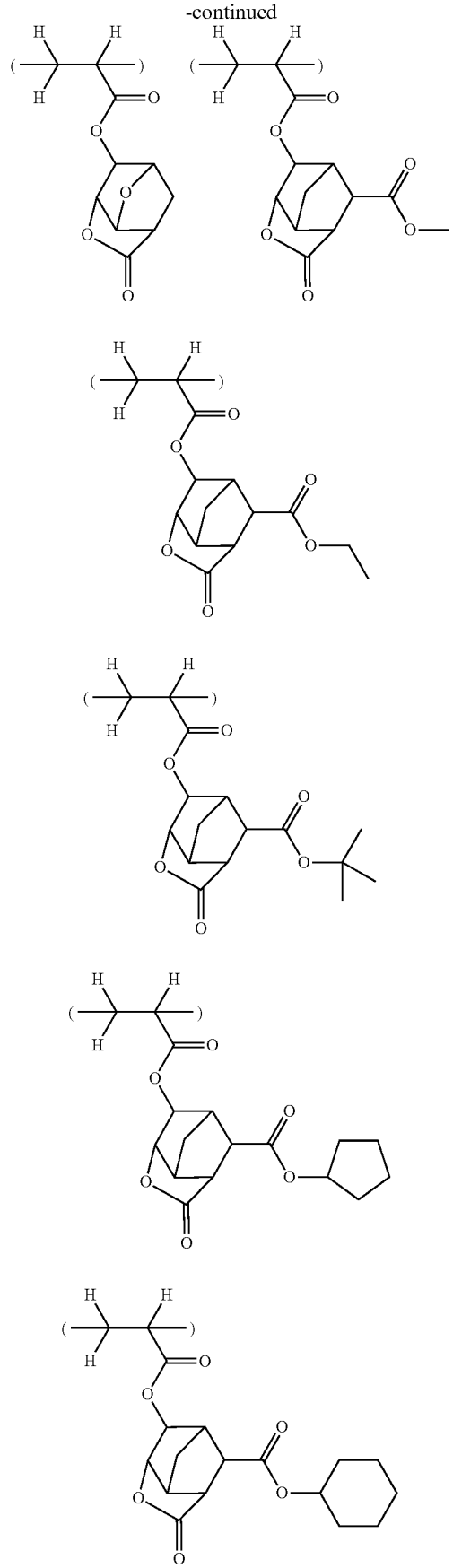

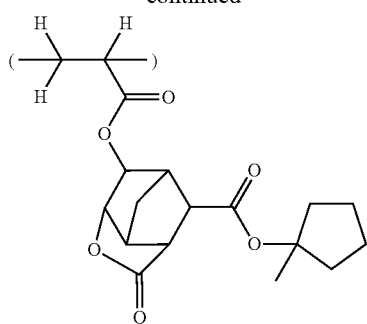
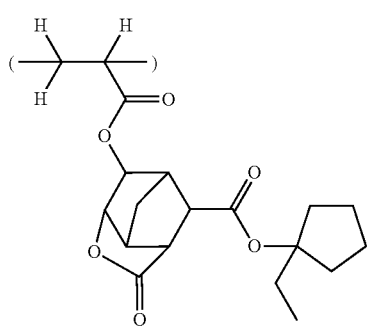
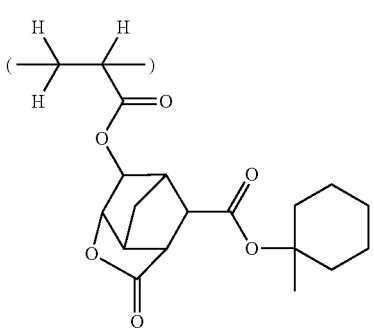
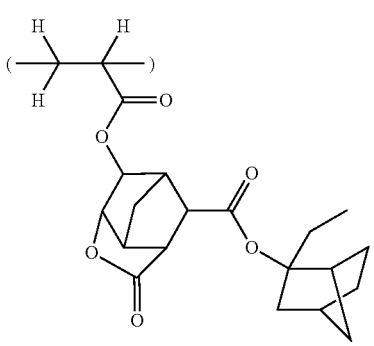
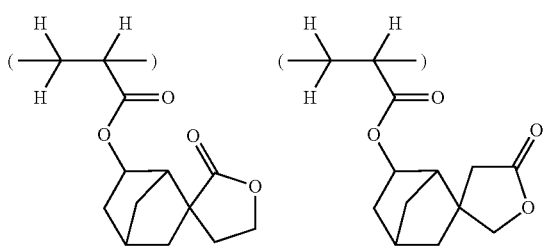
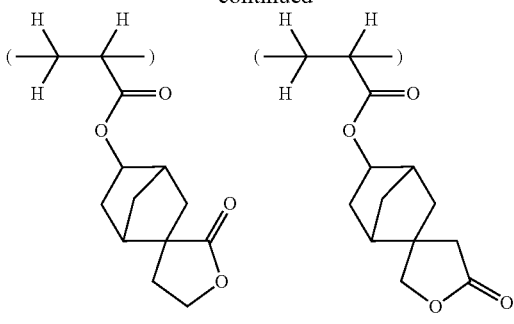
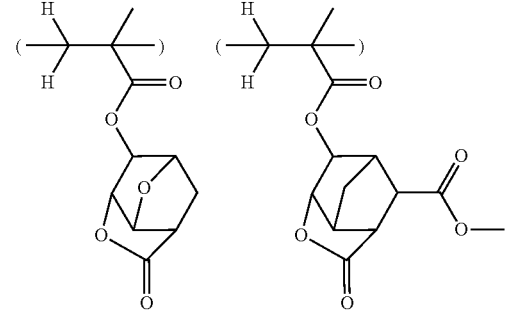
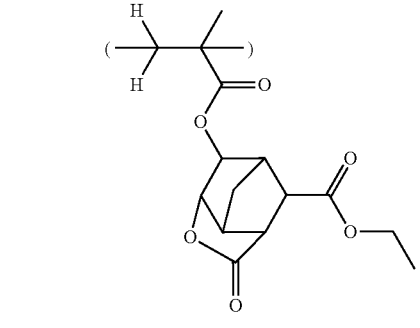
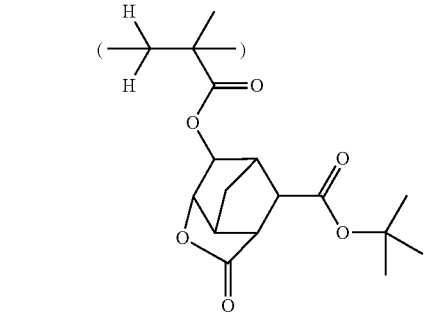
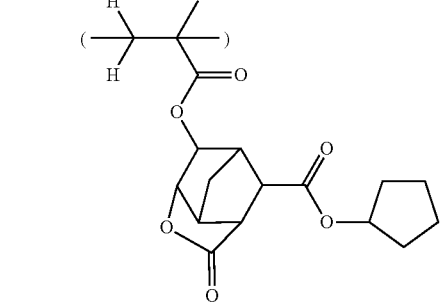

73
-continued
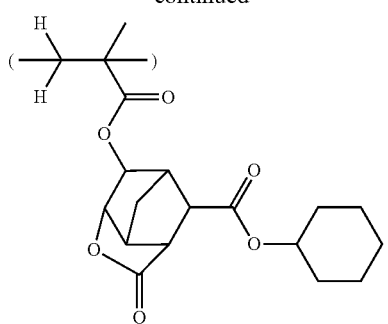
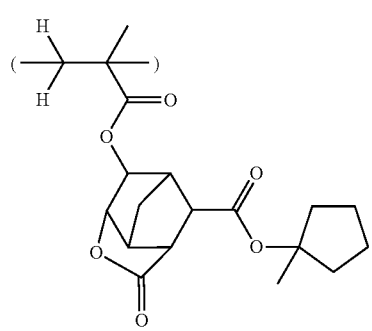
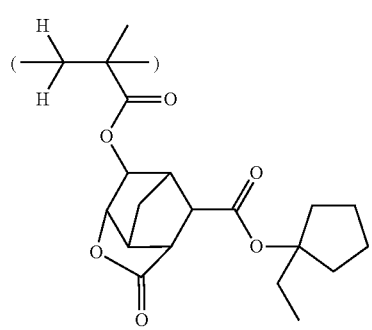
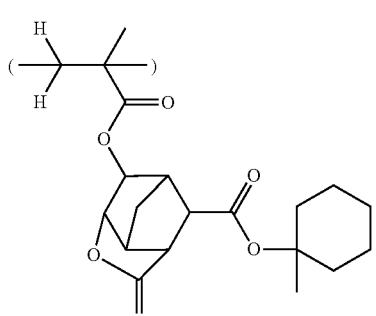
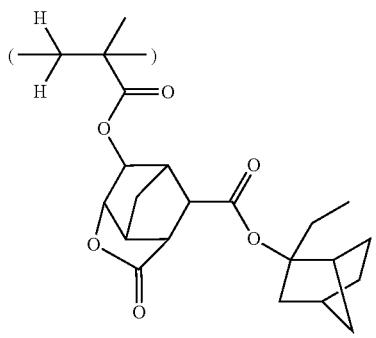
74
-continued
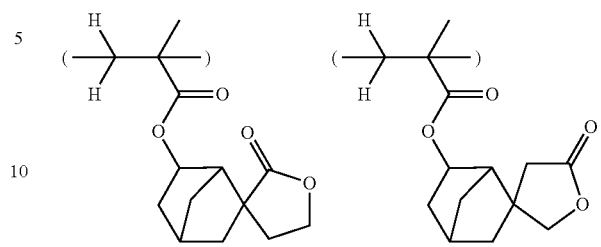
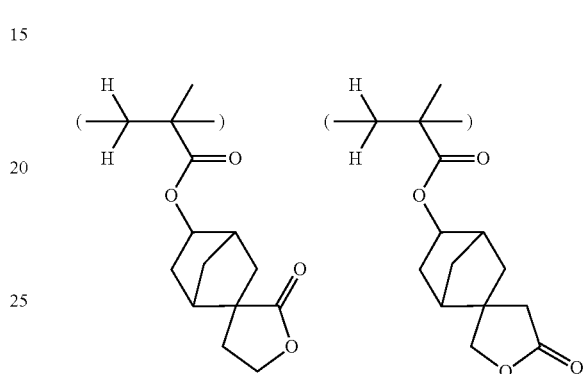
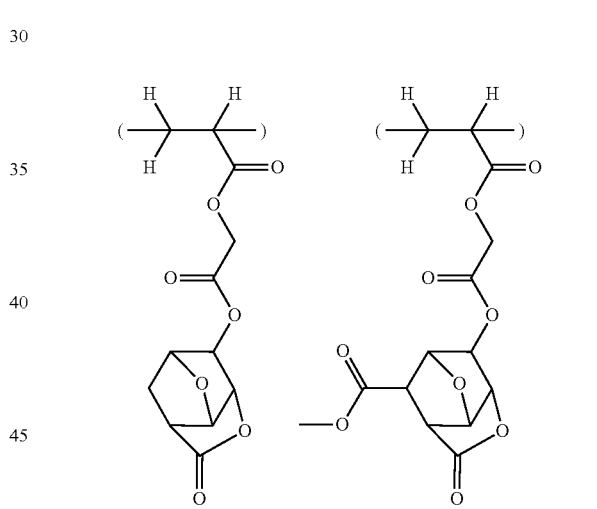
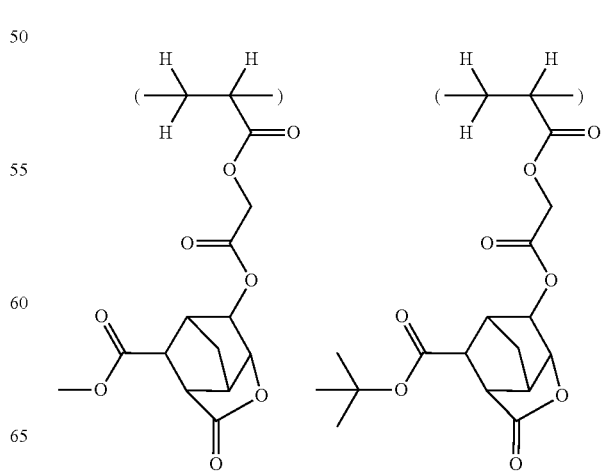

75
-continued
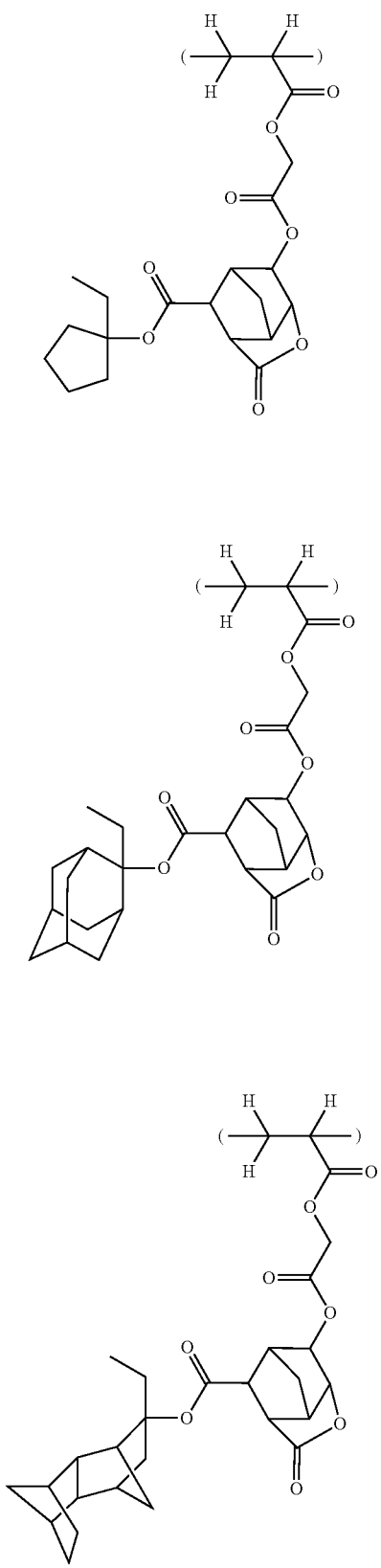
76
-continued
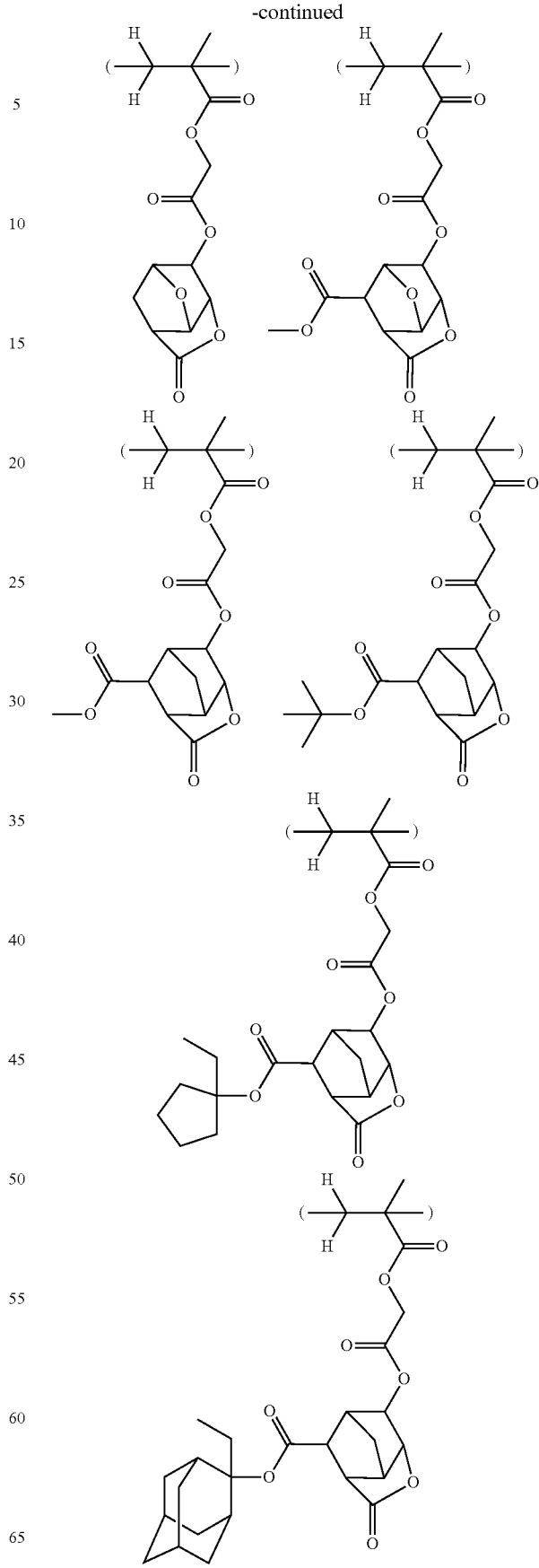

-continued
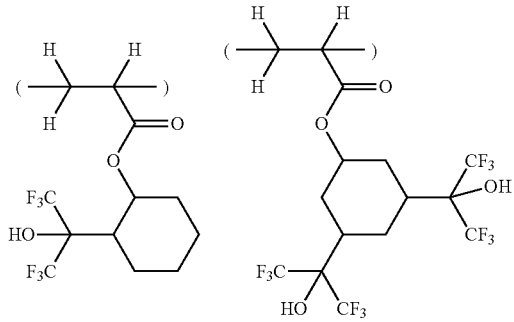
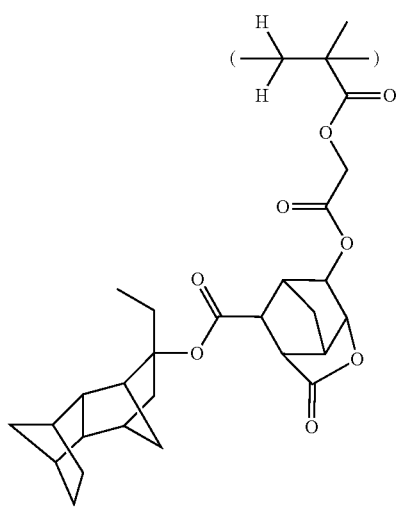
Examples of recurring units of formula (2D) are given below, but not limited thereto.
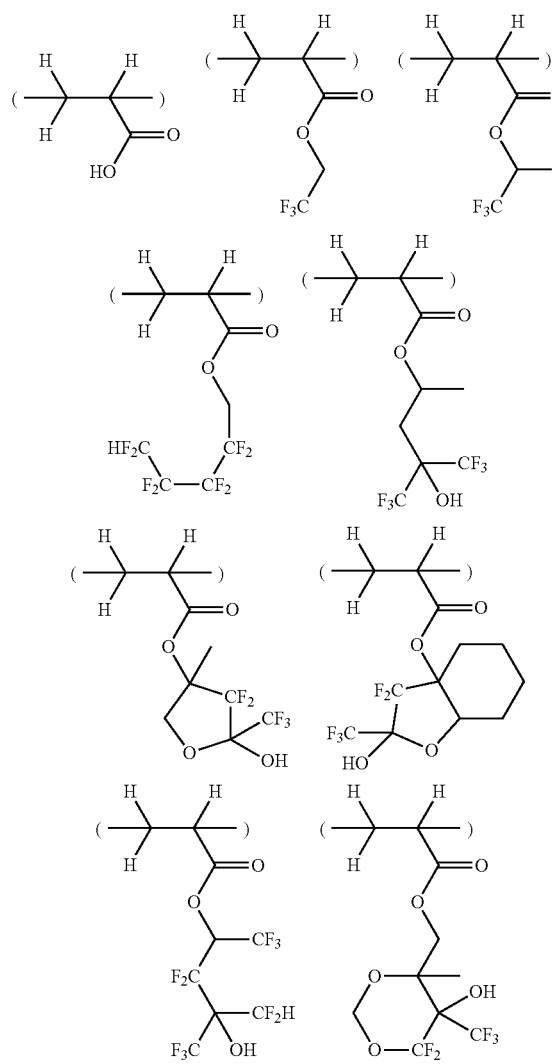
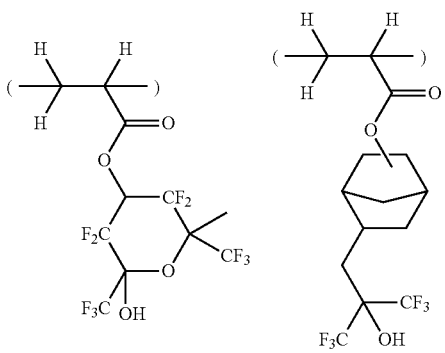
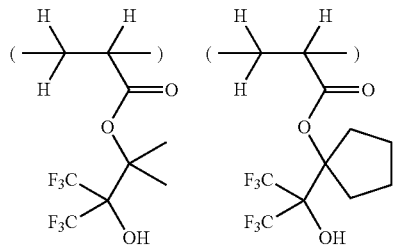
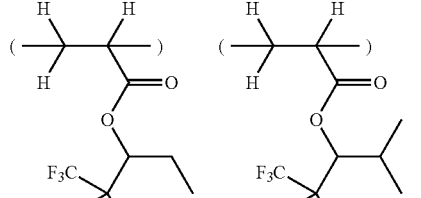
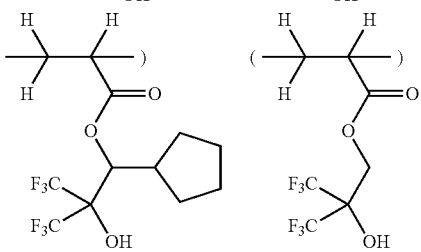
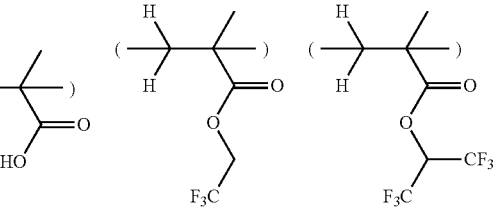

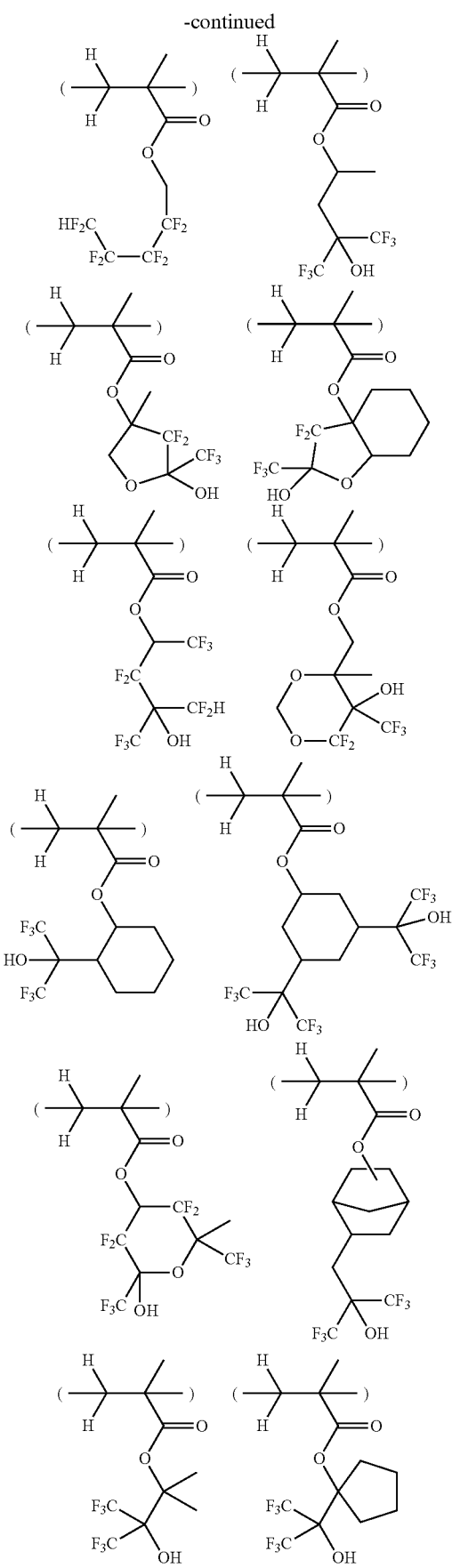
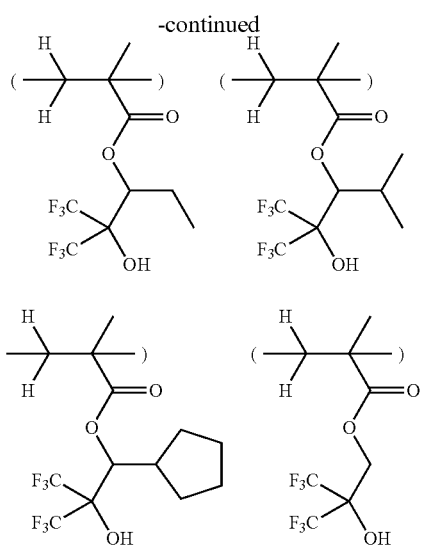

The base polymer (B) may have further copolymerized therein any of sulfonium salts (f1) to (f3) represented by the following general formulae.

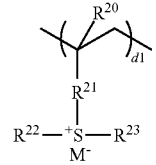

(d1)

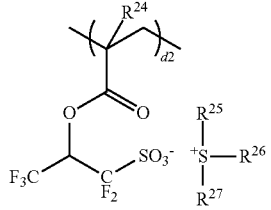

(d2)

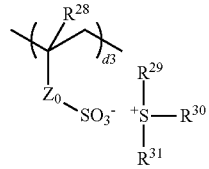

(d3)

Herein $R^{20}$, $R^{24}$ and $R^{28}$ each are hydrogen or methyl. $R^{21}$ is a single bond, phenylene, —O—$R^{33}$—, or —C(=O)—Y—$R^{33}$— wherein Y is oxygen or NH and $R^{33}$ is a straight, branched or cyclic $C_1$-$C_6$ alkylene group, alkenylene group or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group, or thiophenyl group. $Z_0$ is a single bond, methylene, ethylene, phenylene, fluorinated phenylene, —O—R$^{32}$—, or —C(═O)—Z$_1$—R$^{32}$— wherein Z$_1$ is oxygen or NH and R$^2$ is a straight, branched or cyclic C$_1$-C$_6$ alkylene group, alkenylene group or phenylene group, which may contain a carbonyl, ester, ether or hydroxyl radical. M is a non-nucleophilic counter ion.

In addition to the foregoing units, the base polymer (B) may further comprise recurring units derived from carbon-to-carbon double bond-bearing monomers other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[4.4.0.1$^{2,5}$.1$^{7,10}$]dodecene derivatives, unsaturated acid anhydrides such as itaconic anhydride, and other monomers.

In the resist composition, (C) an acid generator, typically photoacid generator (PAG) is compounded. The PAG may be any compound capable of generating an acid upon exposure of high-energy radiation. Suitable PAGs include sulfonium salts, iodonium salts, sulfonyldiazomethane, N-sulfonyloxyimide, and oxime-O-sulfonate acid generators. Exemplary acid generators are described in US 20090274978 (JP-A 2009-269953, paragraphs [0151] to [0156]).

The preferred PAGs are those compounds of the general formula (C)-1.

(C)-1

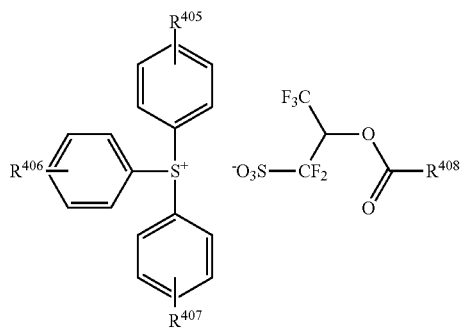

Herein R$^{405}$, R$^{406}$, and R$^{407}$ are each independently hydrogen or a straight, branched or cyclic C$_1$-C$_{20}$ monovalent hydrocarbon group which may contain a heteroatom, typically an alkyl or alkoxy group. R$^{408}$ is a straight, branched or cyclic C$_7$-C$_{30}$ monovalent hydrocarbon group which may contain a heteroatom.

Examples of the hydrocarbon groups optionally containing a heteroatom, represented by R$^{405}$, R$^{406}$, and R$^{407}$, include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is separated by a hetero-atomic grouping such as —O—, —S—, —SO—, —SO$_2$—, —NH—, —C(═O)—, —C(═O)O—, or —C(═O)NH—, or any hydrogen atom is replaced by a functional group such as —OH, —NH, —CHO, or —CO$_2$H. Examples of the straight, branched or cyclic C$_7$-C$_{30}$ monovalent hydrocarbon groups optionally containing a heteroatom, represented by R$^{408}$, are shown below, but not limited thereto.

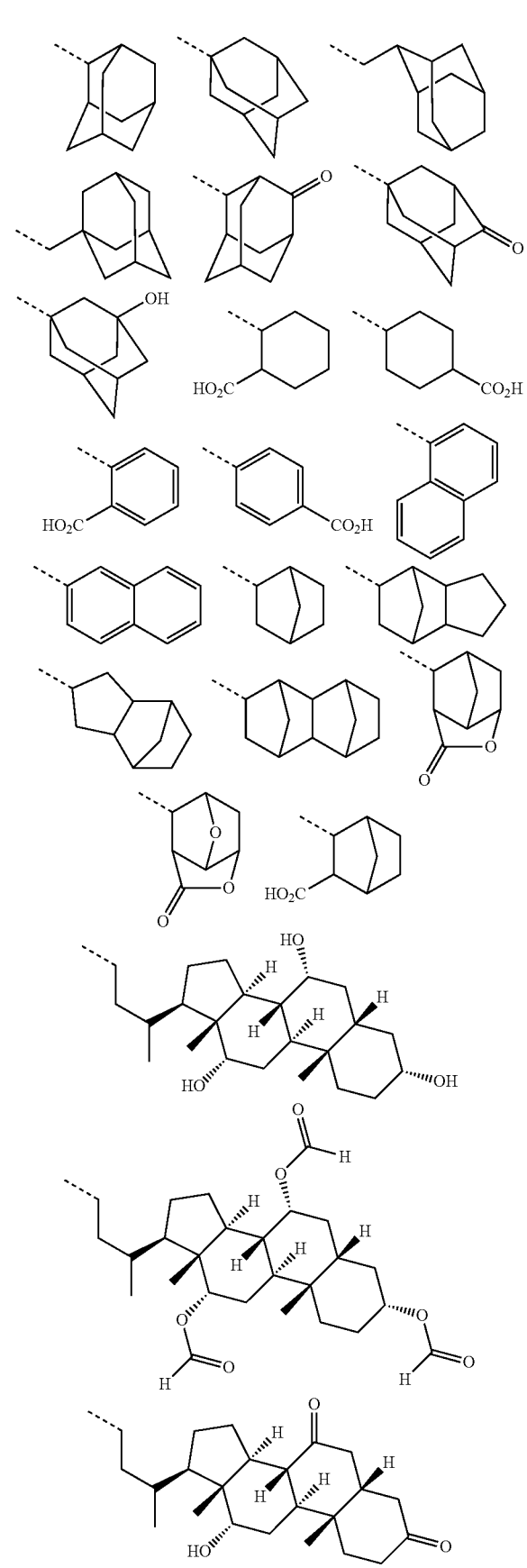

Illustrative examples of acid generator (C)-1 are shown below, but not limited thereto.
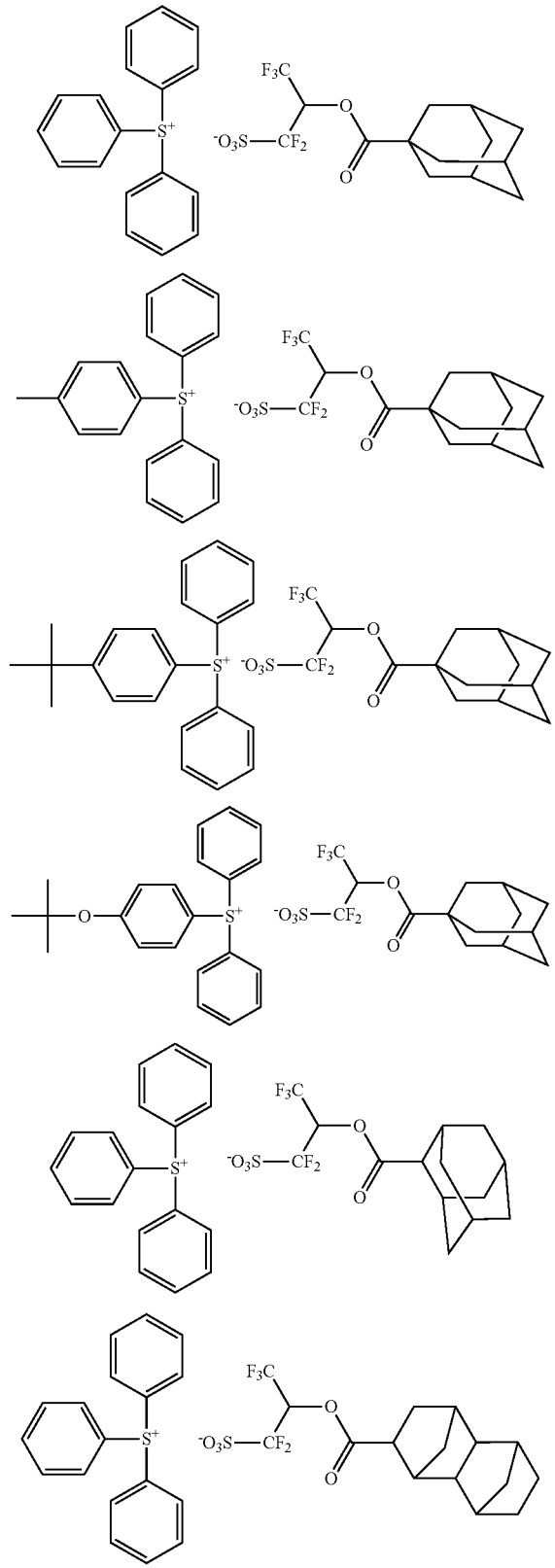
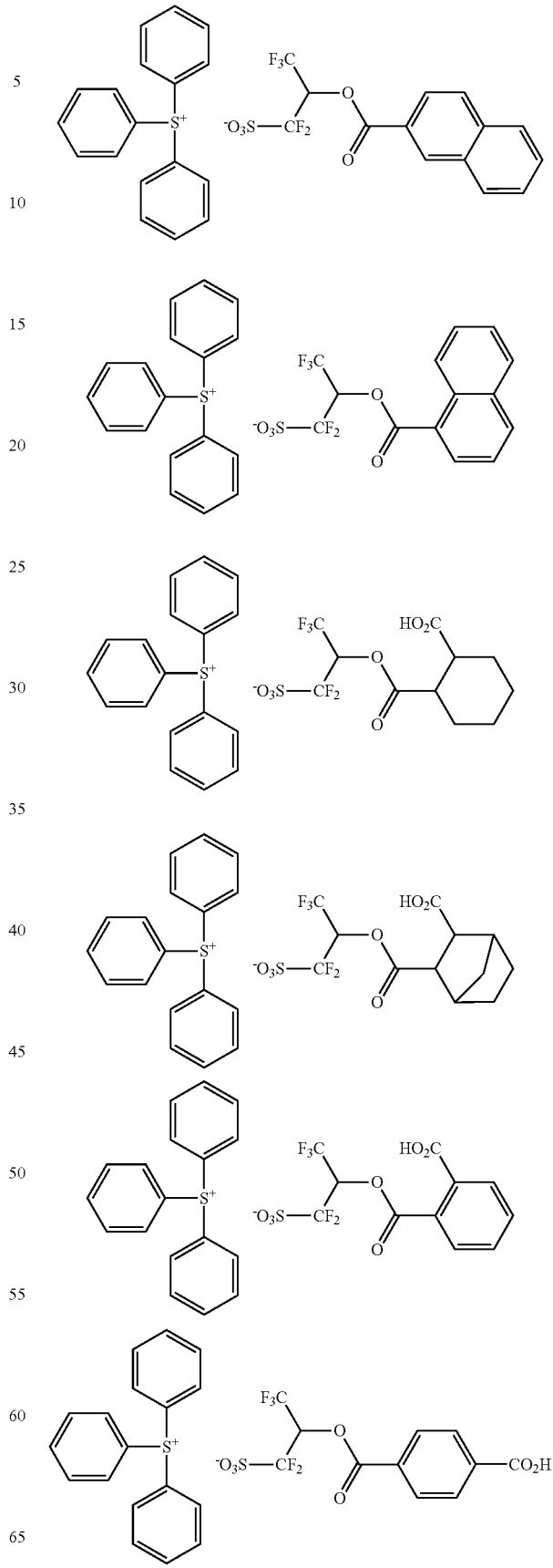

85
-continued

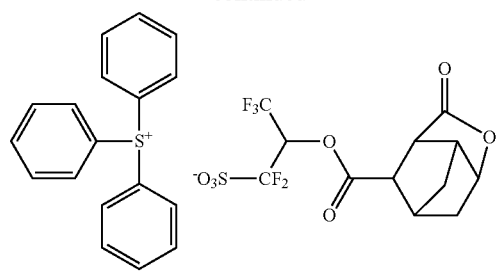
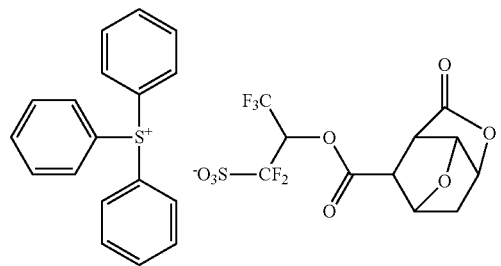
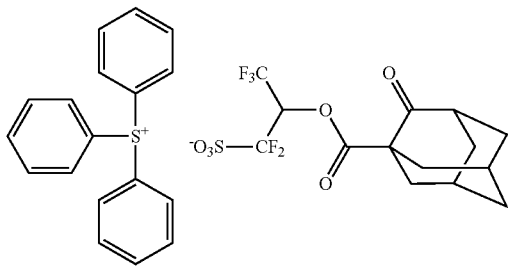
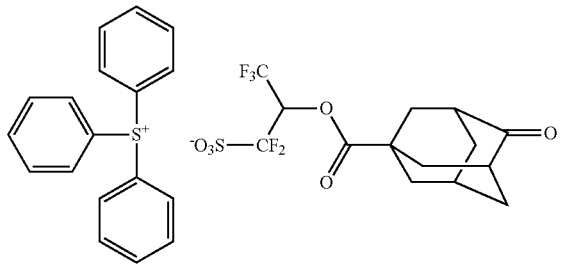
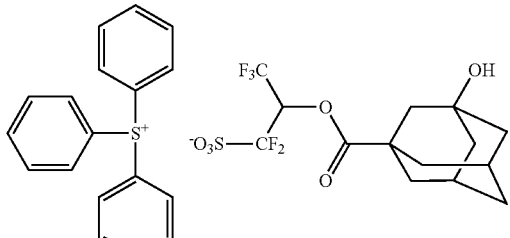
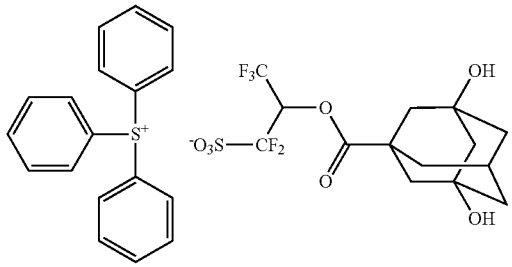

86
-continued

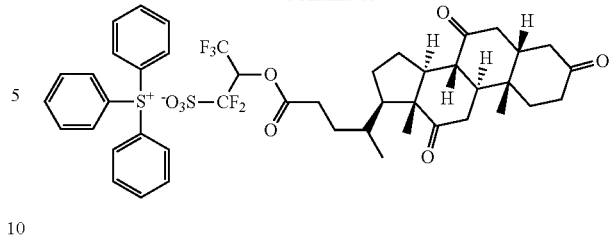

It is noted that an acid diffusion controlling function may be provided when two or more PAGs are used in admixture provided that one PAG is an onium salt capable of generating a weak acid. Specifically, in a system using a mixture of a PAG capable of generating a strong acid (e.g., fluorinated sulfonic acid) and an onium salt capable of generating a weak acid (e.g., non-fluorinated sulfonic acid or carboxylic acid), if the strong acid generated by the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the PAG capable of generating a strong acid is also an onium salt, an exchange from the strong acid (generated upon exposure to high-energy radiation) to a weak acid as above can take place, but it never happens that the weak acid (generated upon exposure to high-energy radiation) collides with the unreacted onium salt capable of generating a strong acid to induce a salt exchange. This is because of a likelihood of an onium cation forming an ion pair with a stronger acid anion.

An appropriate amount of PAG added is 0.1 to 40 parts, and more preferably 0.1 to 20 parts by weight per 100 parts by weight of the base resin (B) in the composition. As long as PAG is up to 40 phr, the resulting resist film has a fully high transmittance and a minimal likelihood of degraded resolution. The PAG may be used alone or in admixture of two or more. The transmittance of the resist film can be controlled by using a PAG having a low transmittance at the exposure wavelength and adjusting the amount of the PAG added.

The resist composition may further comprise one or more of (D) an organic solvent, (E) a basic compound, (F) a dissolution regulator, (G) a surfactant, and (H) an acetylene alcohol derivative.

The organic solvent (D) used herein may be any organic solvent in which polymer P1, the base resin, PAG, and other components are soluble. Exemplary solvents are described in JP-A 2008-111103, paragraph [0144]. The organic solvents may be used alone or in combinations of two or more thereof. An appropriate amount of the organic solvent used is 200 to 10,000 parts, especially 400 to 7,000 parts by weight per 100 parts by weight of the base resin (B). It is recommended to use diethylene glycol dimethyl ether, 1-ethoxy-2-propanol, propylene glycol monomethyl ether acetate (PGMEA), and mixtures thereof because the acid generator is most soluble therein.

As the basic compound (E), nitrogen-containing organic compounds are preferred and may be used alone or in admixture. Those compounds capable of suppressing the rate of diffusion when the acid generated by the PAG diffuses within the resist film are useful. The inclusion of such quencher facilitates adjustment of resist sensitivity and holds down the rate of acid diffusion within the resist film, resulting in better resolution. In addition, it suppresses changes in sensitivity following exposure and mitigates substrate poisoning and environment dependence, as well as improving the exposure latitude and the pattern profile.

Suitable nitrogen-containing organic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide, imide and carbamate derivatives. Illustrative examples are described in JP-A 2009-269953, paragraphs [0122] to [0141].

The basic compound is preferably used in an amount of 0.001 to 8 parts, more preferably 0.01 to 4 parts by weight per 100 parts by weight of the base resin (B). Less than 0.001 phr fails to achieve the desired addition effect whereas more than 8 phr may lead to a lowering of sensitivity. The preferred nitrogen-containing organic compound is a compound capable of holding down the diffusion rate of acid when the acid generated by the acid generator diffuses in the resist film. The inclusion of the nitrogen-containing organic compound holds down the diffusion rate of acid in the resist film, which leads to many advantages including improved resolution, minimized sensitivity change following exposure, reduced substrate poisoning and environment dependency, and improved exposure latitude and pattern profile.

The dissolution regulator or inhibitor (F) which can be added to the resist composition is a compound having on the molecule at least two phenolic hydroxyl groups which are protected with an acid labile group, or a compound having on the molecule at least one carboxyl group which is protected with an acid labile group. Exemplary regulators are described in JP-A 2008-122932, paragraphs [0155] to [0178]. The dissolution regulator is preferably used in an amount of 0 to 40 parts, more preferably 5 to 30 parts by weight per 100 parts by weight of the base resin (B).

Optionally, the resist composition may further comprise (G) a surfactant which is commonly used for facilitating the coating operation. Exemplary surfactants are described in JP-A 2008-111103, paragraph [0166].

Optionally, the resist composition may further comprise (H) an acetylene alcohol derivative. Exemplary compounds are described in JP-A 2008-122932, paragraphs [0180] to [0181].

Optionally, the resist composition may further comprise (I) a fluorinated alcohol. When the resist composition contains (E) a basic compound, the fluorinated ester in recurring units (1a) of polymer P1 is subject to gradual hydrolysis during shelf storage, which may lead to a decline of water repellent and water slip performance during the immersion lithography process. In such a case, (I) a fluorinated alcohol may be added to the resist composition for suppressing the hydrolysis which is otherwise promoted by the basic compound (E), thus enhancing storage stability. Examples of the fluorinated alcohol include, but are not limited to, 2,2,2-trifluoroethanol, 2,2,3,3-tetrafluoro-1-propanol, 1,3-difluoro-2-propanol, 1,1,1,3,3,3-hexafluoro-2-propanol, 1,1,1,3,3,3-hexafluoro-2-trifluoromethyl-2-propanol, 2,2,3,4,4,4-hexafluoro-1-butanol, 2,2,2,2',2',2'-hexafluorocumylalcohol, and 2,2,3,3,4,4,5,5-octafluoro-1-pentanol. The fluorinated alcohol (I) is preferably used in an amount of 0.01 to 10 parts, more preferably 0.01 to 5 parts by weight per part by weight of the basic compound (E).

Pattern Forming Process

It is now described how to form a pattern using the resist composition of the invention. A pattern may be formed from the resist composition using any well-known lithography process. The preferred process includes at least the steps of forming a resist film on a substrate, exposing it to high-energy radiation, and developing it with a developer.

The resist composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.01 to 2.0 µm thick. It is noted in conjunction with spin coating that if the resist composition is coated onto the surface of a substrate which has been wetted with the resist solvent or a solution miscible with the resist solvent, then the amount of the resist composition dispensed can be reduced (see JP-A H09-246173).

A mask having the desired pattern is then placed over the resist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm.

Light exposure may be dry exposure in air or nitrogen atmosphere, or immersion lithography of providing a liquid, typically water between the resist film and the projection lens. The liquid used for immersion is a liquid having a refractive index of at least 1 and high transparency at the exposure wavelength, such as water or alkane. EB or EUV exposure in vacuum is also acceptable.

The resist film formed from the resist composition has such barrier properties against water that it may inhibit resist components from being leached out in water and as a consequence, eliminate a need for a protective coating in the immersion lithography and reduce the cost associated with protective coating formation and removal. The resist film has so high a receding contact angle with water that few liquid droplets may be left on the surface of the resist film after immersion lithography scanning, minimizing pattern formation failures induced by liquid droplets left on the film surface.

In another version of immersion lithography, a protective coating may be formed on top of the resist film. The resist protective coating may be either of the solvent stripping type or of the developer dissolution type. A resist protective coating of the developer dissolution type is advantageous for process simplicity because it can be stripped during development of a resist film. The resist protective coating used in the immersion lithography may be formed from a coating solution, for example, a topcoat solution of a polymer having acidic units such as 1,1,1,3,3,3-hexafluoro-2-hydroxy-2-propyl, carboxyl or sulfo groups which is insoluble in water and soluble in an alkaline developer liquid, in a solvent selected from alcohols of at least 4 carbon atoms, ethers of 8 to 12 carbon atoms, and mixtures thereof. The resist protective coating is not limited thereto.

The resist protective coating may be formed by spin coating a topcoat solution onto a prebaked resist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of the protective coating material dispensed in forming a protective coating by spin coating may be reduced by previously wetting the resist film surface with a suitable solvent and applying the protective coating material thereto.

After exposure to high-energy radiation through a photomask, the resist film is baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process.

After the exposure, development is carried out by a conventional method such as dip, puddle, or spray development with an aqueous alkaline solution such as tetramethylammonium hydroxide (TMAH) solution. The developer may have a concentration of 0.1 to 5 wt %, preferably 2 to 3 wt %. A typical developer is a 2.38 wt % TMAH aqueous solution. The development time is 10 to 300 seconds, and preferably 0.5 to 2 minutes. These steps result in the formation of the desired pattern on the substrate.

Where polymer P1 is used as an additive to a resist material for use with mask blanks, a resist solution is prepared by adding polymer P1 to a base resin and dissolving them in an organic solvent. The resist solution is coated on a mask blank substrate of $SiO_2$, Cr, CrO, CrN, MoSi or the like. A SOG film and an organic undercoat film may intervene between the resist film and the blank substrate to construct a three-layer structure which is also acceptable herein.

As the base resin of the resist composition for use with mask blanks, novolac resins and hydroxystyrene are often used. Those resins in which alkali soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinylnaphthalene, vinylanthracene, vinylpyrene, hydroxyvinylnaphthalene, hydroxyvinylanthracene, indene, hydroxyindene, acenaphthylene, and norbornadiene derivatives.

Once the resist film is formed, the structure is exposed to EB in vacuum using an EB image-writing system. The exposure is followed by baking (PEB) and development in an alkaline developer for 10 to 300 seconds, thereby forming a pattern.

Example

Examples are given below by way of illustration and not by way of limitation. The abbreviations Mw and Mn are weight and number average molecular weights, respectively, as measured versus polystyrene standards by gel permeation chromatography (GPC) using tetrahydrofuran as solvent, and Mw/Mn is a polydispersity index.

Polymer Synthesis

Synthesis Example 1-1

Synthesis of Polymer 1

In a nitrogen atmosphere, a flask was charged with 15.0 g of ethylene glycol methacrylate [3,3,3-trifluoro-2-hydroxy-2-(trifluoromethyl)propionate], 0.53 g of dimethyl 2,2'-azobis(isobutyrate), and 15.0 g of methyl ethyl ketone to form a monomer solution at a temperature of 20-25° C. In a nitrogen atmosphere, another flask was charged with 7.50 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. The polymerization solution was transferred to an eggplant-shape flask and concentrated using an evaporator. Then toluene was added to the flask so as to eventually form a 40 wt % solution of toluene/methyl ethyl ketone (mix ratio 9/1). The solution was added dropwise to 150 g of hexane whereupon a copolymer precipitated. The copolymer was collected by filtration, washed with 90 g of hexane, and separated as a white solid. The white solid was vacuum dried at 50° C. for 20 hours, yielding the target polymer, designated Polymer 1, in white powder solid form. Amount 12.7 g, yield 80%.

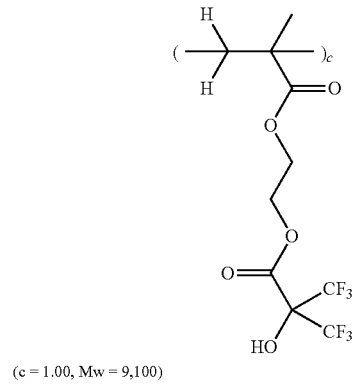

Polymer 1

(c = 1.00, Mw = 9,100)

Synthesis Examples 1-2 to 1-22 and Comparative Synthesis Examples 1-1 to 1-3

Synthesis of Polymers 2 to 22 and Comparative Polymers 1 to 3

Polymers 2 to 22 and Comparative Polymers 1 to 3 were synthesized as in Synthesis Example 1-1 aside from changing the amount and type of monomers. It is noted that the values of c, d, e and f are molar ratios of monomer units.

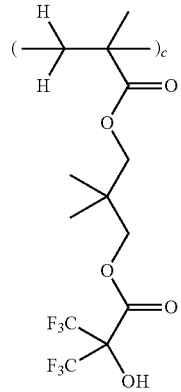

Polymer 2

(c = 1.00, Mw = 9,300)

Polymer 3
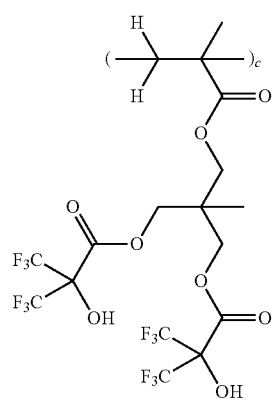
(c = 1.00, Mw = 10,300)
Polymer 4
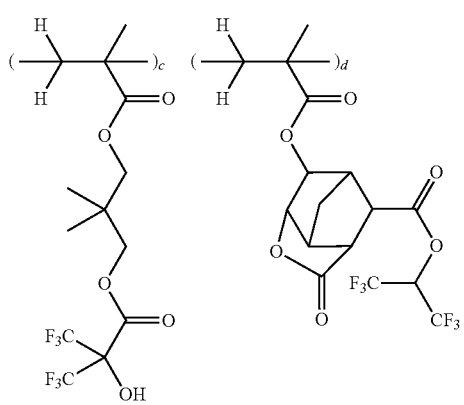
(c = 0.40, d = 0.60, Mw = 9,100)
Polymer 5
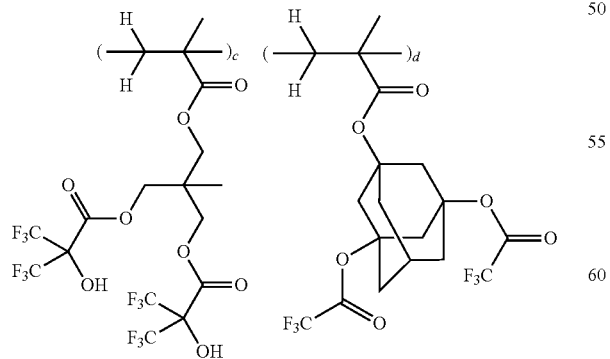
(c = 0.40, d = 0.60, Mw = 10,200)
Polymer 6
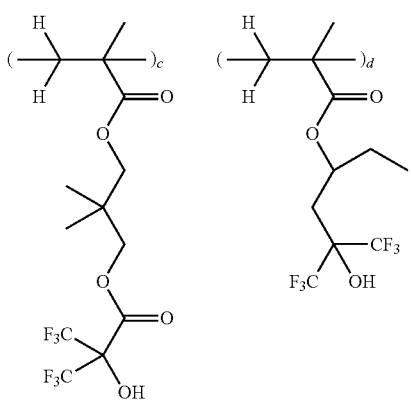
(c = 0.50, d = 0.50, Mw = 9,000)
Polymer 7
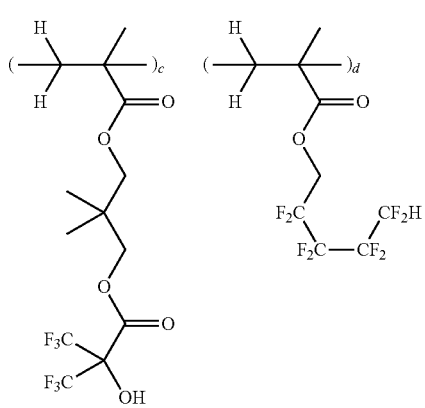
(c = 0.80, d = 0.20, Mw = 8,800)
Polymer 8
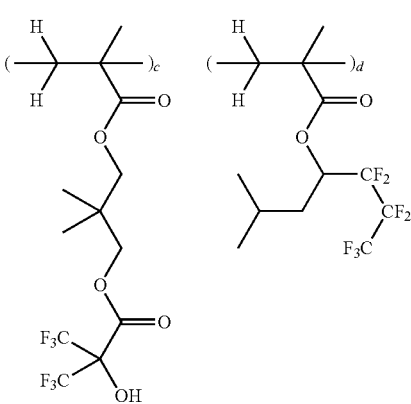
(c = 0.80, d = 0.20, Mw = 8,900)

Polymer 9
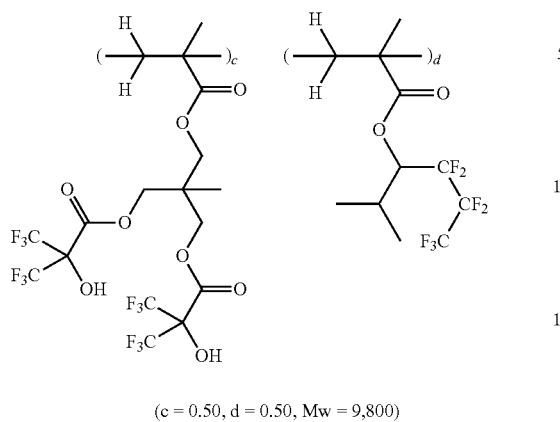
(c = 0.50, d = 0.50, Mw = 9,800)
Polymer 10
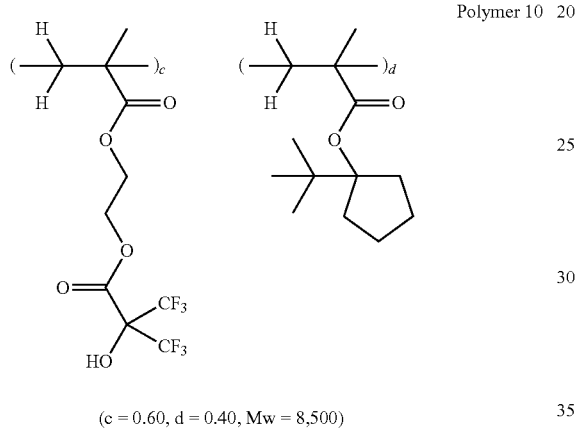
(c = 0.60, d = 0.40, Mw = 8,500)
Polymer 11
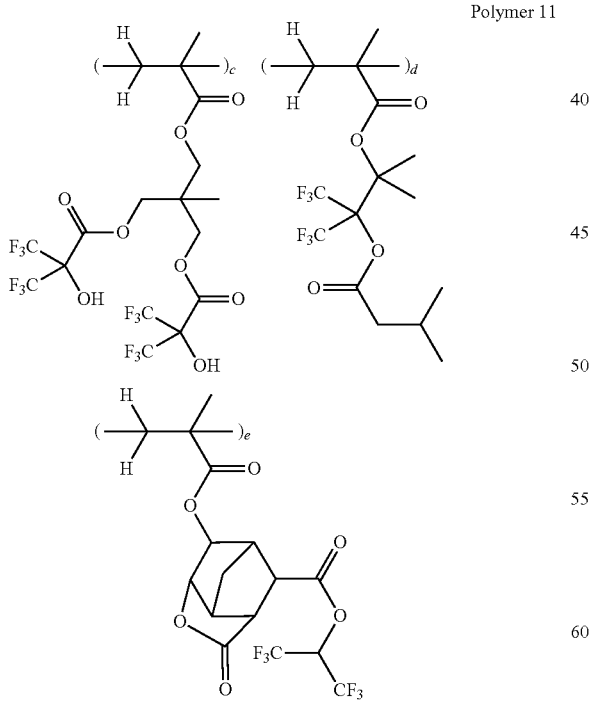
(c = 0.20, d = 0.40, e = 0.40, Mw = 9,500)
Polymer 12
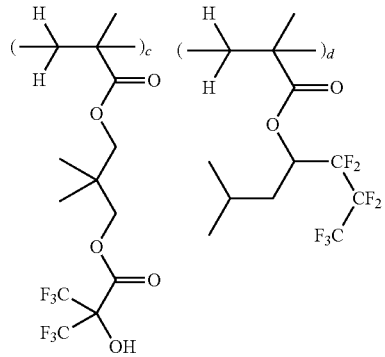
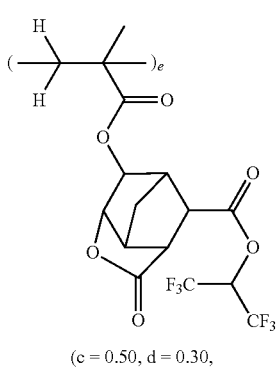
(c = 0.50, d = 0.30, e = 0.20, Mw = 9,100)
Polymer 13
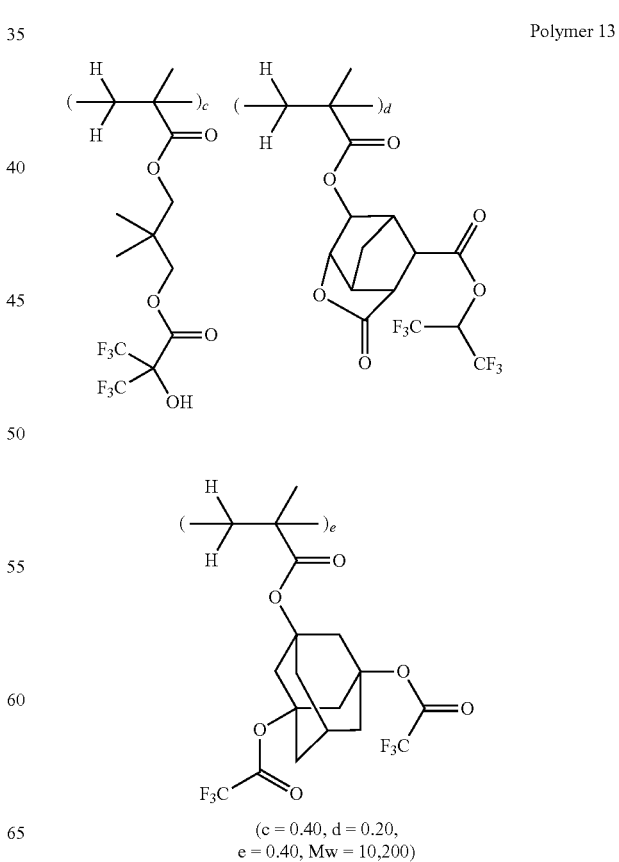
(c = 0.40, d = 0.20, e = 0.40, Mw = 10,200)

Polymer 14
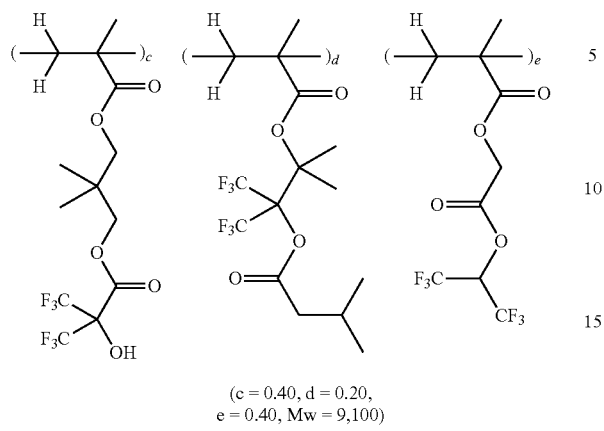
(c = 0.40, d = 0.20, e = 0.40, Mw = 9,100)
Polymer 15
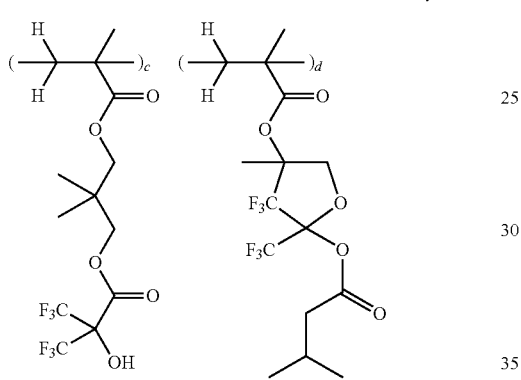
(c = 0.50, d = 0.30, e = 0.20, Mw = 9,100)
Polymer 16
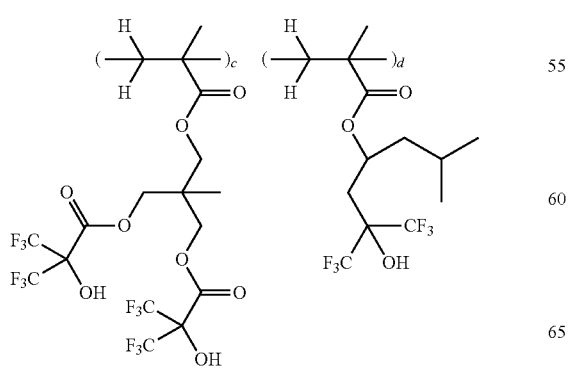
Polymer 16 (continued)
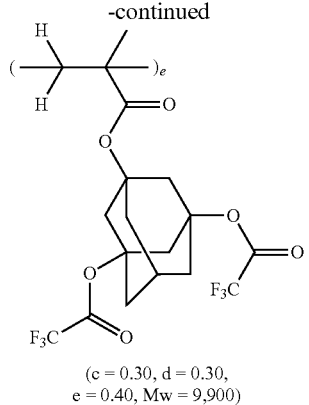
(c = 0.30, d = 0.30, e = 0.40, Mw = 9,900)
Polymer 17
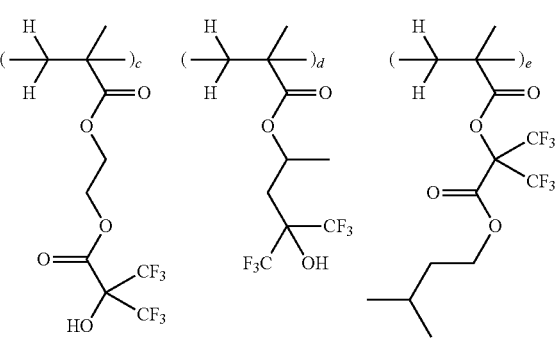
(c = 0.30, d = 0.30, e = 0.40, Mw = 9,000)
Polymer 18
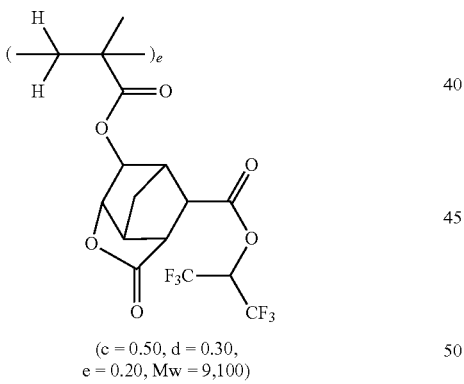
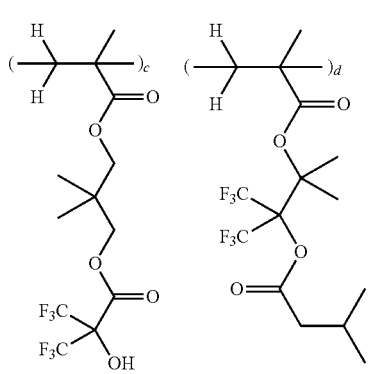
(c = 0.20, d = 0.20, e = 0.20, f = 0.40, Mw = 9,300)

Polymer 19
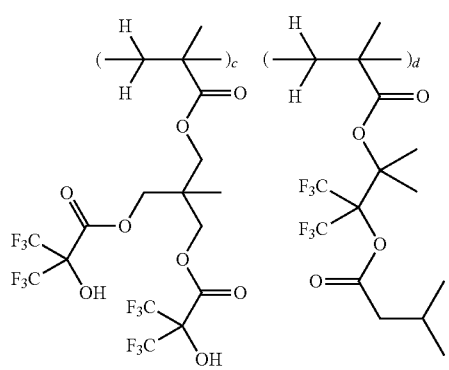
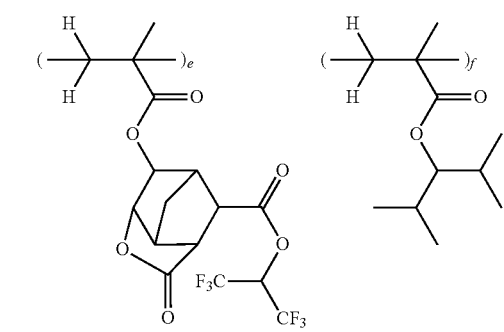
(c = 0.10, d = 0.20, e = 0.40, f = 0.30, Mw = 9,600)
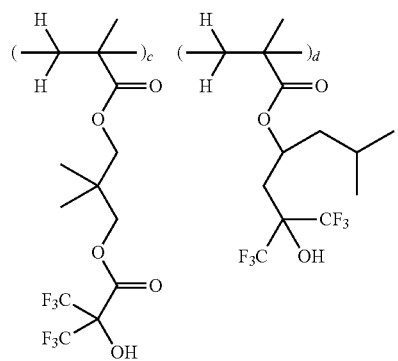
Polymer 20
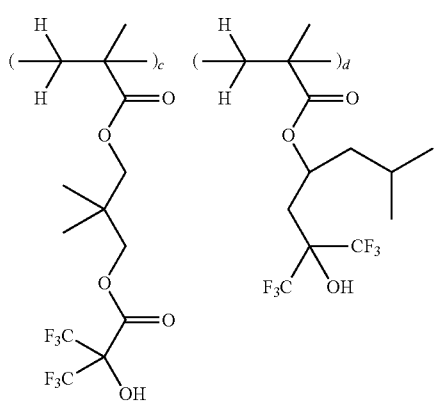
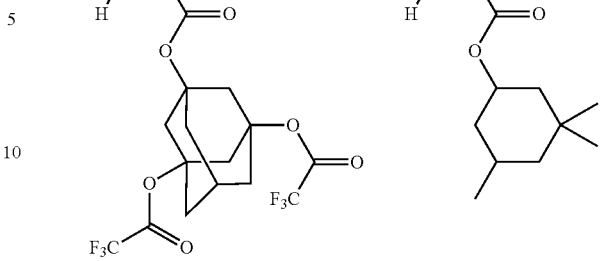
(c = 0.20, d = 0.20, e = 0.30, f = 0.30, Mw = 9,500)
Polymer 21
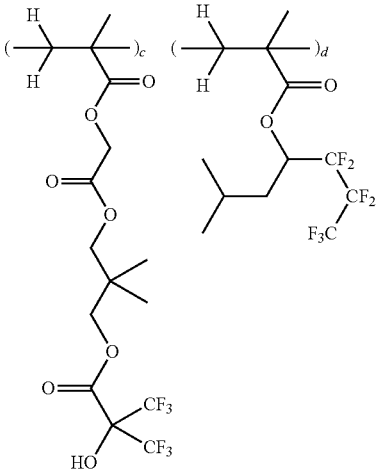
(c = 0.20, d = 0.30, Mw = 9,900)
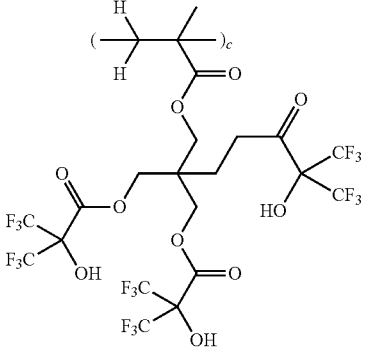
Polymer 22
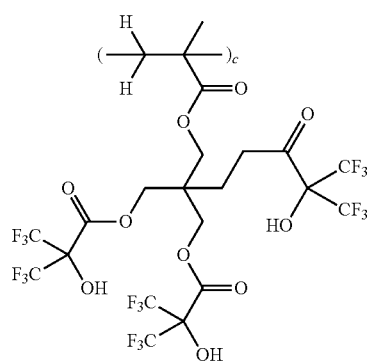

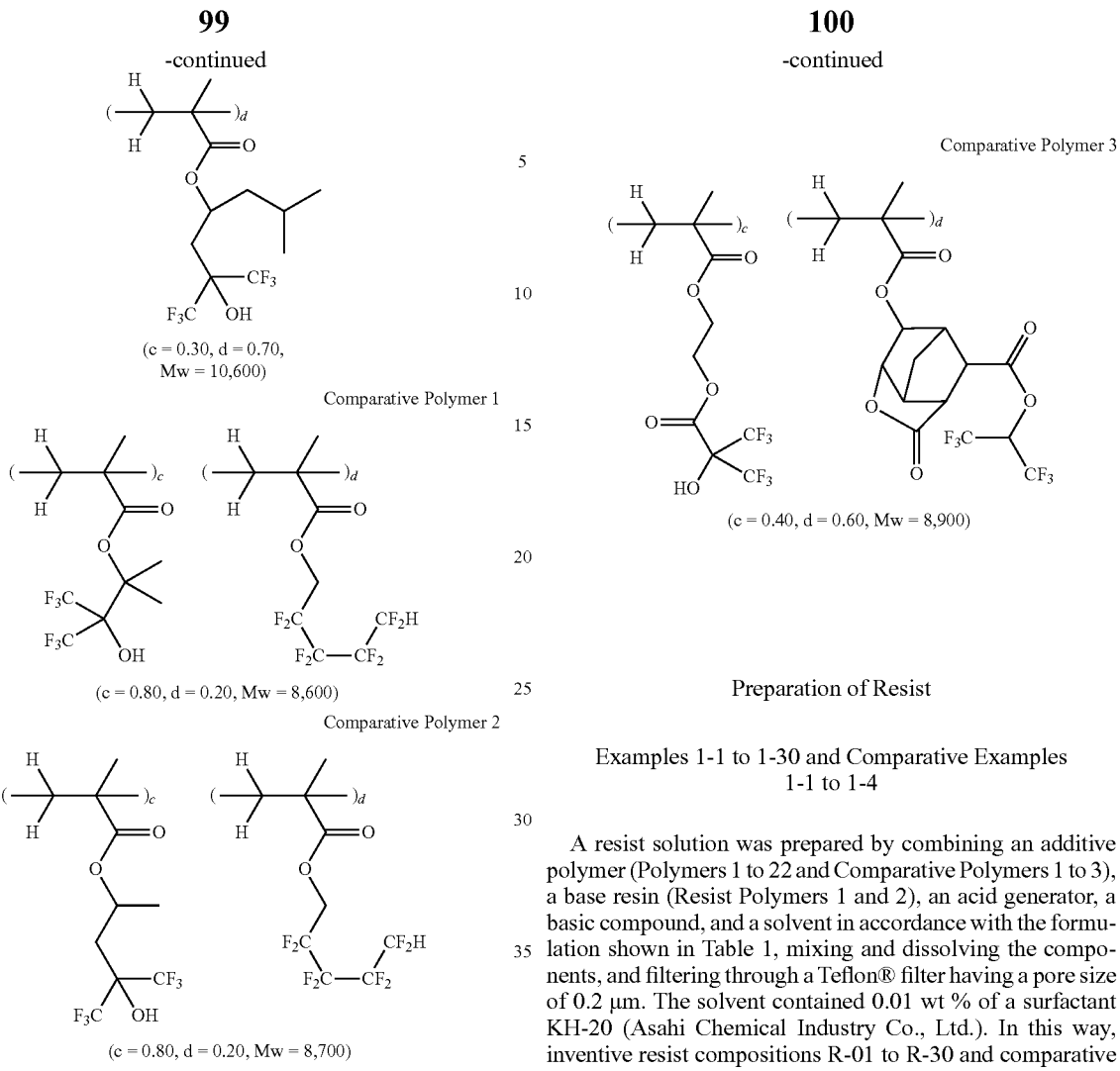

Preparation of Resist

Examples 1-1 to 1-30 and Comparative Examples 1-1 to 1-4

A resist solution was prepared by combining an additive polymer (Polymers 1 to 22 and Comparative Polymers 1 to 3), a base resin (Resist Polymers 1 and 2), an acid generator, a basic compound, and a solvent in accordance with the formulation shown in Table 1, mixing and dissolving the components, and filtering through a Teflon® filter having a pore size of 0.2 μm. The solvent contained 0.01 wt % of a surfactant KH-20 (Asahi Chemical Industry Co., Ltd.). In this way, inventive resist compositions R-01 to R-30 and comparative resist compositions R-31 to R-34 were obtained.

TABLE 1

|  |  | Resist | Additive polymer (pbw) | Base resin (pbw) | PAG (pbw) | Base (pbw) | Solvent 1 (pbw) | Solvent 2 (pbw) |
|---|---|---|---|---|---|---|---|---|
| Example | 1-1 | R-01 | Polymer 1 (5.0) | Resist Polymer 1 (80) | PAG1 (15.0) | Base1 (4.0) | PGMEA (2,700) | CyHO (300) |
|  | 1-2 | R-02 | Polymer 2 (5.0) | Resist Polymer 1 (80) | PAG1 (15.0) | Base1 (4.0) | PGMEA (2,700) | CyHO (300) |
|  | 1-3 | R-03 | Polymer 3 (5.0) | Resist Polymer 1 (80) | PAG1 (15.0) | Base1 (4.0) | PGMEA (2,700) | CyHO (300) |
|  | 1-4 | R-04 | Polymer 4 (5.0) | Resist Polymer 1 (80) | PAG1 (15.0) | Base1 (4.0) | PGMEA (2,700) | CyHO (300) |
|  | 1-5 | R-05 | Polymer 5 (5.0) | Resist Polymer 1 (80) | PAG1 (15.0) | Base1 (4.0) | PGMEA (2,700) | CyHO (300) |
|  | 1-6 | R-06 | Polymer 6 (5.0) | Resist Polymer 1 (80) | PAG1 (15.0) | Base1 (4.0) | PGMEA (2,700) | CyHO (300) |
|  | 1-7 | R-07 | Polymer 7 (5.0) | Resist Polymer 1 (80) | PAG1 (15.0) | Base1 (4.0) | PGMEA (2,700) | CyHO (300) |
|  | 1-8 | R-08 | Polymer 8 (5.0) | Resist Polymer 1 (80) | PAG1 (15.0) | Base1 (4.0) | PGMEA (2,700) | CyHO (300) |
|  | 1-9 | R-09 | Polymer 9 (5.0) | Resist Polymer 1 (80) | PAG1 (15.0) | Base1 (4.0) | PGMEA (2,700) | CyHO (300) |
|  | 1-10 | R-10 | Polymer 10 (5.0) | Resist Polymer 1 (80) | PAG1 (15.0) | Base1 (4.0) | PGMEA (2,700) | CyHO (300) |
|  | 1-11 | R-11 | Polymer 11 (5.0) | Resist Polymer 1 (80) | PAG1 (15.0) | Base1 (4.0) | PGMEA (2,700) | CyHO (300) |
|  | 1-12 | R-12 | Polymer 12 (5.0) | Resist Polymer 1 (80) | PAG1 (15.0) | Base1 (4.0) | PGMEA (2,700) | CyHO (300) |

TABLE 1-continued

| | | Resist | Additive polymer (pbw) | Base resin (pbw) | PAG (pbw) | Base (pbw) | Solvent 1 (pbw) | Solvent 2 (pbw) |
|---|---|---|---|---|---|---|---|---|
| | 1-13 | R-13 | Polymer 13 (5.0) | Resist Polymer 1 (80) | PAG1 (15.0) | Base1 (4.0) | PGMEA (2,700) | CyHO (300) |
| | 1-14 | R-14 | Polymer 14 (5.0) | Resist Polymer 1 (80) | PAG1 (15.0) | Base1 (4.0) | PGMEA (2,700) | CyHO (300) |
| | 1-15 | R-15 | Polymer 15 (5.0) | Resist Polymer 1 (80) | PAG1 (15.0) | Base1 (4.0) | PGMEA (2,700) | CyHO (300) |
| | 1-16 | R-16 | Polymer 16 (5.0) | Resist Polymer 1 (80) | PAG1 (15.0) | Base1 (4.0) | PGMEA (2,700) | CyHO (300) |
| | 1-17 | R-17 | Polymer 17 (5.0) | Resist Polymer 1 (80) | PAG1 (15.0) | Base1 (4.0) | PGMEA (2,700) | CyHO (300) |
| | 1-18 | R-18 | Polymer 18 (5.0) | Resist Polymer 1 (80) | PAG1 (15.0) | Base1 (4.0) | PGMEA (2,700) | CyHO (300) |
| | 1-19 | R-19 | Polymer 19 (5.0) | Resist Polymer 1 (80) | PAG1 (15.0) | Base1 (4.0) | PGMEA (2,700) | CyHO (300) |
| | 1-20 | R-20 | Polymer 20 (5.0) | Resist Polymer 1 (80) | PAG1 (15.0) | Base1 (4.0) | PGMEA (2,700) | CyHO (300) |
| | 1-21 | R-21 | Polymer 21 (5.0) | Resist Polymer 1 (80) | PAG1 (15.0) | Base1 (4.0) | PGMEA (2,700) | CyHO (300) |
| | 1-22 | R-22 | Polymer 22 (5.0) | Resist Polymer 1 (80) | PAG1 (15.0) | Base1 (4.0) | PGMEA (2,700) | CyHO (300) |
| | 1-23 | R-23 | Polymer 7 (5.0) | Resist Polymer 1 (80) | PAG2 (15.0) | Base1 (4.0) | PGMEA (2,700) | CyHO (300) |
| | 1-24 | R-24 | Polymer 8 (5.0) | Resist Polymer 1 (80) | PAG2 (15.0) | Base2 (4.0) | PGMEA (2,700) | CyHO (300) |
| | 1-25 | R-25 | Polymer 13 (5.0) | Resist Polymer 1 (80) | PAG2 (15.0) | Base1 (4.0) | PGMEA (2,700) | CyHO (300) |
| | 1-26 | R-26 | Polymer 18 (5.0) | Resist Polymer 1 (80) | PAG2 (15.0) | Base1 (4.0) | PGMEA (2,700) | CyHO (300) |
| | 1-27 | R-27 | Polymer 7 (5.0) | Resist Polymer 2 (80) | | Base1 (4.0) | PGMEA (2,700) | GBL (300) |
| | 1-28 | R-28 | Polymer 8 (5.0) | Resist Polymer 2 (80) | | Base1 (4.0) | PGMEA (2,700) | GBL (300) |
| | 1-29 | R-29 | Polymer 13 (5.0) | Resist Polymer 2 (80) | | Base1 (4.0) | PGMEA (2,700) | GBL (300) |
| | 1-30 | R-30 | Polymer 18 (5.0) | Resist Polymer 2 (80) | | Base1 (4.0) | PGMEA (2,700) | GBL (300) |
| Comparative Example | 1-1 | R-31 | Comparative Polymer 1 (5.0) | Resist Polymer 1 (80) | PAG1 (15.0) | Base1 (4.0) | PGMEA (2,700) | CyHO (300) |
| | 1-2 | R-32 | Comparative Polymer 2 (5.0) | Resist Polymer 1 (80) | PAG1 (15.0) | Base1 (4.0) | PGMEA (2,700) | CyHO (300) |
| | 1-3 | R-33 | Comparative Polymer 3 (5.0) | Resist Polymer 1 (80) | PAG1 (15.0) | Base1 (4.0) | PGMEA (2,700) | CyHO (300) |
| | 1-4 | R-34 | | Resist Polymer 1 (80) | PAG1 (15.0) | Base1 (4.0) | PGMEA (2,700) | CyHO (300) |

The abbreviations for acid generator, base and solvent in Table 1 are identified below.

-continued

Resist Polymer 1

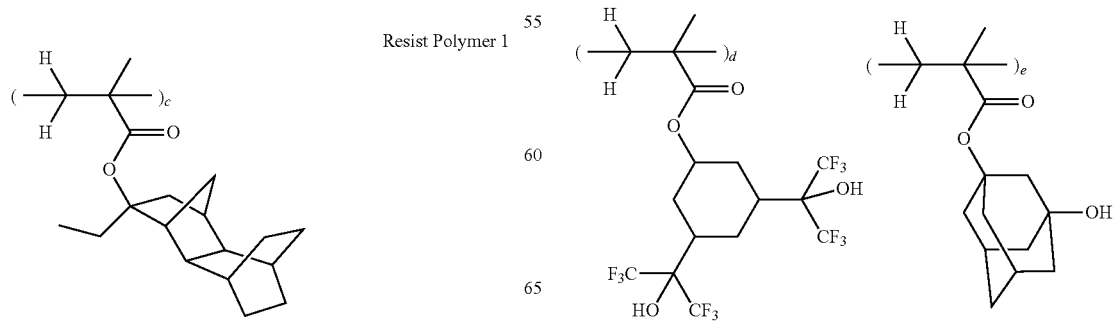

-continued

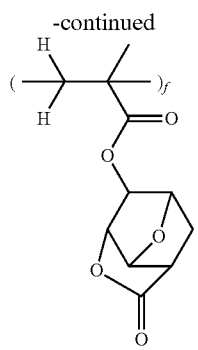

(c = 0.25, d = 0.10,
e = 0.25, f = 0.40,
Mw = 7,100)

Resist Polymer 2

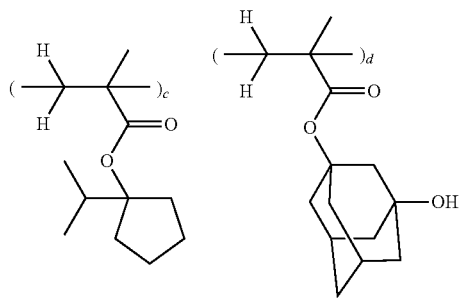

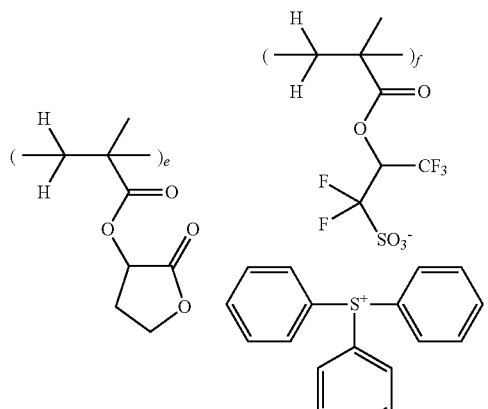

(c = 0.50, d = 0.10,
e = 0.35, f = 0.05,
Mw = 9,100)

PAG1

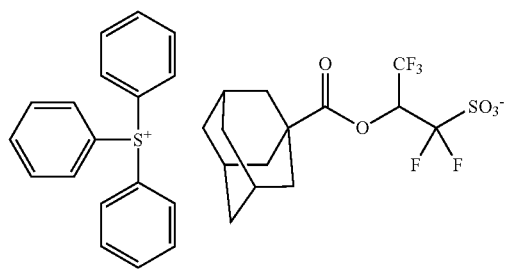

-continued

PAG2

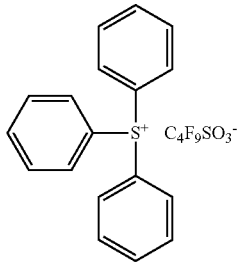

Base1

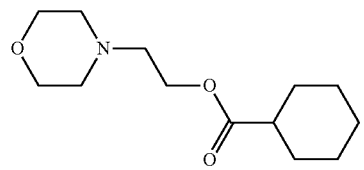

Base2

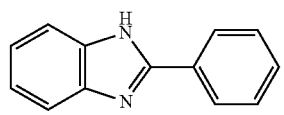

PGMEA: 1-methoxyisopropyl acetate
CyHO: cyclohexanone
GBL: γ-butyrolactone

Resist Evaluation

Examples 2-1 to 2-30 and Comparative Examples 2-1 to 2-4

An antireflective coating ARC-29A (Nissan Chemical Co., Ltd.) was deposited on a silicon substrate to a thickness of 87 nm. The resist solution was applied onto the ARC and baked at 120° C. for 60 seconds to form a resist film of 150 nm thick.

A contact angle with water of the resist film was measured, using an inclination contact angle meter Drop Master 500 by Kyowa Interface Science Co., Ltd. Specifically, the wafer covered with the resist film was kept horizontal, and 50 μL of pure water was dropped on the resist film to form a droplet. While the wafer was gradually inclined, the angle (sliding angle) at which the droplet started sliding down was determined as well as receding contact angle. The results are shown in Table 2.

A smaller sliding angle indicates an easier flow of water on the resist film. A larger receding contact angle indicates that fewer liquid droplets are left during high-speed scan exposure. It is demonstrated in Table 2 that the inclusion of the additive polymer of the invention in a resist solution achieves a drastic improvement in the receding contact angle of resist film without adversely affecting the sliding angle, as compared with those resist films free of the additive polymer.

Also, the resist film-bearing wafer (prepared above) was irradiated through an open frame at an energy dose of 50 mJ/cm$^2$ using an ArF scanner S305B (Nikon Corp.). Then a true circle ring of Teflon® having an inner diameter of 10 cm was placed on the resist film, 10 mL of pure water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The results are also shown in Table 2.

It is evident from Table 2 that a resist film formed from a resist solution containing the additive polymer according to the invention is effective in inhibiting the PAG from being leached out of the film in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing pure water, baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. The results are also shown in Table 2.

As seen from Table 2, when exposure is followed by water rinsing, the resist film having the additive polymer according to the invention formulated therein formed a pattern of rectangular profile, in stark contrast with the resist film free of the additive polymer forming a pattern of T-top profile.

This was followed by baking (PEB) at 110° C. for 60 seconds and development with a 2.38 wt % TMAH aqueous solution for 30 seconds. The wafer as developed was further baked at 110° C. for 60 seconds, completing a 45-nm line-and-space pattern.

Using a flaw detector, the number of defects on the pattern was counted. The pattern was observed under scanning electron microscope (SEM) to see whether the defects were bridge defects or watermark defects. The "bridge defect" is formed by the mechanism that foreign matter deposits in a space to form a bridge between adjacent lines. The "watermark defect" is characterized in that the pattern is waved and the waved portion covers several lines in a circular fashion. It is believed that the watermark defect is caused by a residual water droplet from the immersion water. The watermark defect tends to form when the resist film surface is short of water repellency.

TABLE 2

|  |  | Resist | Sliding angle (°) | Receding contact angle (°) | Anion Leach-out (ppb) | Sensitivity (mJ/cm²) | 75-nm pattern profile |
|---|---|---|---|---|---|---|---|
| Example | 2-1 | R-01 | 16 | 69 | 8 | 31 | rectangular |
|  | 2-2 | R-02 | 12 | 75 | 7 | 31 | rectangular |
|  | 2-3 | R-03 | 17 | 69 | 8 | 31 | rectangular |
|  | 2-4 | R-04 | 11 | 75 | 6 | 31 | rectangular |
|  | 2-5 | R-05 | 8 | 81 | 6 | 31 | rectangular |
|  | 2-6 | R-06 | 7 | 80 | 6 | 31 | rectangular |
|  | 2-7 | R-07 | 11 | 76 | 7 | 31 | rectangular |
|  | 2-8 | R-08 | 10 | 80 | 6 | 31 | rectangular |
|  | 2-9 | R-09 | 11 | 78 | 7 | 31 | rectangular |
|  | 2-10 | R-10 | 13 | 77 | 7 | 30 | rectangular |
|  | 2-11 | R-11 | 7 | 81 | 6 | 31 | rectangular |
|  | 2-12 | R-12 | 10 | 79 | 6 | 31 | rectangular |
|  | 2-13 | R-13 | 9 | 81 | 6 | 31 | rectangular |
|  | 2-14 | R-14 | 9 | 80 | 6 | 31 | rectangular |
|  | 2-15 | R-15 | 10 | 80 | 6 | 30 | rectangular |
|  | 2-16 | R-16 | 9 | 80 | 6 | 31 | rectangular |
|  | 2-17 | R-17 | 8 | 80 | 7 | 30 | rectangular |
|  | 2-18 | R-18 | 7 | 82 | 6 | 31 | rectangular |
|  | 2-19 | R-19 | 9 | 81 | 6 | 31 | rectangular |
|  | 2-20 | R-20 | 7 | 83 | 6 | 31 | rectangular |
|  | 2-21 | R-21 | 9 | 79 | 6 | 31 | rectangular |
|  | 2-22 | R-22 | 10 | 80 | 7 | 30 | rectangular |
|  | 2-23 | R-23 | 11 | 76 | 8 | 29 | rectangular |
|  | 2-24 | R-24 | 10 | 80 | 7 | 29 | rectangular |
|  | 2-25 | R-25 | 8 | 83 | 7 | 30 | rectangular |
|  | 2-26 | R-26 | 7 | 82 | 7 | 30 | rectangular |
|  | 2-27 | R-27 | 10 | 77 | not detected | 27 | rectangular |
|  | 2-28 | R-28 | 9 | 81 | not detected | 27 | rectangular |
|  | 2-29 | R-29 | 7 | 84 | not detected | 28 | rectangular |
|  | 2-30 | R-30 | 7 | 83 | not detected | 28 | rectangular |
| Comparative Example | 2-1 | R-31 | 21 | 62 | 9 | 31 | rectangular |
|  | 2-2 | R-32 | 19 | 66 | 9 | 33 | rectangular |
|  | 2-3 | R-33 | 20 | 71 | 9 | 33 | rectangular |
|  | 2-4 | R-34 | 28 | 40 | 60 | 31 | T-top |

Evaluation of Resist Pattern Defects

Examples 3-1 to 3-6 and Comparative Examples 3-1 to 3-2

An antireflective coating ARC-29A (Nissan Chemical Co., Ltd.) of 95 nm thick was deposited on a silicon substrate. The resist solution was applied onto the ARC and baked at 120° C. for 60 seconds to form a resist film of 150 nm thick. Using an ArF scanner model S610C (Nikon Corp., NA 1.20, a 0.98, 4/5 dipole illumination (open angle 35°), binary mask), the resist film on the wafer was exposed at a scan speed of 500 mm/s.

Figure 2:
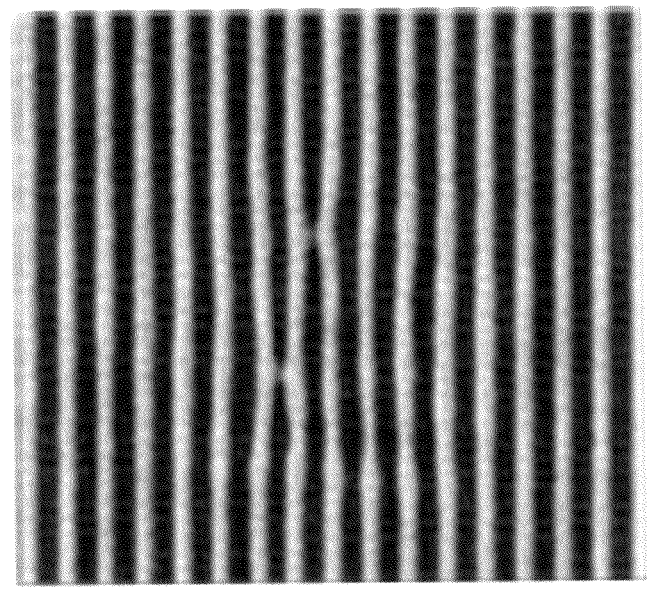
FIG. 2 is a SEM image showing a watermark defect on a resist pattern.

FIGS. 1 and 2 are SEM images of bridge defect and watermark defect, respectively. The counts of bridge defects and watermark defects are reported in Table 3.

TABLE 3

|  | Resist | Bridge defects (count) | Watermark defects (count) |
|---|---|---|---|
| Example | 3-1 R-06 | 8 | 9 |
|  | 3-2 R-07 | 5 | 3 |
|  | 3-3 R-08 | 2 | 2 |

| | Resist | Bridge defects (count) | Watermark defects (count) |
|---|---|---|---|
| | 3-4 R-23 | 3 | 2 |
| | 3-5 R-27 | 3 | 5 |
| | 3-6 R-28 | 2 | 3 |
| Comparative | 3-1 R-31 | 9 | 33 |
| Example | 3-2 R-32 | 25 | 21 |

It is evident from Table 3 that the resist compositions within the scope of the invention are effective for reducing both bridge defects and watermark defects since the resist compositions take full advantage of the additive polymer according to the invention featuring a satisfactory alkali dissolution rate and a high receding contact angle.

Japanese Patent Application No. 2010-277875 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A) a polymer comprising recurring units of the following general formula (1a), (B) a polymer having a lactone ring-deviated structure, hydroxyl-containing structure and/or maleic anhydride-derived structure and adapted to become soluble in an alkaline developer under the action of an acid as a base resin, (C) a compound capable of generating an acid upon exposure to high-energy radiation, and (D) an organic solvent,

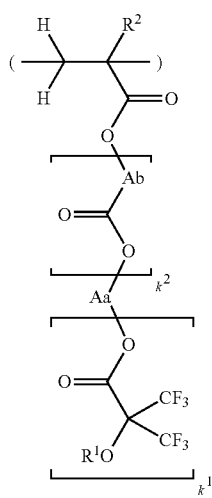

(1a)

wherein $R^1$ is hydrogen, $R^2$ is hydrogen or methyl, Aa is a branched $C_2$-$C_{20}$ hydrocarbon group having a valence of $k^1$+1 selected from the group consisting of the following groups:

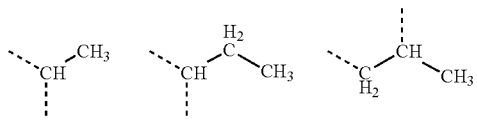

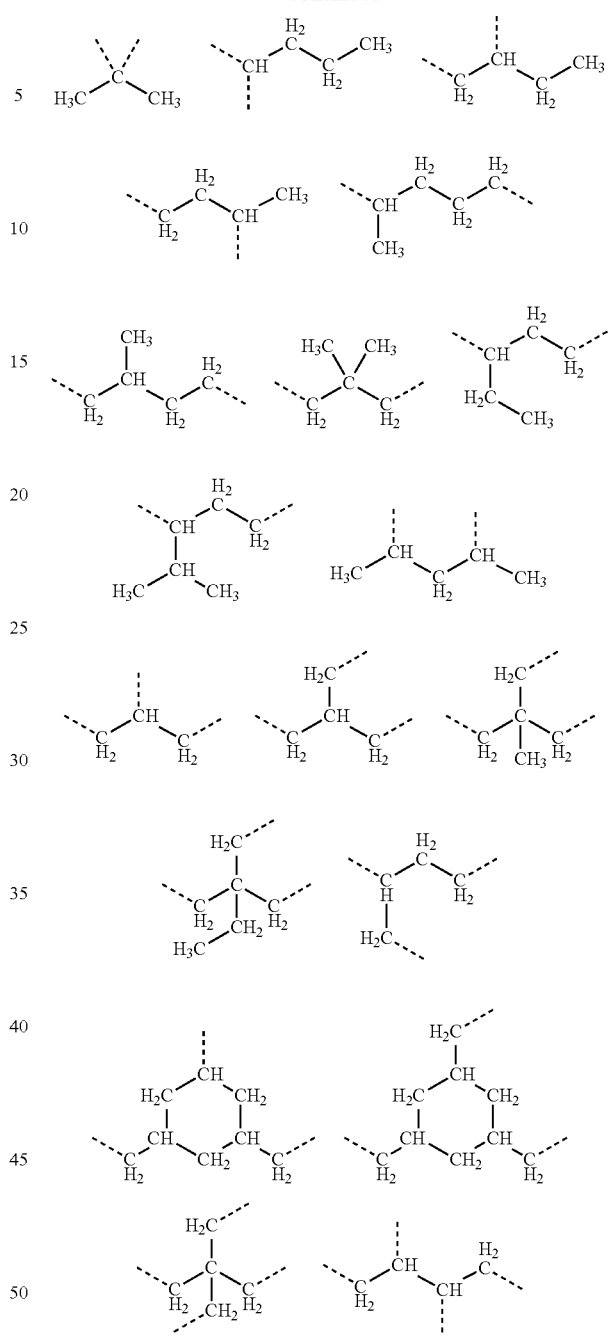

wherein the broken line designates a valence bond, Ab is a straight, branched or cyclic $C_1$-$C_6$ divalent hydrocarbon group, $k^1$ is an integer of 1 to 3, and $k^2$ is 0 or 1.

2. The resist composition of claim 1 comprising (A) a polymer comprising recurring units of the general formula (1a) as set forth in claim 1 and recurring units of one or more type selected from the general formulae (2a) to (2j), (B) a polymer having a lactone ring-derived structure, hydroxyl-containing structure and/or maleic anhydride-derived structure and adapted to become soluble in alkaline developer under the action of acid as a base resin, (C) a compound capable of generating an acid upon exposure to high-energy radiation, and (D) an organic solvent,

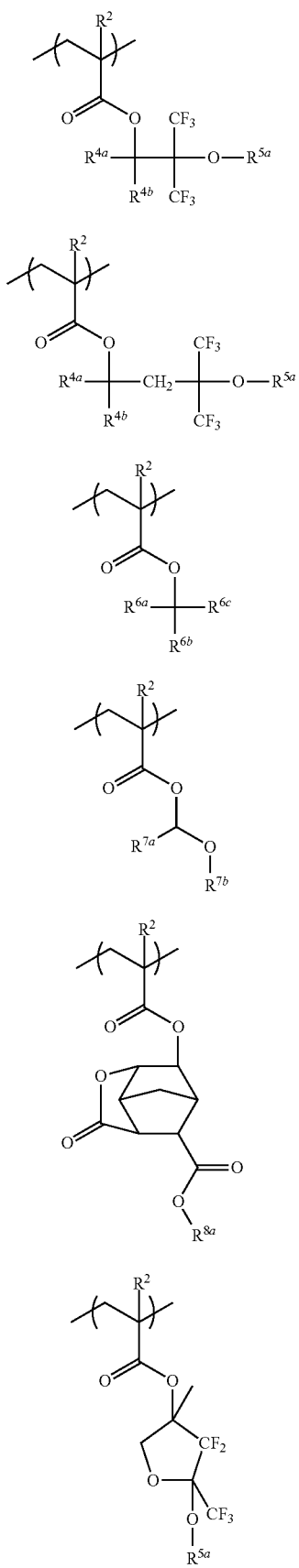
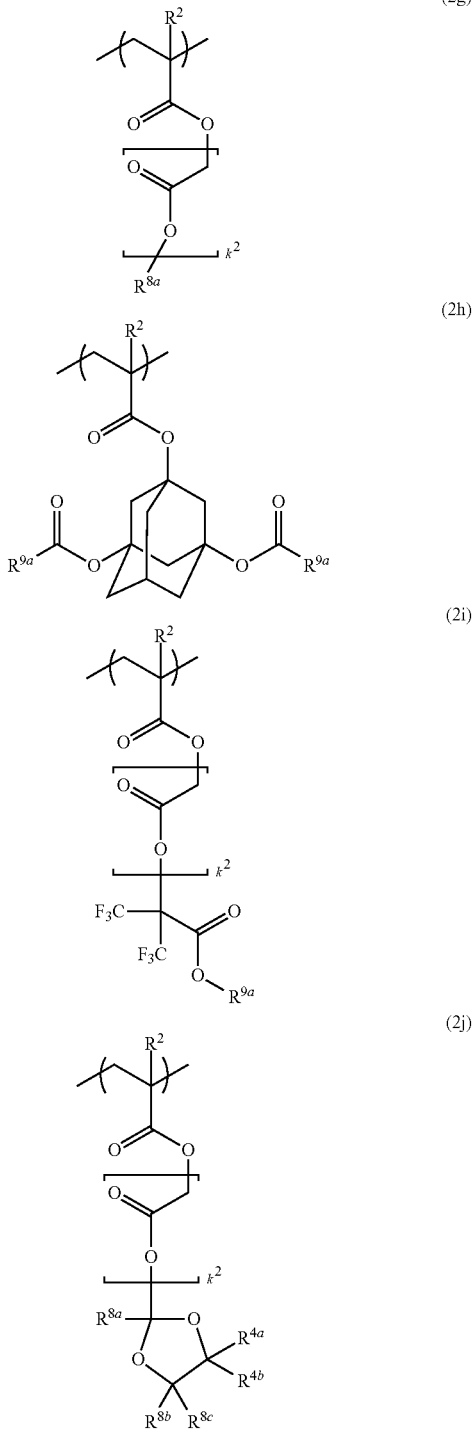

wherein $R^2$ is as defined above, $R^{4a}$ and $R^{4b}$ are each independently hydrogen or a straight, branched or cyclic $C_1$-$C_{15}$ monovalent hydrocarbon group, or $R^{4a}$ and $R^{4b}$ may bond together to form a non-aromatic ring of 3 to 8 carbon atoms with the carbon atom to which they are attached, $R^{5a}$ is hydrogen, a straight, branched or cyclic $C_1$-$C_{15}$ monovalent hydrocarbon or fluorinated hydrocarbon group, or an acid labile group, in the case of hydrocarbon group, a constituent moiety —$CH_2$— may be replaced by —O— or —C(=O)—, $R^{6a}$, $R^{6b}$ and $R^{6b}$ and $R^{6c}$ are each independently hydrogen, or a straight, branched or cyclic $C_1$-$C_{15}$ monovalent hydrocarbon group, $R^{6a}$ and $R^{6b}$, $R^{6a}$ and $R^{6c}$, or $R^{6b}$ and $R^{6c}$ may bond together to form a non-aromatic ring of 3 to 8 carbon atoms with the carbon atom to which they are attached, $R^{7a}$ is hydrogen, or a straight, branched or cyclic $C_1$-$C_{15}$ monovalent hydrocarbon group, $R^{7b}$ is a straight, branched or cyclic $C_1$-$C_{15}$ monovalent hydrocarbon group, $R^{7a}$ and $R^{7b}$ may bond together to form a non-aromatic ring of 3 to 8 carbon atoms with the carbon atom to which they are attached, $R^{8a}$, $R^{8b}$ and $R^{8c}$ are each independently a straight, branched or cyclic $C_1$-$C_{15}$ monovalent fluorinated hydrocarbon group, $R^{9a}$ is a straight, branched or cyclic $C_1$-$C_{15}$ monovalent hydrocarbon or fluorinated hydrocarbon group, and $k^2$ is 0 or 1.

3. The resist composition of claim 1 wherein the polymer (B) is selected from the group consisting of (meth)acrylate polymers, (α-trifluoromethyl)acrylate-maleic anhydride copolymers, cycloolefin-maleic anhydride copolymers, polynorbornene, polymers resulting from ring-opening metathesis polymerization of cycloolefins, hydrogenated polymers resulting from ring-opening metathesis polymerization of cycloolefins, copolymers of hydroxystyrene with (meth)acrylate, styrene, vinylnaphthalene, vinylanthracene, vinylpyrene, hydroxyvinylnaphthalene, hydroxyvinylanthracene, indene, hydroxyindene, acenaphthylene, or norbornadiene derivatives, and novolac resins.

4. The resist composition of claim 1 wherein the polymer (B) further comprises recurring units of at least one type selected from the general formulae (2A) to (2D):

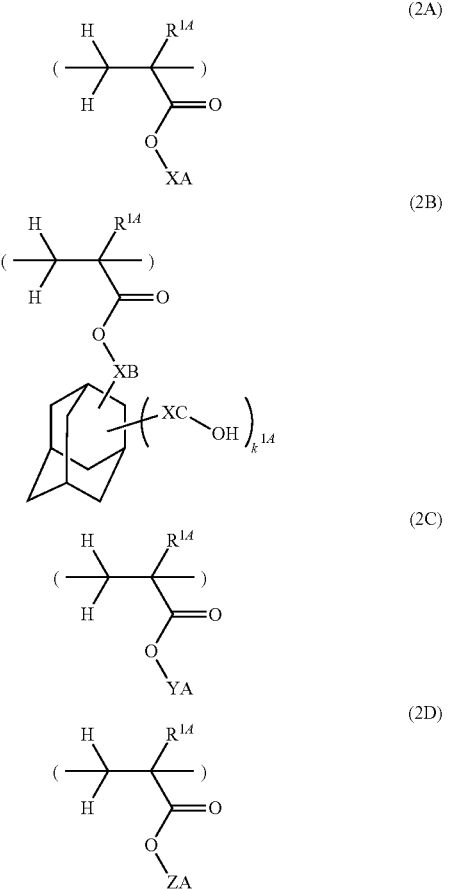

wherein $R^{14}$ is hydrogen, fluorine, methyl or trifluoromethyl, XA is an acid labile group, XB and XC are each independently a single bond or a straight or branched $C_1$-$C_4$ divalent hydrocarbon group, YA is a substituent group having a lactone structure, ZA is hydrogen, a $C_1$-$C_{15}$ fluoroalkyl group or $C_1$-$C_{15}$ fluoroalcohol-containing substituent group, and $k^{14}$ is an integer of 1 to 3.

5. The resist composition of claim 1 wherein the polymer (A) comprising recurring units of formula (1a) is added in an amount of 0.1 to 50 parts by weight per 100 parts by weight of the polymer (B).

6. The resist composition of claim 1, further comprising (E) a basic compound.

7. The resist composition of claim 1, further comprising (F) a dissolution regulator.

8. A pattern forming process comprising the steps of (1) applying the resist composition of claim 1 onto a substrate, (2) heat treating and exposing the resulting resist film to high-energy radiation through a photomask, and (3) developing with a developer.

9. A pattern forming process comprising the steps of (1) applying the resist composition of claim 1 onto a substrate, (2) heat treating and exposing the resulting resist film to high-energy radiation from a projection lens through a photomask while holding a liquid between the substrate and the projection lens, and (3) developing with a developer.

10. A pattern forming process comprising the steps of (1) applying the resist composition of claim 1 onto a substrate to form a resist film, (2) forming a protective coating onto the resist film, (3) heat treating and exposing the resist film to high-energy radiation from a projection lens through a photomask while holding a liquid between the substrate and the projection lens, and (4) developing with a developer.

11. The process of claim 9 wherein the liquid is water.

12. The process of claim 8 wherein the high-energy radiation has a wavelength in the range of 180 to 250 nm.

13. A pattern forming process comprising the steps of (1) applying the resist composition of claim 1 onto a mask blank, (2) heat treating and exposing the resulting resist film in vacuum to electron beam, and (3) developing with a developer.

14. A resist composition comprising (A) a polymer comprising recurring units of the general formula (1a) and recurring units of one or more type selected from the general formulae (2c), (2d), (2g), (2h), (2i) and (2j), (B) a polymer having a lactone ring-derived structure, hydroxyl-containing structure and/or maleic anhydride-derived structure and adapted to become soluble in an alkaline developer under the action of acid as a base resin, (C) a compound capable of generating an acid upon exposure to high-energy radiation, and (D) an organic solvent,

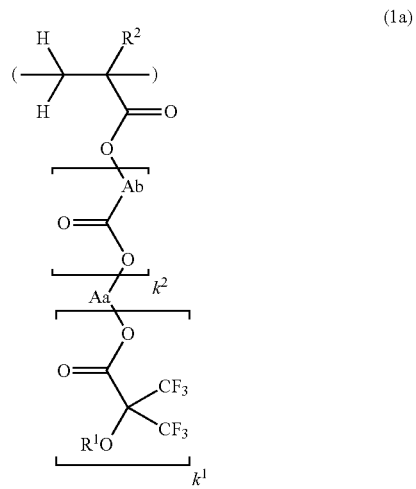

wherein $R^1$ is hydrogen, $R^2$ is hydrogen or methyl, Aa is a straight or branched $C_1$-$C_{20}$ hydrocarbon group having a valence of $k^1+1$, Ab is a straight, branched or cyclic $C_1$-$C_6$ divalent hydrocarbon group, $k^1$ is an integer of 1 to 3, and $k^2$ is 0 or 1,

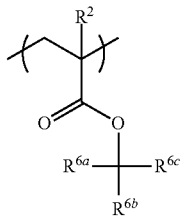
(2c)

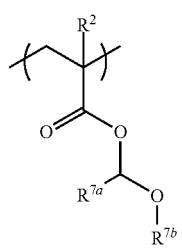
(2d)

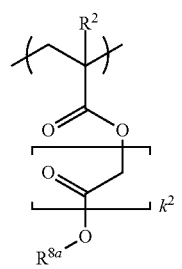
(2g)

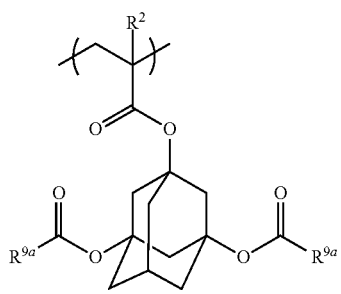
(2h)

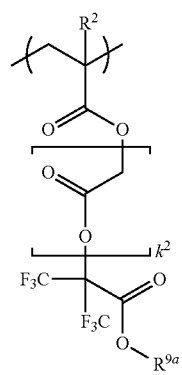
(2i)

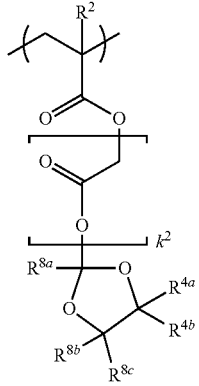
(2j)

wherein $R^2$ is as defined above, $R^{4a}$ and $R^{4b}$ are each independently hydrogen or a straight, branched or cyclic $C_1$-$C_{15}$ monovalent hydrocarbon group, or $R^{4a}$ and $R^{4b}$ may bond together to form a non-aromatic ring of 3 to 8 carbon atoms with the carbon atom to which they are attached, one of $R^{6a}$, $R^{6b}$ and $R^{6c}$ is hydrogen, or a straight, branched or cyclic $C_1$-$C_{15}$ monovalent hydrocarbon group, the remaining $R^{6a}$ and $R^{6b}$, $R^{6a}$ and $R^{6c}$, or $R^{6b}$ and $R^{6c}$ bond together to form a non-aromatic ring of 3 to 8 carbon atoms with the carbon atom to which they are attached, $R^{7a}$ is hydrogen, or a straight, branched or cyclic $C_1$-$C_{15}$ monovalent hydrocarbon group, $R^{7b}$ is a straight, branched or cyclic $C_1$-$C_{15}$ monovalent hydrocarbon group, $R^{8a}$, $R^{8b}$ and $R^{8c}$ are each independently a straight, branched or cyclic $C_1$-$C_{15}$ monovalent fluorinated hydrocarbon group, $R^{9a}$ is a straight, branched or cyclic $C_1$-$C_{15}$ monovalent hydrocarbon or fluorinated hydrocarbon group, and $k^2$ is 0 or 1.

15. The resist composition of claim 14 wherein the polymer (A) comprising the recurring units of formula (1) and the recurring units of one or more type selected from the general formulae (2g), (2h), (2i) and (2j):

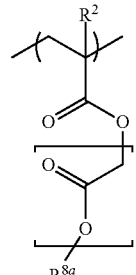
(2g)

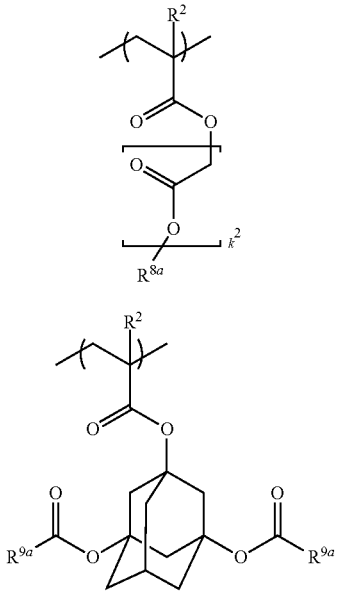
(2h)

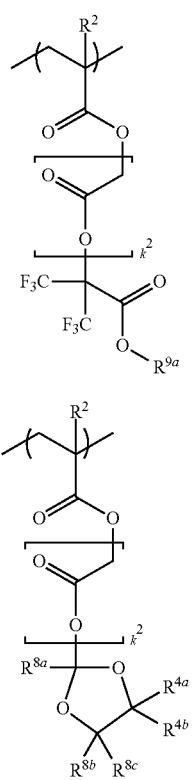
wherein $R^{4a}$, $R^{4b}$, $R^{8a}$, $R^{8b}$, $R^{8c}$, $R^{9a}$ and $k^2$ are as defined above.
16. The resist composition of claim 14 wherein Aa in formula (1a) is selected from the group consisting of the following groups:
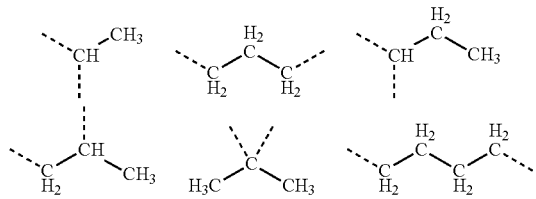
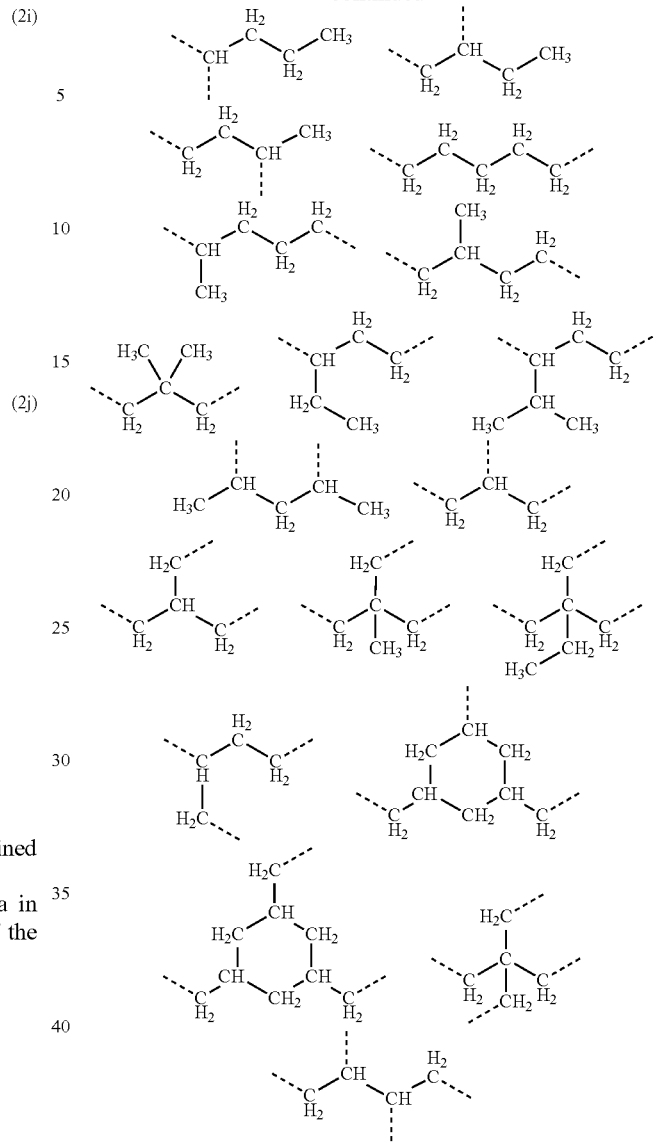
wherein the broken line designates a valence bond.
* * * * *